(12) United States Patent
Chen et al.

(10) Patent No.: US 7,416,905 B2
(45) Date of Patent: *Aug. 26, 2008

(54) METHOD OF FABRICATING A MAGNETIC SHIFT REGISTER

(75) Inventors: Tze-chiang Chen, Yorktown Heights, NY (US); Stuart S. P. Parkin, San Jose, CA (US)

(73) Assignee: International Busniess Machines Corporation, Armonk, NY (US)

( * ) Notice: Subject to any disclaimer, the term of this patent is extended or adjusted under 35 U.S.C. 154(b) by 282 days.

This patent is subject to a terminal disclaimer.

(21) Appl. No.: 11/252,384

(22) Filed: Oct. 17, 2005

(65) Prior Publication Data

US 2007/0087454 A1    Apr. 19, 2007

(51) Int. Cl.
*H01L 21/00* (2006.01)

(52) U.S. Cl. .............................. 438/3; 438/99

(58) Field of Classification Search .............. 438/3, 438/6, 99, 128, 130, 131, 467; 365/171, 365/173, 80, 240
See application file for complete search history.

(56) References Cited

U.S. PATENT DOCUMENTS

| | | | |
|---|---|---|---|
| 3,611,328 A | 10/1971 | Spain | 340/174 TF |
| 3,846,770 A | 11/1974 | Schwee et al. | 340/174 |
| 3,868,659 A | 2/1975 | Schwee | 340/174 |
| 3,997,885 A | 12/1976 | Battarel | 340/174 |
| 4,075,612 A | 2/1978 | Johnson et al. | 365/171 |
| 4,075,613 A | 2/1978 | Torok | 365/87 |
| 4,080,591 A | 3/1978 | Torok | 365/171 |
| 4,192,012 A | 3/1980 | Schwee et al. | 365/87 |
| 4,199,819 A | 4/1980 | Schwee et al. | 365/87 |
| 4,250,565 A | 2/1981 | Cosimini et al. | 365/87 |
| 4,253,160 A | 2/1981 | Paul et al. | 365/87 |
| 4,253,161 A | 2/1981 | Paul et al. | 365/87 |
| 4,410,963 A | 10/1983 | Lo et al. | 365/87 |
| 5,650,958 A | 7/1997 | Gallagher et al. | 365/173 |
| 5,729,410 A | 3/1998 | Fontana, Jr. et al. | 360/113 |
| 5,801,984 A | 9/1998 | Parkin | 365/158 |
| 6,518,071 B1 * | 2/2003 | Durlam et al. | 438/3 |
| 6,955,926 B2 * | 10/2005 | Chen et al. | 438/3 |
| 7,108,797 B2 * | 9/2006 | Chen et al. | 216/22 |

(Continued)

OTHER PUBLICATIONS

Y.Ooba et al., "A Thin Magnetic Film Shift Register," Paper 6.4, presented at the 1972 Intermag Conference, Kyoto, Japan, Apr. 10-13, 1972.

(Continued)

*Primary Examiner*—W. David Coleman
*Assistant Examiner*—Su C Kim
(74) *Attorney, Agent, or Firm*—Shimokaji & Assoc., P.C.

(57) ABSTRACT

A magnetic data track used in a magnetic shift register memory system may be fabricated by forming a multilayered stack of alternating dielectric and/or silicon layers. A trench is etched in the multi-layer stack structure. A selective etching process is used to corrugate the walls of trench. A seed layer is applied to the walls and bottom of the trench; the seed layer is covered with a magnetic layer. The trench is filled with an insulating material. A patterned layer is applied and portions of insulating material exposed by the pattern are removed, forming holes. Magnetic material and seed layer exposed in holes is selectively removed. The holes are filled with insulating material and connecting leads are attached to data tracks.

24 Claims, 57 Drawing Sheets

U.S. PATENT DOCUMENTS

| | | | |
|---|---|---|---|
| 2002/0101761 A1 | 8/2002 | Naji | 365/171 |
| 2003/0107833 A1 | 6/2003 | Rettner et al. | 360/48 |
| 2003/0128460 A1 | 7/2003 | Zolla | 360/97.01 |
| 2005/0002248 A1* | 1/2005 | Kajiyama | 365/202 |

OTHER PUBLICATIONS

Hermann Deichelmann, "Magnetic Domain Tip Memories—Construction and Applications," Journal of Magnetism and Magnetic Materials 4 (1977) 174-179.

D.H. Smith, "A Magnetic Shift Register Employing Controlled Domain Wall Motion," IEEE Transaction on Magnetics, vol. Mag-1, No. 4, Dec. 1965, pp. 281-284.

J. S. Sallo et al., "An "Orthocore" Magnetic Shift Register," IEEE Transactions on Magnetics, vol. MAG-2, No. 3, Sep. 1966, pp. 197-201.

L. Geppert, "The New Incredible Memories," IEEE Spectrum, Apr. 2003, pp. 49-54.

Richard Butner, "Computing Unplugged, Magnetic RAM cures your computer of shorter memory loss," available at: http://www.research.ibm.com/thinkresearch/pages/2001/20010202_mram.shtml, as of May 14, 2003.

* cited by examiner

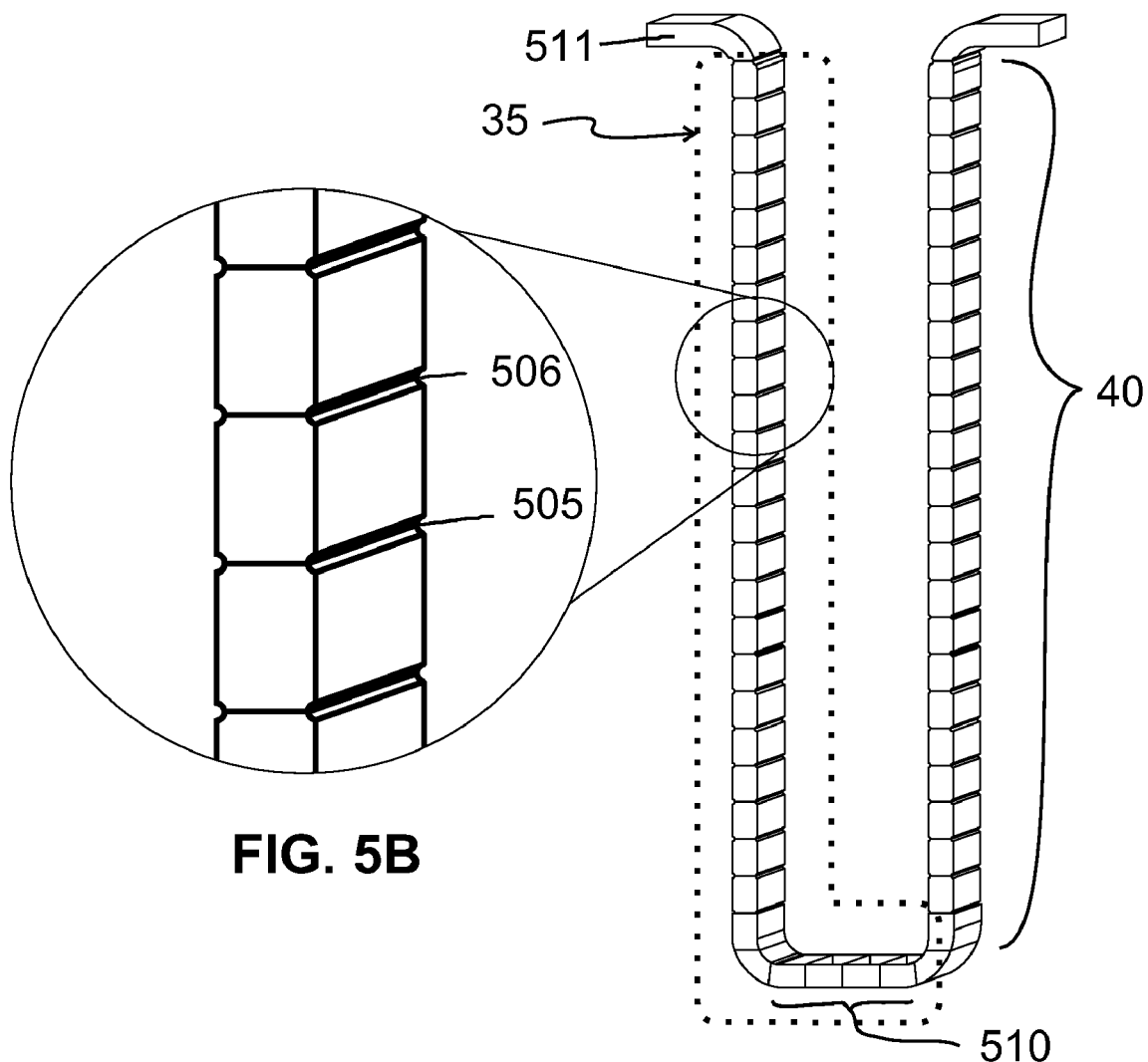

METHOD OF FABRICATING A MAGNETIC SHIFT REGISTER

CROSS-REFERENCE TO RELATED APPLICATION

The present application is related to U.S. patent application Ser. No. 10/787,738, titled "Method of Fabricating a Shiftable Magnetic Shift Register", which was filed on Feb. 25, 2004, which is assigned to the same assignee as the present invention, and which is incorporated herein by reference in its entirety.

FIELD OF THE INVENTION

The present invention generally relates to memory storage systems, and particularly to a memory storage system that uses the magnetic moment of magnetic domains to store data. Specifically, the present invention relates to a method for fabricating a magnetic data track for use in a multi-layered magnetic shift register memory device.

BACKGROUND OF THE INVENTION

The two most common conventional non-volatile data storage devices are disk drives and solid-state random access memories (RAM). Disk drives are capable of inexpensively storing large amounts of data, i.e., greater than 100 GB. However, disk drives are inherently unreliable. A hard drive comprises a fixed read/write head and a moving medium upon which data is written. Devices with moving parts tend to wear out and fail. Solid-state random access memories currently store data on the order of 1 GB (gigabyte) per device, and are relatively expensive, per storage unit, compared to a disk drive.

The most common type of solid-state RAM is flash memory. Flash memory relies on a thin layer of polysilicon that is disposed in oxide below a transistor's on-off control gate. This layer of polysilicon is a floating gate, isolated by the silicon from the control gate and the transistor channel. Flash memory is relatively slow, with reading and writing times on the order of a microsecond. In addition, flash memory cells can begin to lose data after less than a million write cycles. While this may be adequate for some applications, flash memory cells may begin to fail rapidly if used constantly to write new data, such as in a computer's main memory. Further, the access time for flash memory is much too long for computer applications.

Another form of RAM is the ferroelectric RAM, or FRAM. FRAM stores data based on the direction that ferroelectric domains point. FRAM has access times much faster than Flash memory and consumes less energy than standard dynamic random access memory (DRAM). However, commercially available memory capacities are currently low, on the order of 0.25 MB (megabyte). In addition, memory storage in a FRAM relies on physically moving atoms, leading to eventual degradation of the medium and failure of the memory.

Yet another form of RAM is the Ovonic Unified Memory (OUM) that utilizes a material that alternates between crystalline and amorphous phases to store data. The material used in this application is a chalcogenide alloy. After the chalcogenide alloy experiences a heating and cooling cycle, it can be programmed to accept one of two stable phases: polycrystalline or amorphous. The differences in the respective resistances of the two phases allow the chalcogenide alloy to be used as memory storage. Data access time is on the order of 50 ns. However, the size of these memories is still small, on the order of 4 MB currently. In addition, OUM relies on physically changing a material from crystalline to amorphous, likely causing the material to eventually degrade and fail.

Semiconductor magnetoresistive RAM (MRAM) encodes data bits in a ferromagnetic material by utilizing the direction of the material's magnetic moment. Atoms in ferromagnetic materials respond to external magnetic fields, aligning their magnetic moments to the direction of the applied magnetic field. When the field is removed, the atoms' magnetic moments still remain aligned in the induced direction. A field applied in the opposite direction causes the atoms to realign themselves with the new direction. Typically, the magnetic moments of the atoms within a volume of the ferromagnetic material are aligned parallel to one another by a magnetic exchange interaction. These atoms then respond together, largely as one macro-magnetic moment, or magnetic domain, to the external magnetic field.

One approach to MRAM uses a magnetic tunneling junction as the memory cell. The magnetic tunneling junction comprises two layers of ferromagnetic material separated by a thin insulating material. The direction of the magnetic domains is fixed in one layer. In the second layer, the domain direction is allowed to move in response to an applied field. Consequently, the direction of the domains in the second layer can either be parallel or opposite to the first layer, allowing the storage of data in the form of ones and zeros. However, currently available MRAM can only store up to 1 Mb (megabit), much less than needed for most memory applications. Larger memories are currently in development. In addition, each MRAM memory cell stores only one bit of data, thereby limiting the maximum possible memory capacity of such devices.

A multi-layered magnetic shift register replaces many conventional memory devices including but not limited to magnetic recording hard disk drives, and many solid-state memories such as DRAM, SRAM, FeRAM, and MRAM. The multi-layered magnetic shift register provides capacious amounts of storage comparable to those provided in conventional memory devices but without any moving parts and at a cost comparable to hard disk drives.

Briefly, the multi-layered magnetic shift register memory device uses the inherent, natural properties of the domain walls in ferromagnetic materials to store data. The multi-layered magnetic shift register memory device utilizes one read/write device to access numerous bits, on the order of ten to 100 bits of data or more. Consequently, a small number of logic elements can access tens to hundreds of bits of data.

The multi-layered magnetic shift register memory device uses spin-based electronics to write and read data in ferromagnetic material so that the physical nature of the material in the multi-layered magnetic shift register is unchanged. A multi-layered shiftable multi-layered magnetic shift register comprises a data track formed of a fine wire or strip of material made of ferromagnetic material. The wire can be comprised of a physically uniform, magnetically homogeneous ferromagnetic material or layers of different ferromagnetic materials. Information is stored as direction of magnetic moment within the domains in the track. The wire can be magnetized in small sections in one direction or another.

An electric current is applied to the track to move the magnetic domains along the track in the direction of the electric current, past reading or writing elements or devices. In a magnetic material with domain walls, current passed across the domain wall moves the domain wall in the direction of the current flow. As the current passes through a domain, it becomes "spin polarized". When this spin-polarized current passes into the next domain across a domain wall, it develops a spin torque. This spin torque moves the domain wall. Domain wall velocities can be very high, on the order of one to several hundred m/sec. The actual direction in which the domain walls move will depend on the composition of the magnetic material of the track. The domain walls can move either in the same direction as that of the direction in which the electrons flow or in the opposite direction to the flow of the electrons. For a particular material, changing the direction of the current will also change the direction in which the domains and the domain walls move, allowing the domains and the domain walls to be moved in either direction along the track.

In summary, current passed through the track (having a series of magnetic domains with alternating directions) can move these domains past the reading and writing elements. The reading device can then read the direction of the magnetic moments. The writing device can change the direction of the magnetic moments, thus writing information to the track.

What is needed is an improved method for fabricating the magnetic data tracks needed to build a multi-layered magnetic shift register memory device.

SUMMARY OF THE INVENTION

The present invention satisfies this need, and presents methods for fabricating the magnetic data tracks needed to build a multi-layered magnetic shift register memory device.

The multi-layered magnetic shift register memory device comprises the storage of information in magnetic wires that are largely perpendicular to a plane that comprises reading and writing elements. These reading and writing elements are constructed using conventional CMOS technology. The multi-layered magnetic shift register memory promises a 100-fold increase in density compared to conventional CMOS memories. The magnetic wires can be formed as tall (approximately 10 microns) and narrow (approximately 0.1 micron) pillars, with connections between two of these pillars on one end of the pillars.

The magnetic data track is fabricated by forming a multi-layered stack of alternating layers of different materials formed from silicon or dielectrics. Vias having a height of approximately 1 to 10 microns and a cross-section on the order of 100 nm×100 nm are etched in this multi-layered stack structure. The vias can have a cross-section that is elliptical, rectangular, square, or any other desirable or suitable shape. Fabricating techniques for creating vias of these dimensions are based on techniques used to manufacture trench capacitors used by DRAMs. Conventional techniques for fabricating these trench capacitors have achieved dimensions of approximately 9 to 10 microns deep and approximately 0.1 microns in cross-section. Reference is made to U.S. Pat. Nos. 6,544,838 and 6,284,666, which are incorporated herein by reference.

In one embodiment, the vias are etched by a non-selective etch to form vias with smooth walls. The vias are filled by electroplating layers of alternating types of ferromagnetic or ferrimagnetic metals. The thickness of each layer can be, for example, between approximately 50 nm to 500 nm. The alternating ferromagnetic or ferrimagnetic layers are comprised of magnetic materials with different magnetization or magnetic exchange or magnetic anisotropies. These different magnetic characteristics allow the pinning of magnetic domain walls at the boundaries between these layers or within one of these layers.

In another embodiment, a selective etch is performed after the vias have been non-selectively etched. This selective etch removes layers of material in the multi-layer stack structure at a higher rate than layers of the other material, forming notches or protuberances in the walls of the vias.

The vias are filled with a homogeneous ferromagnetic material by, for example, electroplating or chemical vapor deposition (CVD). Magnetic domain walls are formed nearby the discontinuities in the ferromagnetic or ferromagnetic material that occurs at the notches or at the protuberances along the via walls.

Means of connecting current leads to either end of each data track are provided for the purposes of injecting current to move the domain walls along the data track.

To form the data tracks, a substrate is formed and a multi-layer stack structure is added to the substrate by applying alternating layers of different dielectric materials. Lithography is used to etch a trench in the multi-layer stack structure. A selective etching process is used to corrugate the walls of trench, forming notches and protuberances. A seed layer is applied to the walls and bottom of the trench. The seed layer is covered with a magnetic layer. The trench is filled with an insulating material. A layer is applied in a pattern to the top of the dielectric material and the multi-layer stack structure. Portions of insulating material exposed by the pattern are removed, forming holes. Magnetic material and seed layer exposed in holes is selectively removed. The holes are filled with insulating material. Connecting leads are attached to data tracks. Electrical connectors are optionally attached to connecting leads.

BRIEF DESCRIPTION OF THE DRAWINGS

The various features of the present invention and the manner of attaining them will be described in greater detail with reference to the following description, claims, and drawings, wherein reference numerals are reused, where appropriate, to indicate a correspondence between the referenced items, and wherein:

FIG. 4 is comprised of FIGS. 4A, 4B, and 4C, wherein FIGS. 4A and 4B represent a schematic diagram illustrating an embodiment of the multi-layered magnetic shift register of FIG. 1 constructed of multiple types of alternating ferromagnetic materials, and wherein

FIG. 5 is comprised of FIGS. 5A and 5B, and represents a schematic diagram illustrating an embodiment of the multi-layered magnetic shift register of FIG. 1 constructed with indentations in a homogeneous ferromagnetic material;

DETAILED DESCRIPTION OF PREFERRED EMBODIMENTS

The following definitions and explanations provide background information pertaining to the technical field of the present invention, and are intended to facilitate the understanding of the present invention without limiting its scope:

Homogeneous magnetic material means a contiguous volume of magnetic material, which may have a complex shape, which nominally has the same magnetic properties, such as magnetization, magnetic anisotropy, magnetic exchange and magnetic damping, independent of the position within the volume.

Inhomogeneous magnetic material means a contiguous volume of magnetic material, which may have a complex shape, whose magnetic properties, such as magnetization, magnetic anisotropy, magnetic exchange and magnetic damping, may vary with position within the volume due, for example, to a change in material composition and/or due to some physical process during the deposition of this material or acting on the material after the material has been deposited.

Figure 1:
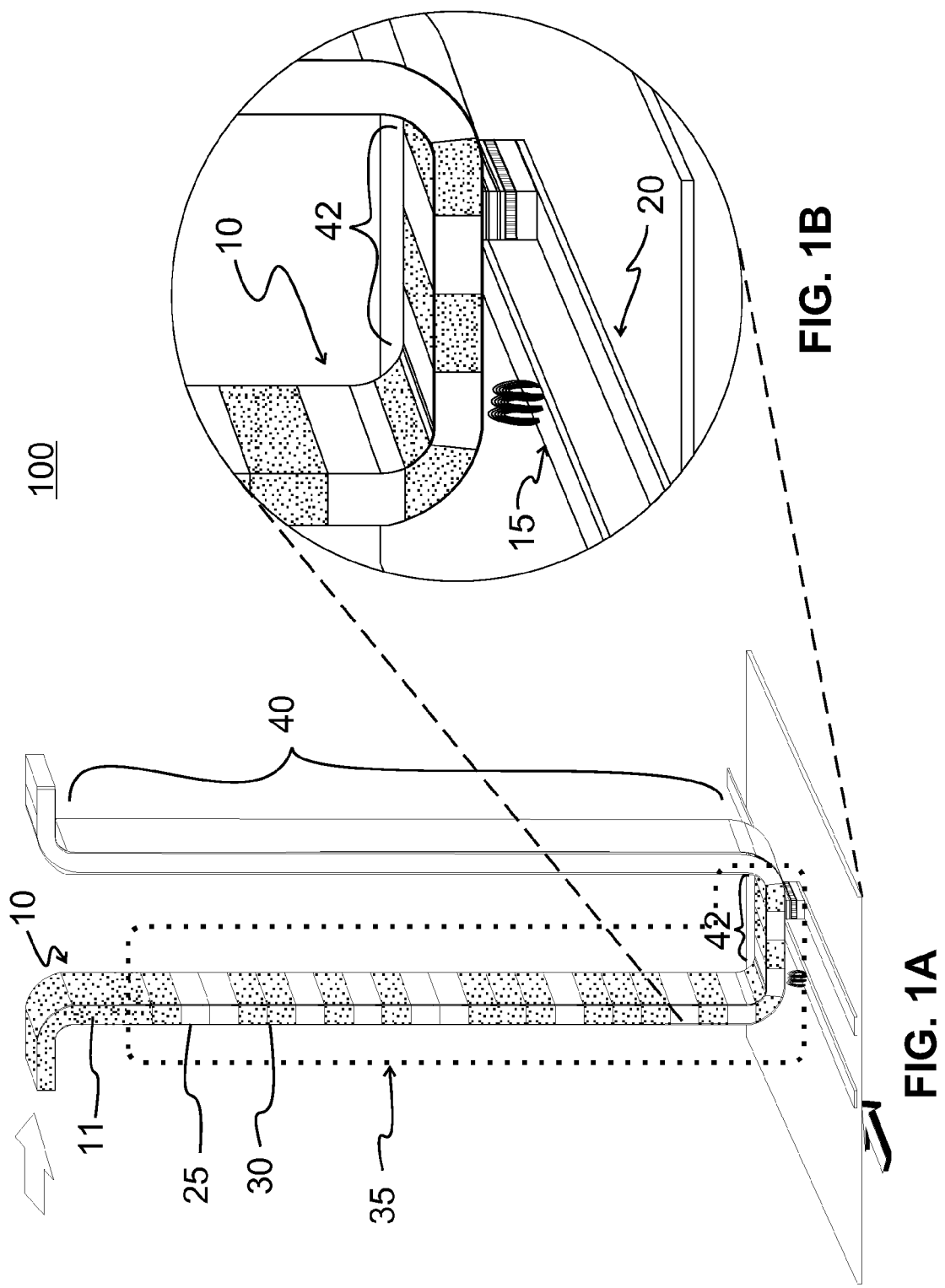
FIG. 1 is comprised of FIGS. 1A and 1B, and represents an exemplary operating embodiment in which a writing element is used to write data to a multi-layered magnetic shift register according to the present invention.

FIG. 1 (FIGS. 1A and 1B) illustrates an exemplary high-level architecture of a magnetic memory system 100 comprising a multi-layered magnetic shift register 10 that utilizes a writing device (also referred to herein as writing element) 15 and a reading device (also referred to herein as reading element) 20. Both the reading device 20 and the writing device 15 form a read/write element of system 100.

The multi-layered magnetic shift register 10 comprises a fine data track 11 preferably made of ferromagnetic or ferromagnetic material. The data track 11 can be magnetized in small sections, or domains, in one direction or another. Information is stored in regions such as domains 25, 30 in the data track 11. The order parameter of the magnetic material from which the track is fabricated, that is the magnetization direction or the direction of the magnetic moment, changes from one direction to another. This variation in the direction of the magnetic moment forms the basis for storing information in the data track 11.

In one embodiment, the multi-layered magnetic shift register 10 comprises a data region 35 and a reservoir 40, connected by a central region 42. The data region 35 comprises a contiguous set of domains such as domains 25, 30 that store data. Additional length is provided to the multi-layered magnetic shift register 10 in the form of a reservoir 40.

The reservoir 40 is made sufficiently long so that it accommodates all the domains in the data region 35 when these domains are moved completely from data region 35 through central region 42 across the writing element 15 and reading element 20 for the purposes of writing and reading domains in the central region 42. At any given time, the domains are thus stored partially in data region 35 and partially in reservoir 40, so it is the combination of data region 35, reservoir 40, and central region 42 that forms the storage element. In one embodiment, the reservoir 40 is devoid of magnetic domains in a quiescent state.

Thus, the data region 35 at any given time can be located within a different portion of the multi-layered magnetic shift register 10, and the reservoir 40 can be divided into two regions on either side of the data region 35. Although the data region 35 can be one contiguous region, the spatial distribution and extent of the domains within the data region 35 can be approximately the same no matter where the data region 35 resides within the shift register 10. In another embodiment, portions of the storage region can be expanded during the motion of this region particularly across the reading element 20 and writing element 15. A portion or the entire data region 35 is moved into the reservoir 40 to access data in specific domains.

The reservoir 40 shown in FIG. 1 has approximately the same size as the data region 35. However, other alternative embodiments can allow the reservoir 40 to have a different size than the data region 35. As an example, the reservoir 40 can be much smaller than the data region 35 if more than one reading element 20 and writing element 15 are used for each multi-layered magnetic shift register 10. For example, if two reading elements 20 and writing elements 15 are used for one multi-layered magnetic shift register 10 and are disposed equally along the length of the data region 35, then the reservoir 40 only needs to be approximately half as long as the data region 35.

An electric current 45 is applied to the data track 11 to move the magnetic moments within domains 25, 30, along the data track 11, and past the reading device 20 or the writing device 15. In a magnetic material with domain walls, a current passed across the domain walls moves the domain walls in the direction of the current flow. As the current passes through a domain, it becomes "spin polarized". When this spin-polarized current passes through into the next domain across the intervening domain wall, it develops a spin torque. This spin torque moves the domain wall. Domain wall velocities can be very high, i.e., on the order of 100 to several hundred m/sec, so that the process of moving a particular domain to the required position for the purposes of reading this domain or for changing its magnetic state by means of the writing element can be very short.

Figure 2:
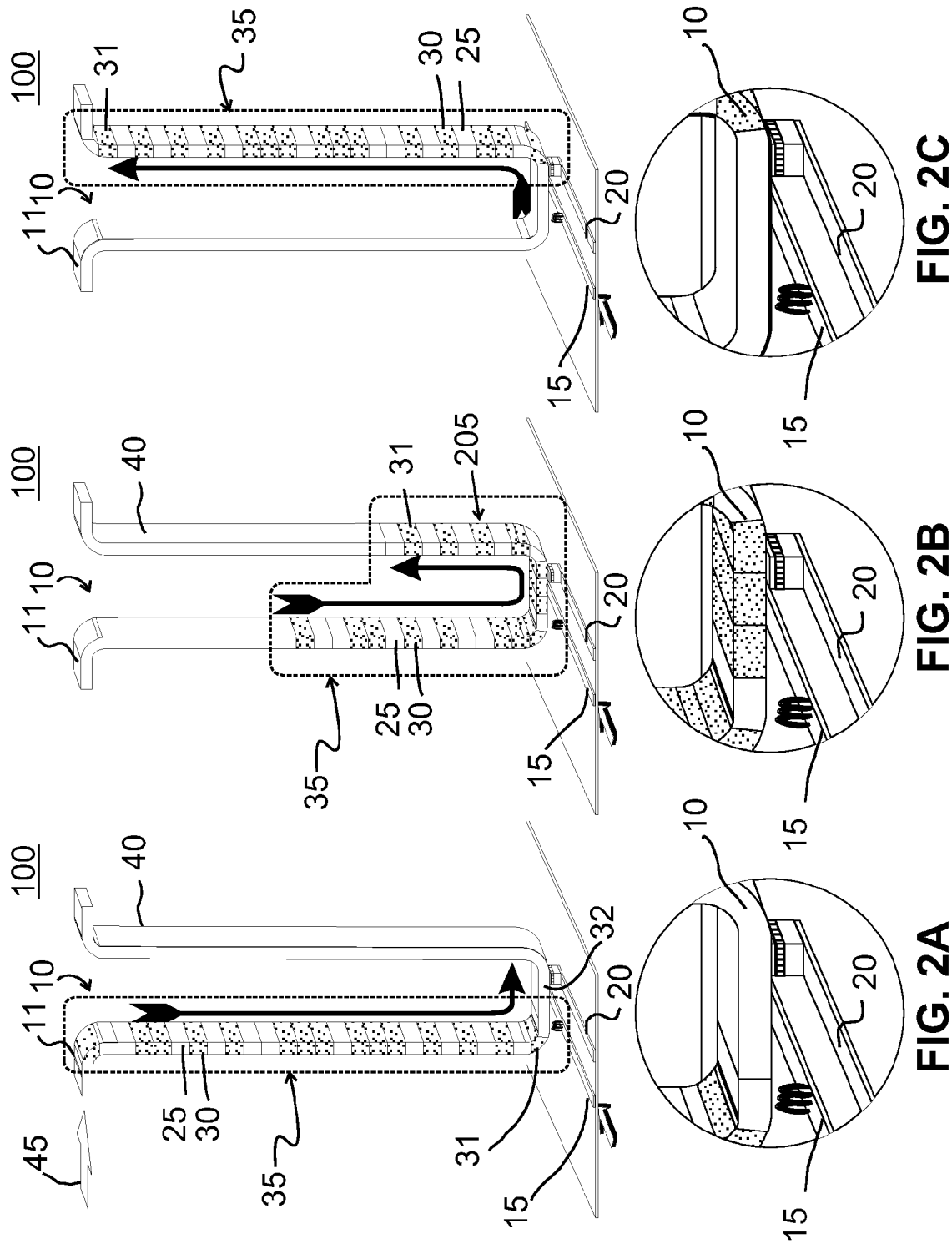
FIG. 2 is comprised of FIGS. 2A, 2B, and 2C and represents a schematic diagram illustrating a method of operation of the multi-layered magnetic shift register of FIG. 1.

The domains, such as domains 25, 30, 31, are moved (or shifted) back and forth over the writing device 15 and the reading device 20 to move the data region 35 in and out of the reservoir 40, as shown in FIG. 2 (FIGS. 2A, 2B, 2C). In the example of FIG. 2A, the data region 35 initially resides on the left side of the well, i.e., central region 42, of the multi-layered magnetic shift register 10, with no domains in the reservoir 40. FIG. 2C shows the case where the data region 35 resides entirely on the right side of the multi-layered magnetic shift register 10.

To write data in a specific domain, such as domain 31, a current 45 is applied to the multi-layered magnetic shift register 10 to move domain 31 over, and in alignment with the writing device 15. All the domains in the data region 35 move when the current is applied to the multi-layered magnetic shift register 10.

The movement of the domains is controlled by both the magnitude and direction of the current, and the time over which the current is applied. In one embodiment, one current pulse of a specified shape (magnitude versus time) and duration is applied to move the domains in the storage region in one increment or step. A series of current pulses are applied to move the domains the required number of increments or steps. Thus, a shifted portion 205 (FIG. 2B) of the data region 35 is pushed (shifted or moved) into the reservoir region 40.

The direction of motion of the domains within the data track 11 depends on the direction of the applied current. The length of the current pulse can be in the range of a few hundred picoseconds to tens of nanoseconds and will depend on the magnitude of the current. The larger the magnitude of the current the shorter the length of the current pulse needed.

The shape of the current pulse (i.e. the detailed dependence of current versus time in the pulse) may also be adjusted for the optimal motion of the domain walls. The current pulse shape must be designed properly, in conjunction with the detailed specifics of the ferromagnetic material in the track, such that the domain walls are moved from one position to the next position without having so much energy or momentum that they move beyond the next most position.

To read data in a specific domain, such as domain 25, additional current is applied to the multi-layered magnetic shift register 10 to move domain 25 over, and in alignment with, the reading device 20. A larger shifted portion of the data region 35 is pushed (shifted or moved) into the reservoir 40.

The reading device 20 and writing device 15 shown in FIGS. 1 and 2 form part of a control circuit that defines a reference plane in which the reading device 20 and writing device 15 are arrayed. In one embodiment, the multi-layered magnetic shift register 10 stands vertically out of this reference plane, largely orthogonal to this plane.

To operate the multi-layered magnetic shift register 10, the control circuit comprises, in addition to the reading element 20 and writing element 15, logic and other circuitry for a variety of purposes, including the operation of the reading element 20 and writing element 15, the provision of current pulses to move the domains within the multi-layered magnetic shift register 10, and the means of coding and decoding data in the multi-layered magnetic shift register 10. In one embodiment the control circuit is fabricated using CMOS processes on a silicon wafer. The multi-layered magnetic shift registers 10 are preferably designed to have a small footprint on the silicon wafer so as to maximize the storage capacity of the memory device while utilizing the smallest area of silicon to keep the lowest possible cost.

In the embodiment shown in FIG. 1 the footprint of the multi-layered magnetic shift register 10 is determined largely by the area of the wafer occupied by the reading elements 20 and writing elements 15. Thus, the multi-layered magnetic shift register 10 is comprised of data tracks 11 extending largely in the direction out of the plane of the wafer. The length of the data tracks 11 in the vertical direction determines the storage capacity of the multi-layered magnetic shift register 10. Since the vertical extent can be much greater than the extent of the data track 11 in the horizontal direction, hundreds of magnetic bits can be stored in the multi-layered magnetic shift register 10 while the area occupied by the multi-layered magnetic shift register 10 in the horizontal plane is very small. Thus, the multi-layered magnetic shift register 10 can store many more bits for the same area of silicon wafer as compared to conventional solid-state memories.

Although the data tracks 11 of the multi-layered magnetic shift register 10 are shown as being largely orthogonal to the plane of the reading element 20 and writing element 15 (the circuitry plane), these data tracks 11 can also be inclined, at an angle, to this reference plane, as an example, for the purpose of greater density or for ease of fabrication of these devices.

Figure 3:
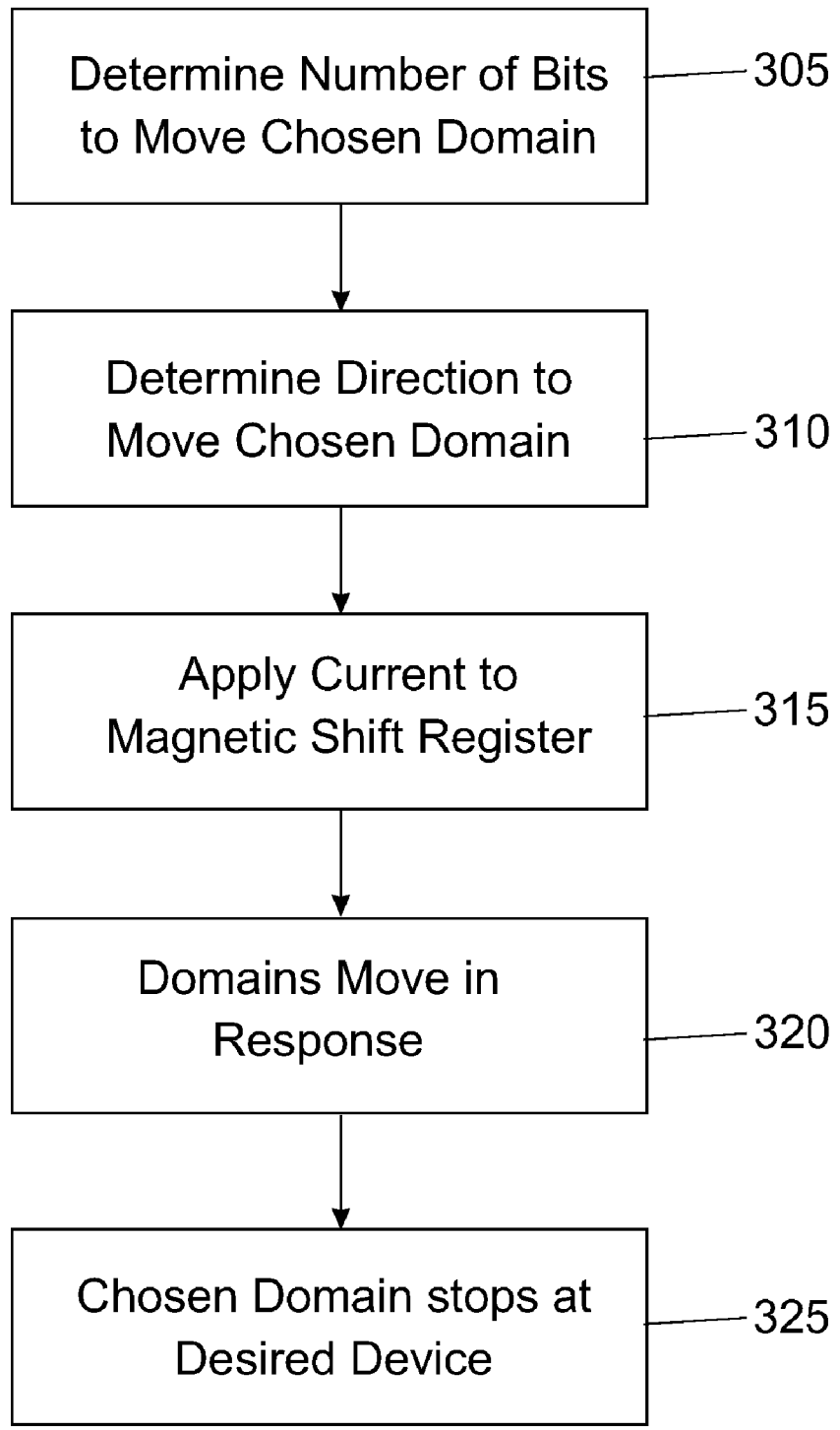
FIG. 3 is a process flow chart illustrating a method of operation of the multi-layered magnetic shift register of FIG. 1.

A method 300 of operating the multi-layered magnetic shift register 10 is illustrated in FIG. 3, with further reference to FIG. 2 (FIGS. 2A, 2B, and 2C). With reference to FIG. 2A, the memory system 100 determines, at block 305, the number of bits required to move domain 25 to either the writing device 15 or reading device 20. The memory system 100 also determines the direction required to move domain 25 in block 310. In FIG. 2A, domain 25 is on the left of the writing device 15 and the reading device 20. A positive current 45 can be required to move domain 25 to the right, for example, while a negative current 45 can be required to move domain 25 to the left.

The memory system 100 then applies the desired current 45 to the multi-layered magnetic shift register 10 at block 315. Current 45 can be one pulse or a series of pulses, moving the domain 25 one bit at a time. It is also possible to vary the length of duration or the magnitude of the current within the pulse or the pulse shape (current versus time within the pulse) to cause the domain 25 within the data region 35 to move by several increments during the application of one pulse. The domains in the data region 35 move in response to the current 45 in block 320. Domain 25 stops at the desired device, i.e., the writing device 15 or the reading device 20 (block 325).

Figure 4B:
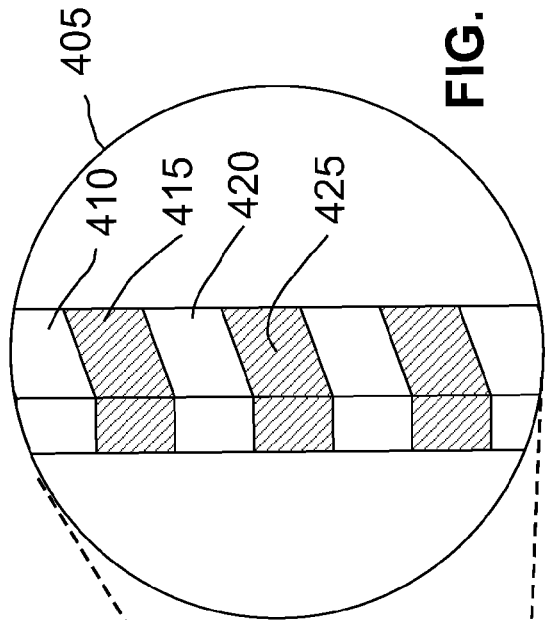
Figure 4C:
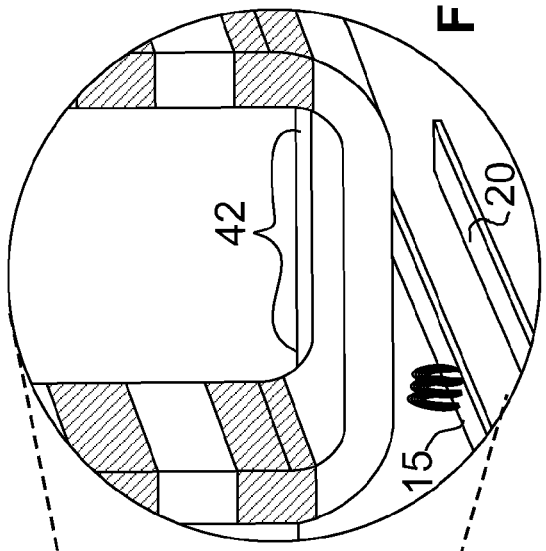
FIG. 4C is a schematic diagram of another embodiment of the shift register of FIG. 1, illustrating a well or bottom section of the shift register as being composed of a single ferromagnetic material.
Figure 4A:
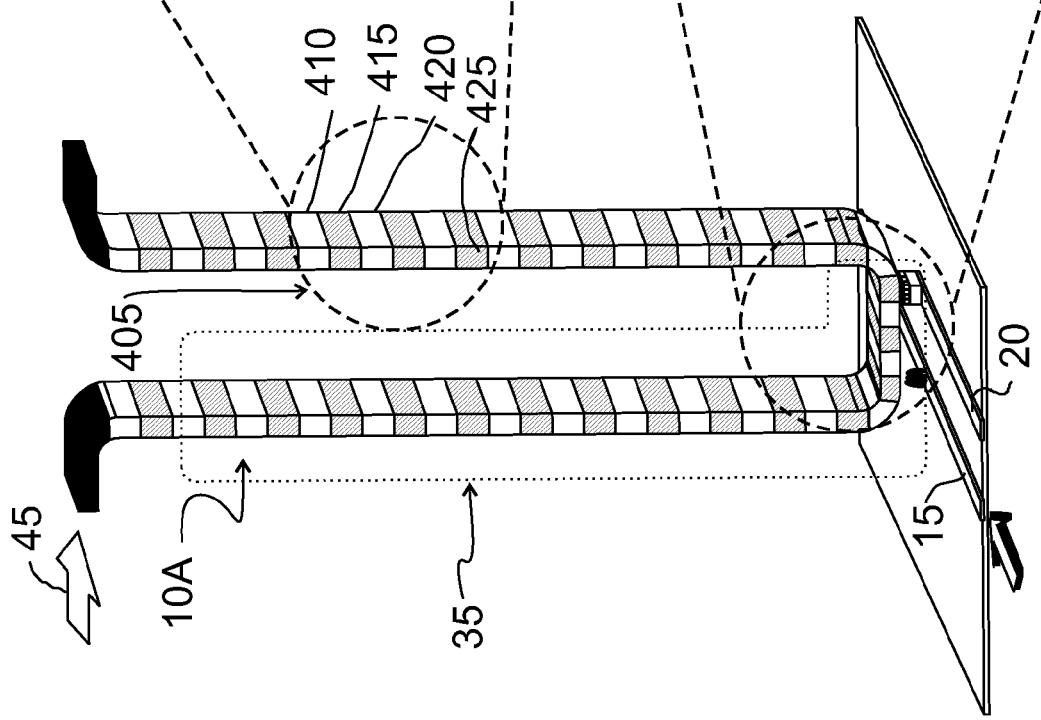

With reference to FIG. 4 (FIGS. 4A, 4B), an alternative multi-layered magnetic shift register 10A can be similar to the multi-layered magnetic shift register 10 of FIGS. 1 and 2, but comprising alternating magnetic layers, to pin the possible locations of the domains within the multi-layered magnetic shift register 10A. Pinning the possible locations of the domains prevents the designated domains from drifting.

The magnetic layers can be comprised of various ferromagnetic or ferrimagnetic materials where these magnetic materials are chosen appropriately based primarily on the magnitude of their magnetization (magnetic moment per unit volume), exchange parameter, magnetic anisotropy, and damping coefficient. The choice of these materials is also influenced by their manufacturability and compatibility with the process used to fabricate the multi-layered magnetic shift register.

As shown in region 405 of the multi-layered magnetic shift register 10A, one type of magnetic material can be used for domains 410, 420, while a different type of magnetic material can be used for alternating domains 415, 425. In another embodiment, multiple types of magnetic materials can be used, in varying order of materials.

The introduction of different ferromagnetic layers in the multi-layered magnetic shift register 10A creates local energy minima, similar to "potential wells", so that the domain walls between domains of opposite polarity will align themselves with the boundaries between the alternating ferromagnetic layers 410, 415, etc. Thus, the extent and size of the domains are determined by the thicknesses of the magnetic layers.

A current pulse 45 applied to the multi-layered magnetic shift register 10A causes the domains 410, 415, 420, 425 within the region 405 to move in the direction of the current 45. However, unless the current pulse 45 is of sufficient amplitude and duration, the domains 410, 415, 420, 425 may not move past the boundaries between the two different types of magnetic material. Consequently, the data region 35 can be moved one bit at a time, and the domains are not allowed to drift past their desired positions.

In addition to pinning the possible locations of the domains, using different layers of magnetic material also allows higher tolerances for current amplitude and pulse duration. In this embodiment, the portion of the multi-layered magnetic shift register 10A that passes over the writing device 15 and the reading device 20 can be a homogeneous magnetic material as illustrated in FIG. 4C or layers of different magnetic materials as illustrated in FIG. 4A.

The length of the alternating magnetic regions 410, 420, etc. and 415, 425 etc. can be different. Moreover, although it is preferred that the length of each type of magnetic region 410, 420, etc., and 415, 425, etc. be the same throughout the multi-layered magnetic shift register 10A, this is not essential, and these lengths can vary somewhat throughout the multi-layered magnetic shift register 10A. What is important is that the potential pins the domains in their defined positions against current induced motion induced by the current pulses.

With reference to FIG. 5 (FIGS. 5A, 5B), another multi-layered magnetic shift register 10B that is made of homogeneous magnetic material can be made inhomogeneous by physically varying the width or the area of the data track 11. Local energy minima can be created within the multi-layered magnetic shift register 10B by physically shaping the multi-layered magnetic shift register 10B.

In the shaping approach of FIG. 5, indentations, such as indentations 505, 506, are introduced in the ferromagnetic material of the multi-layered magnetic shift register 10B. The indentations 505, 506 can either be open or filled with a material that can be metallic or insulating.

In one embodiment, these indentations 505, 506 can be placed at a uniform spacing. In another embodiment, the spacing between these indentations 505, 506 can be non-uniform along the length of the multi-layered magnetic shift register 10B. The indentations 505, 506 are aligned with each other on either side of the data track 511.

It may be convenient to fabricate a multi-layered magnetic shift register with indentations on only one side of the data track 511. Since these indentations 505, 506 are used to pin the domain walls, only one indentation on one side of the data track 511 can provide a sufficient pinning potential. Indentations can be situated on one or two or more of any of the four sides of the data track 511 shown in FIG. 5. The indentations can also be alternated from one side to another side for successive pinning sites along the track for ease of fabrication (e.g. to make a denser set of pinning sites along the track than is possible by having all the indentations arranged on a single side of the track).

In another embodiment, the indentations 505, 506 are replaced with extrusions where the width of the data track 511 is locally increased and not decreased. What is required is a means of pinning the domains by changing the local potential for the domain walls.

In yet another embodiment, the width or area of the data track 511 is alternated in successive regions so that the data track 511 is comprised of regions of alternating widths or areas.

The multi-layered magnetic shift register 10B does not need to be uniformly filled with indentations or extrusions or alternating magnetic regions along its length. The multi-layered magnetic shift register 10B need only be filled with a sufficient number of such pinning sites such that the data region 35 moves by only one, or a specified number of increments per current pulse. For example, only one pinning site per N domains can be sufficient where N can be more than one.

The reservoir 40 may or may not include these indentations. A bottom section 510 of the multi-layered magnetic shift register 10B that crosses the writing device 15 and the reading device 20 may or may not include these indentations 505, 506.

In a further embodiment, the multi-layered magnetic shift register 10B is made of a combination of different ferromagnetic materials with indentations 505, 506, combining the features of multi-layered magnetic shift register 10A and 10B.

In general, the data track 11 of the multi-layered magnetic shift register 10 is fabricated by forming a multilayered stack comprising layers of alternating silicon and/or dielectric materials. Vias having a height of approximately 0.5 to 10 microns with a cross-section on the order of 100 nm by 100 nm are etched in this multi-layered stack of alternating silicon or dielectric layers. Although dimensions are provide throughout, it should be understood that these dimensions are given for exemplary purposes only and the present invention is not limited to the values or dimensions. For example, the height of the vias can range between approximately 0.5 microns and approximately 10 microns. The cross-section of the vias can range between approximately 10 nm by 10 nm and approximately 1 micron by 1 micron. These vias are then filled with ferromagnetic or ferrimagnetic material to form data region 35 and reservoir 40 of the data track 11 of the multi-layered magnetic shift register 10 of FIG. 1.

The vias can have a cross-section that is elliptical, rectangular, or square. In the case of a single layer of silicon fabricating techniques exist for creating vias of these dimensions based on trench capacitors used by DRAMs. Conventional techniques for fabricating these trench capacitors have achieved dimensions of approximately 1 to 10 microns deep and approximately 0.1 microns in cross-section. Reference is made to U.S. Pat. Nos. 6,544,838; 6,284,666; 5,811,357; and 6,345,399, which are incorporated herein by reference. These fabrication techniques are used to fabricate data track 11 of the multi-layered magnetic shift register 10, illustrated in FIGS. 6, 7, 8, 9, 10, 11, 12, and 13.

FIG. 6 (FIGS. 6A, 6B, 6C, 6D) illustrates an embodiment of the formation of the bottom of data track 11, central region 42. An insulator 605 such as, for example, silicon dioxide or silicon nitride is formed with a thickness of approximately 300 nm. Photoresist is applied to insulator 605 and patterned in the form of a rectangle 610. Using standard etching techniques, rectangle 610 is etched to a depth of approximately 200 nm to form trench 615. Reference is made to U.S. Pat. No. 6,051,504 for additional details on the process of silicon nitride etching, and U.S. Pat. No. 5,811,357 for additional details on the process of silicon dioxide etching, which are incorporated herein by reference.

Figure 6A:
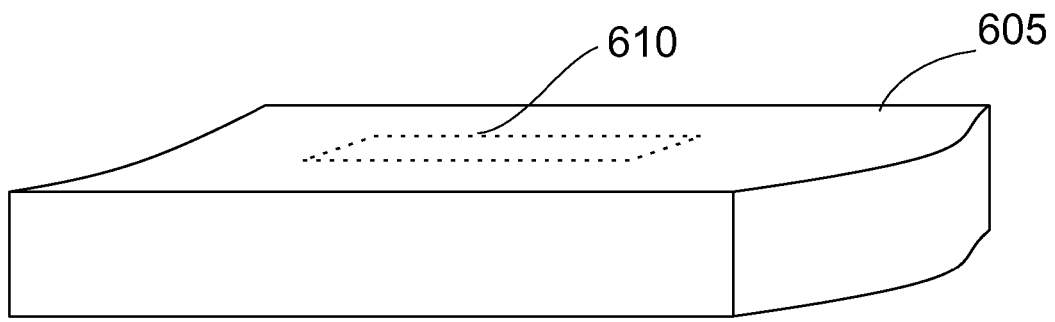
FIG. 6 is comprised of FIGS. 6A, 6B, 6C and 6D and represents a diagram illustrating the formation of the bottom region of a data track of the multi-layered magnetic shift register of FIG. 1.
Figure 6B:
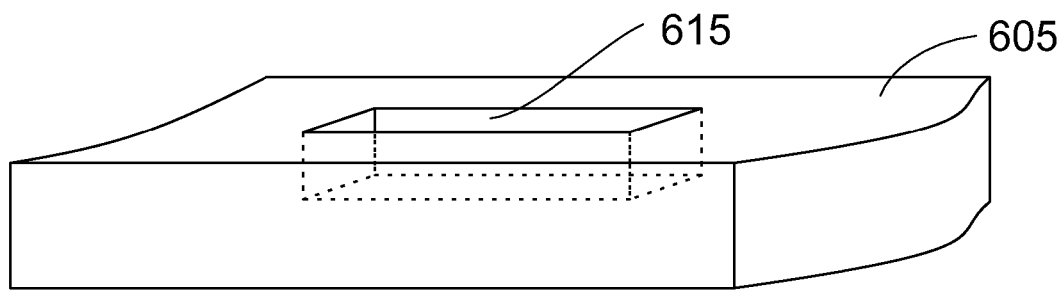
Figure 6C:
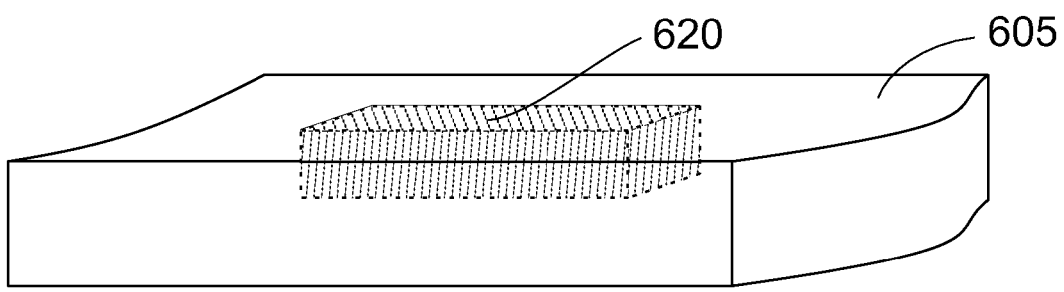
Figure 6D:
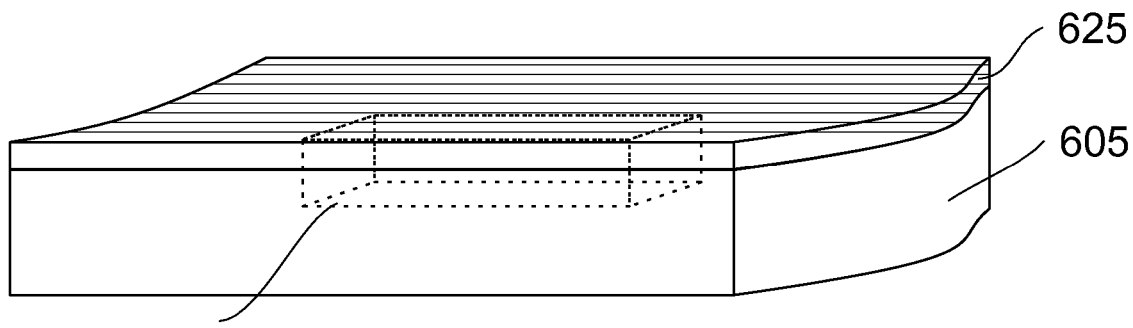

Trench 615 is filled with a material in FIG. 6C to form block 620. Block 620 can comprise a homogeneous magnetic material selected, for example, from the group comprising ferromagnetic materials and ferrimagnetic materials, and corresponding to central region 42. In this case, block 620 is planarized and polished. Exemplary ferromagnetic or ferrimagnetic materials used in block 620 are a permalloy, a nickel-iron alloy, a cobalt-iron alloy, an alloy formed from one or more of Ni, Co and Fe, an alloy formed from one or more of Ni, Co and Fe plus other elements, for example, B, Zr, Hf, Cr, Pd, Pt, etc. Alternatively, block 620 can be formed from an inhomogeneous magnetic material, for example, comprising alternating regions of different ferromagnetic or ferrimagnetic metals, similar to those, for example, shown as regions 410, 420, and 415, 425 in FIG. 4A. These regions can be formed by additional processing steps not shown in FIG. 6, which might include additional lithography, patterning, etching, material deposition using, for example, plating or sputter deposition or chemical vapor deposition, and planarizing steps. Alternatively, block 620 can comprise a sacrificial material that will later be etched away. The sacrificial material may be formed by low-pressure chemical vapor deposition, followed by chemical mechanical polishing for planarization.

A thin layer of dielectric 625, for example, silicon nitride, may then be deposited on top of insulator 605, serving as a bottom capping layer, to protect the trench, if needed, during subsequent process steps. The thickness of the bottom capping layer ranges between approximately 10 and 500 nm. The bottom capping layer 625 can be made of silicon nitride, silicon oxide, or any other suitable dielectric. In another embodiment, the bottom capping layer 625 might not be necessary.

Figure 7:
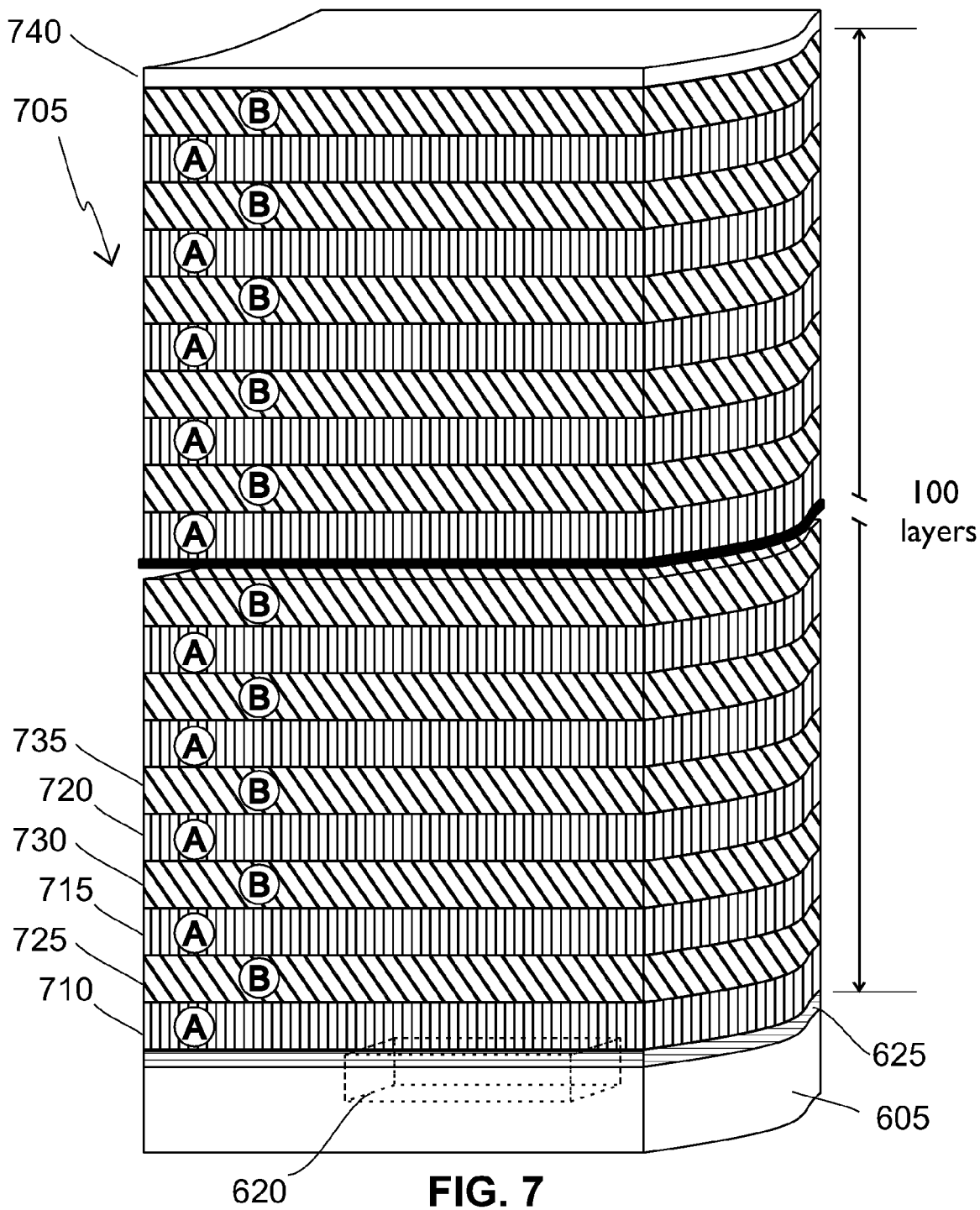
FIG. 7 is a diagram illustrating the formation of a multi-layer stack structure in which the data region and reservoir of the data track in the multi-layered magnetic shift register of FIG. 1 can be formed.
Figure 8A:
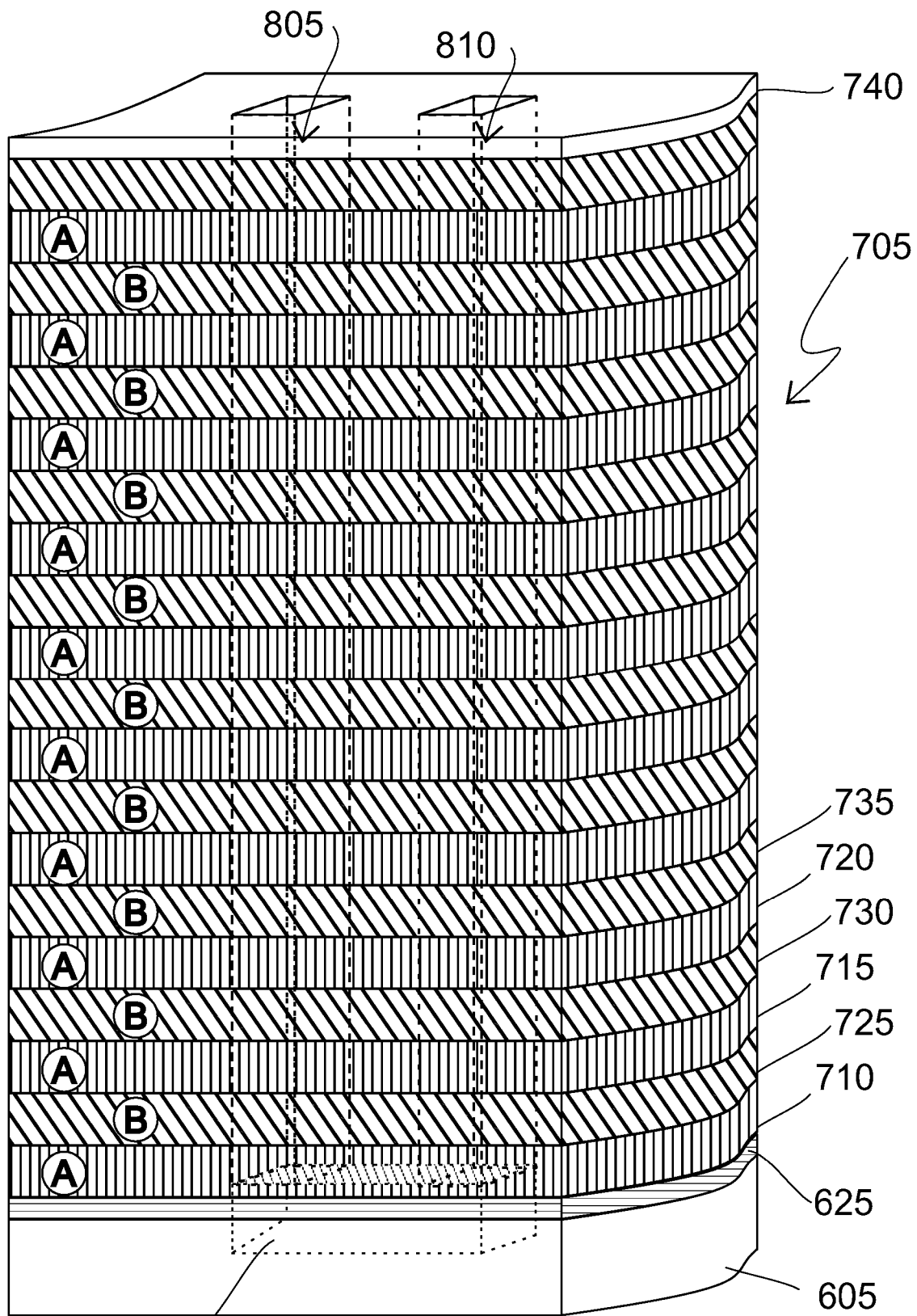
FIG. 8 is comprised of FIGS. 8A, 8B, 8C, 8D, and 8E and represents a diagram illustrating the formation of vias in the multi-layer stack structure for filling with ferromagnetic or ferrimagnetic material to form the data region and reservoir of the multi-layered magnetic shift register of FIG. 1.
Figure 8B:
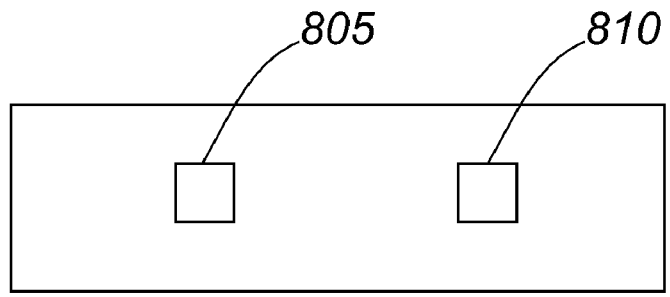
Figure 8C:
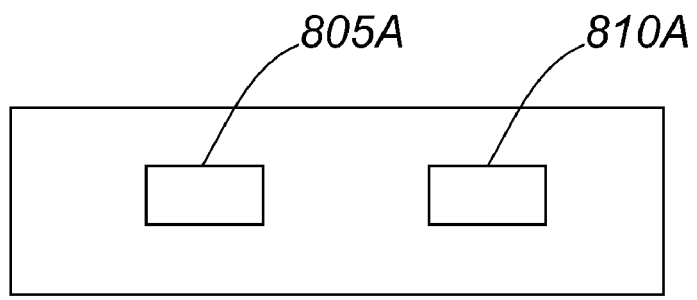
Figure 8D:
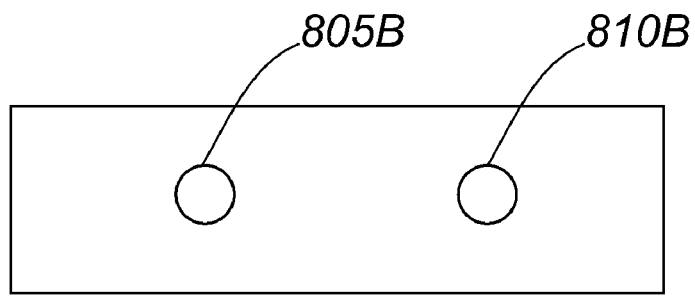
Figure 8E:
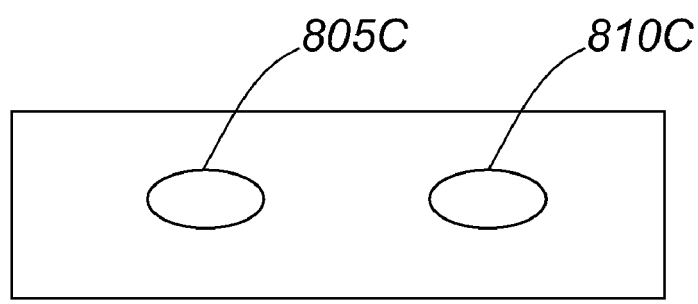

FIG. 7 illustrates the fabrication of a structure in which two vias can be formed, creating data region 35 and reservoir 40 of the data track 11. A multi-layer stack structure 705 is formed of alternating silicon/dielectric or dielectric/dielectric materials (referred to as materials A and B). The materials A and B are chosen for their etching properties. In a preferred embodiment, material A is comprised of silicon dioxide ($SiO_2$) and material B is comprised of silicon (Si). Alternatively, material A comprises silicon dioxide while material B comprises silicon nitride ($Si_3N_4$).

In the example of FIG. 7, a first set of layers such as layers 710, 715, 720 are formed of material A, for example, silicon dioxide. A second set of layers such as layers 725, 730, 735 are formed of a material B, for example, silicon or silicon nitride. The first and second set of layers can be formed using various techniques. For example, polycrystalline silicon layers may be formed using low-pressure chemical vapor deposition or amorphous silicon layers may be formed by sputter deposition. A thin layer of dielectric, for example, silicon nitride, may be deposited on top of the multi-layer stack structure 705, serving as an upper capping layer 740. The thickness of the upper capping layer 740 ranges between approximately 10 and 500 nm. The upper capping layer can be made of silicon nitride, silicon oxide, or any other suitable dielectric.

Material A and material B can be selected with different etch rates, allowing the formation of notches or protuberances in the walls of the vias. While shown of equal thickness in FIG. 7, layers formed of material A and material B can have different thicknesses.

The multi-layer stack structure 705 can comprise, for example, approximately 100 layers of alternating layers of material A and material B for a total thickness, for example, of approximately 0.5 to 10 microns or more. The thicknesses of the materials A and material B that form, for example, layers 710, 715, 720, 725, 730, 735 correspond to domain wall separations in data region 35 or reservoir 40 of the data track 11.

Material A or material B are etched to form notches or protuberances. The thickness of one material represented, for example, by material A, can correspond to the separation between domain walls in the data track 11. The other material represented, for example, by material B, will form the notches or protuberances in data region 35 or reservoir 40 of the of the data track 11. Such a configuration for data track 11 is illustrated by FIG. 5. Although the layers A and layers B represented by layers 710, 715, 720, 725, 730, 735 are shown of equal thicknesses, in practice they can be of very different thicknesses. The width of each notch or protuberance can range between approximately 5 nm and 100 nm.

FIG. 8 (FIGS. 8A, 8B, 8C, 8D, 8E) illustrates the formation of vias 805, 810 in the multi-layer stack structure 705. In an embodiment utilizing silicon as material B (i.e., layers 725, 730, 735), the sidewall of vias 805, 810 is oxidized to form a thin insulator layer of silicon dioxide (with a thickness ranging between approximately 3 nm and 30 nm). Vias 805, 810 can be filled with a homogeneous ferromagnetic or ferrimagnetic material to form data region 35 and reservoir 40 of the data track 11. A cross-section view of the multi-layer stack structure 705 taken perpendicular to the vias 805, 810 is shown in FIG. 8B illustrating the square cross-section of the vias 805, 810. Vias 805, 810 may be formed with various other cross-sections, for example, a rectangular cross-section as indicated by vias 805A, 810A shown in FIG. 8C, a circular cross-section as indicated by vias 805B, 810B in FIG. 8D, and an elliptical cross-section as indicated by vias 805C, 810C shown in FIG. 8E.

Figure 9:
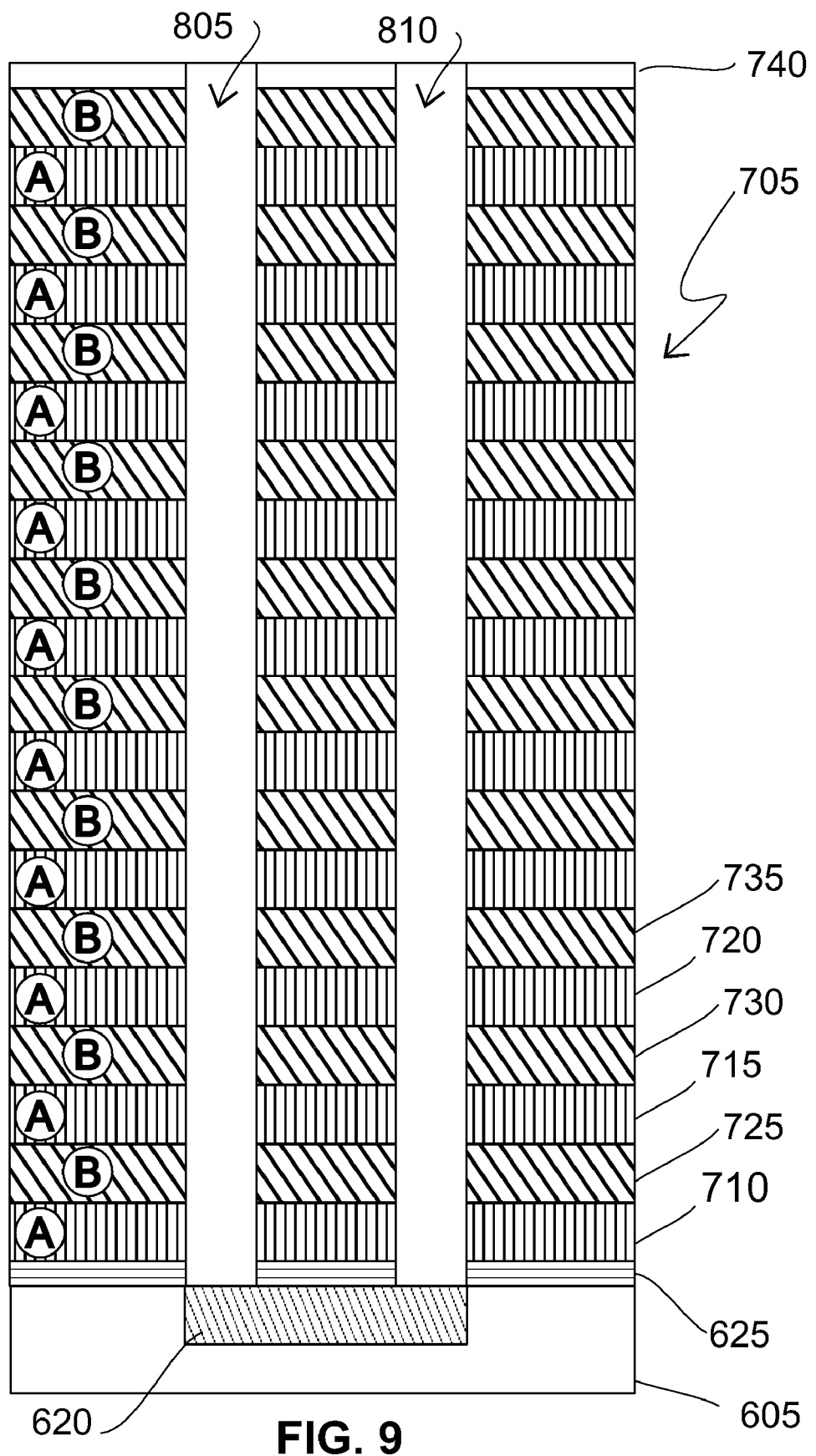
FIG. 9 is a cross-sectional diagram illustrating vias etched with planar smooth walls from the top of the multi-layer stack structure of FIG. 7 to the bottom region of FIG. 6.

As illustrated by the cross-sectional view of FIG. 9, vias 805, 810 are etched through the multi-layer stack structure 705 to block 620 in insulator 605. In the example of FIGS. 8 and 9, vias 805, 810 are formed with planar smooth walls by the process of etching the via. In an embodiment in which material B (i.e., layers 725, 730, 735) is comprised of silicon, vias 805, 810 may be formed by alternating the dry etching process between a process which is selective for silicon as compared to silicon dioxide and a process which is selective for silicon dioxide as compared to silicon. The term "selective" is used to indicate that the etchant etches the first material faster than the second material. In other words, in the dry etching process for silicon selective to silicon dioxide, silicon is etched at a faster rate than silicon dioxide in order to gain better etching control. Reference is made to U.S. Pat. Nos. 6,544,838 and 6,284,666 for more details on the dry etching process for silicon selective to silicon dioxide, which patents are incorporated herein by reference. Reference is made to U.S. Pat. Nos. 6,294,102 and 5,811,357 for more details on the dry etching process for silicon dioxide selective to silicon, which patents are incorporated herein by reference.

When material A is formed of silicon oxide and material B is formed of silicon nitride vias 805, 810 can similarly be formed by alternating the dry etching process, successively, between a process which etches silicon nitride preferentially over silicon oxide (reference is made to U.S. Pat. Nos. 6,461, 529 and 6,051,504, which are incorporated herein by reference) and a process which etches silicon dioxide preferentially over silicon nitride (reference is made to U.S. Pat. Nos. 6,294,102 and 5,928,967, which are incorporated herein by reference). If block 620 is comprised of a metal such as a ferromagnetic or ferrimagnetic material, the etchant will not likely substantially etch into the material of block 620. Formation of the vias 805, 810 is followed by etching the capping layer 625 to open the contact to the bottom section of homogeneous ferromagnetic or ferrimagnetic material, block 620.

Prior to the etching of the vias 805, 810, the capping layer 740 is etched using an appropriate etchant or the capping layer 740 may be etched using one of the etchants for layer A or B depending on these material constituents and that of layer 740. The capping layer 740 may be used, for example, to prevent oxidation of the topmost layer of the multi-layer stack structure of alternating silicon and/or dielectric layers when the top layer in this stack is comprised of silicon.

FIG. 10 (FIGS. 10A, 10B, 10C, 10D, 10E) illustrates the effect of using a selective wet etching process after vias 805, 810 are formed. The multi-layer stack structure 705 is illustrated in FIG. 10 (FIGS. 10A, 10B, 10C, 10D, 10E) without the capping layer 740 or substrate capping layer 625. By using a selective wet etching process, material A and material B can be etched at different rates. As an example, a hydrofluoric acid (HF) based chemical (for example, buffered or diluted HF) can be used for wet-etching silicon dioxide selective to both silicon oxide and silicon nitride, and phosphoric acid $H_3PO_4$ based chemical can be used for wet-etching silicon nitride selective to silicon dioxide.

Etching material A and material B at different rates forms regular variations in the cross-section of vias 805, 810. When filled with ferromagnetic or ferromagnetic material, the variations in the cross-sections of the vias 805, 810 produce protuberances or notches in data region 35 or reservoir 40 of the data track 11. The protuberances or notches in the magnetic material track 11 can be used to pin magnetic domain walls in data region 35 and reservoir 40. The configuration of notches or protuberances in vias 805, 810 is selected for optimum performance of the data track 11 in the multi-layered magnetic shift register 10. In particular, the length and depth of the notches or protuberances and their shape can be varied to vary the pinning potential of the domain walls.

Figure 10A:
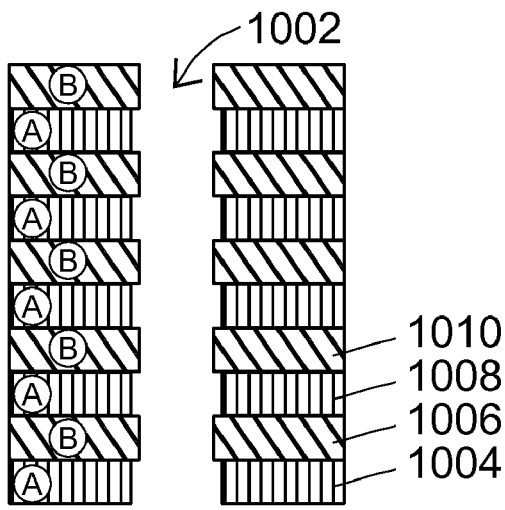
FIG. 10 is comprised of FIGS. 10A, 10B, 10C, 10D, and 10E and represents the effect of using a selective etching process on the walls of the vias, creating vias with regular variations in cross-section.

FIG. 10A illustrates a cross-section of a portion of a via 1002 illustrating a selective etching process with material A (represented by layers 1004, 1008) etched faster than material B (represented by layers 1006, 1010). When via 1002 is filled with ferromagnetic or ferrimagnetic material, layers 1004, 1008 form protuberances while layers 1006, 1010 form notches in data region 35 or reservoir 40 of data track 11.

Figure 10B:
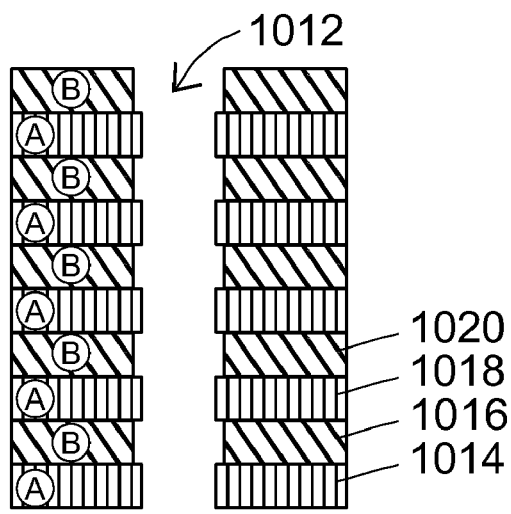

FIG. 10B illustrates a cross-section of a portion of a via 1012 where material A (represented by layers 1014, 1018) etches slower than material B (represented by layers 1016, 1020). When via 1012 is filled with ferromagnetic or ferrimagnetic material, layers 1014, 1018 form notches while layers 1016, 1020 form protuberances in data region 35 or reservoir 40 of data track 11.

Figure 10C:
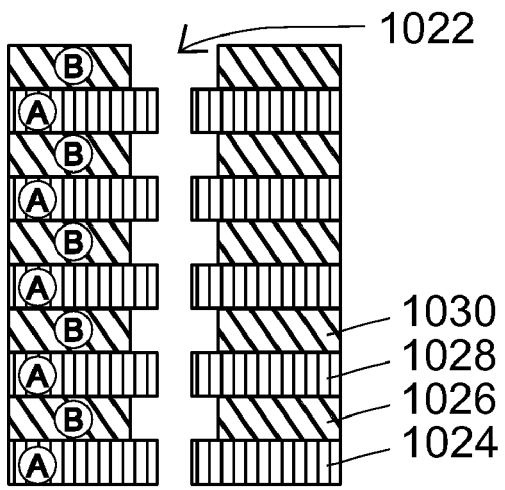

Material A, material B, and the etching process can be selected to provide shallow notches, as illustrated in FIGS. 10A and 10B, or deeper notches, as illustrated by via 1022 in FIG. 10C. Material B (represented by layers 1026, 1030) etches much faster than material A (represented by layers 1024, 1028).

Figure 10D:
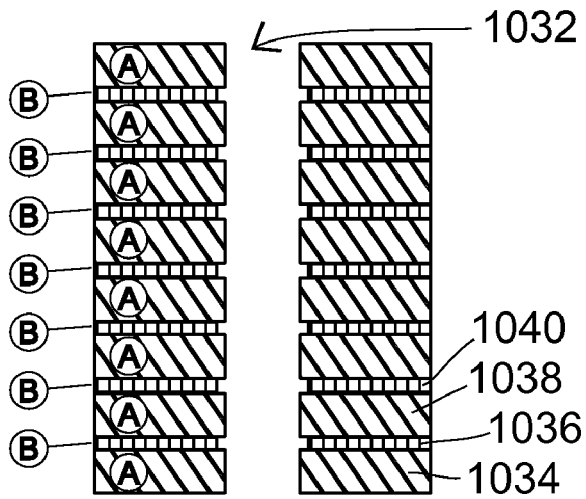
Figure 10E:
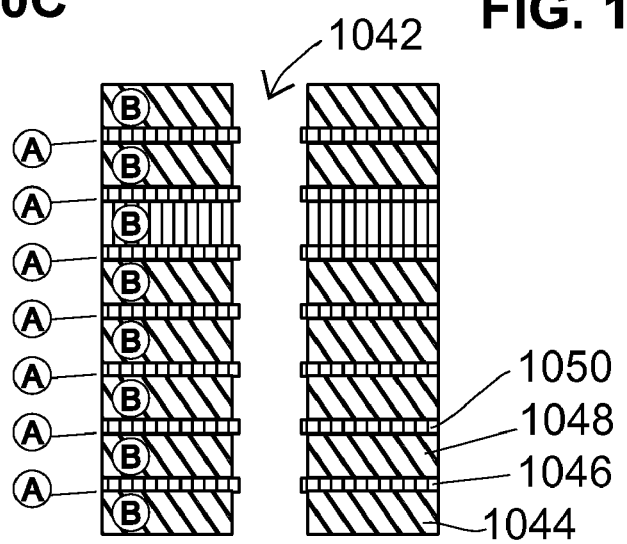

The thicknesses of layers of material A and material B can also be varied, as illustrated by FIGS. 10D and 10E. FIG. 10D illustrates a cross-section of a via 1032 in which layers of material A (represented by layers 1034, 1038) are thicker than layers of material B (represented by layers 1036, 1040). When via 1032 is filled with ferromagnetic or ferrimagnetic material, layers 1036, 1040 form thin protuberances while layers 1034, 1038 form wide notches in data region 35 or reservoir 40 of data track 11.

FIG. 10E illustrates a cross-section of a via 1042 in which layers of material A (represented by layers 1046, 1050) are thinner than layers of material B (represented by layers 1044, 1048). When via 1042 is filled with ferromagnetic or ferrimagnetic material, layers 1046, 1050 form thin notches while layers 1044, 1048 form wide protuberances in data region 35 or reservoir 40 of data track 11.

Figure 11A:
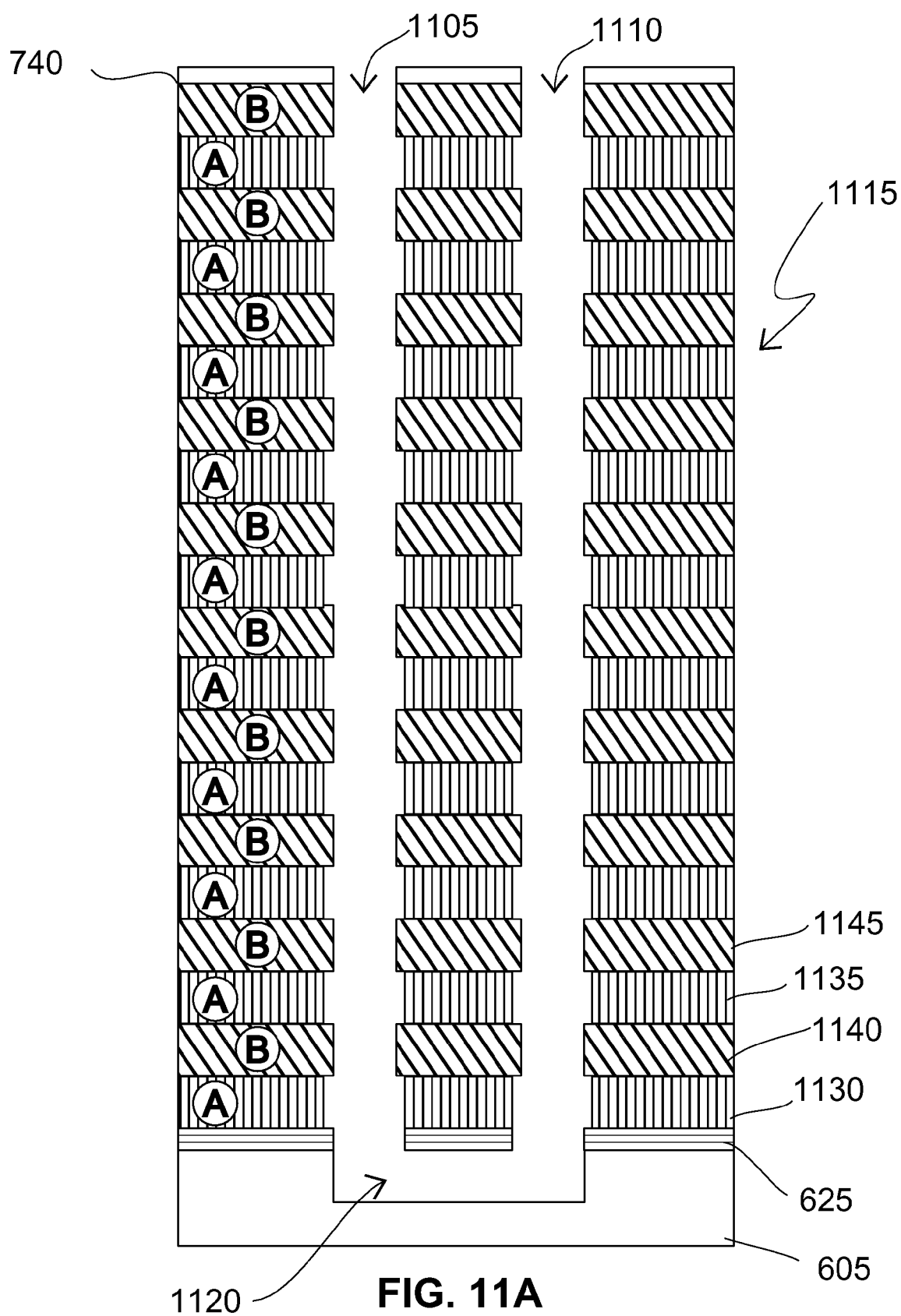
FIG. 11 is comprised of FIGS. 11A and 11B and illustrates a cross-section of a data track form which can be filled with magnetic material to fabricate the data track of the multi-layered magnetic shift register of FIG. 1.
Figure 11B:
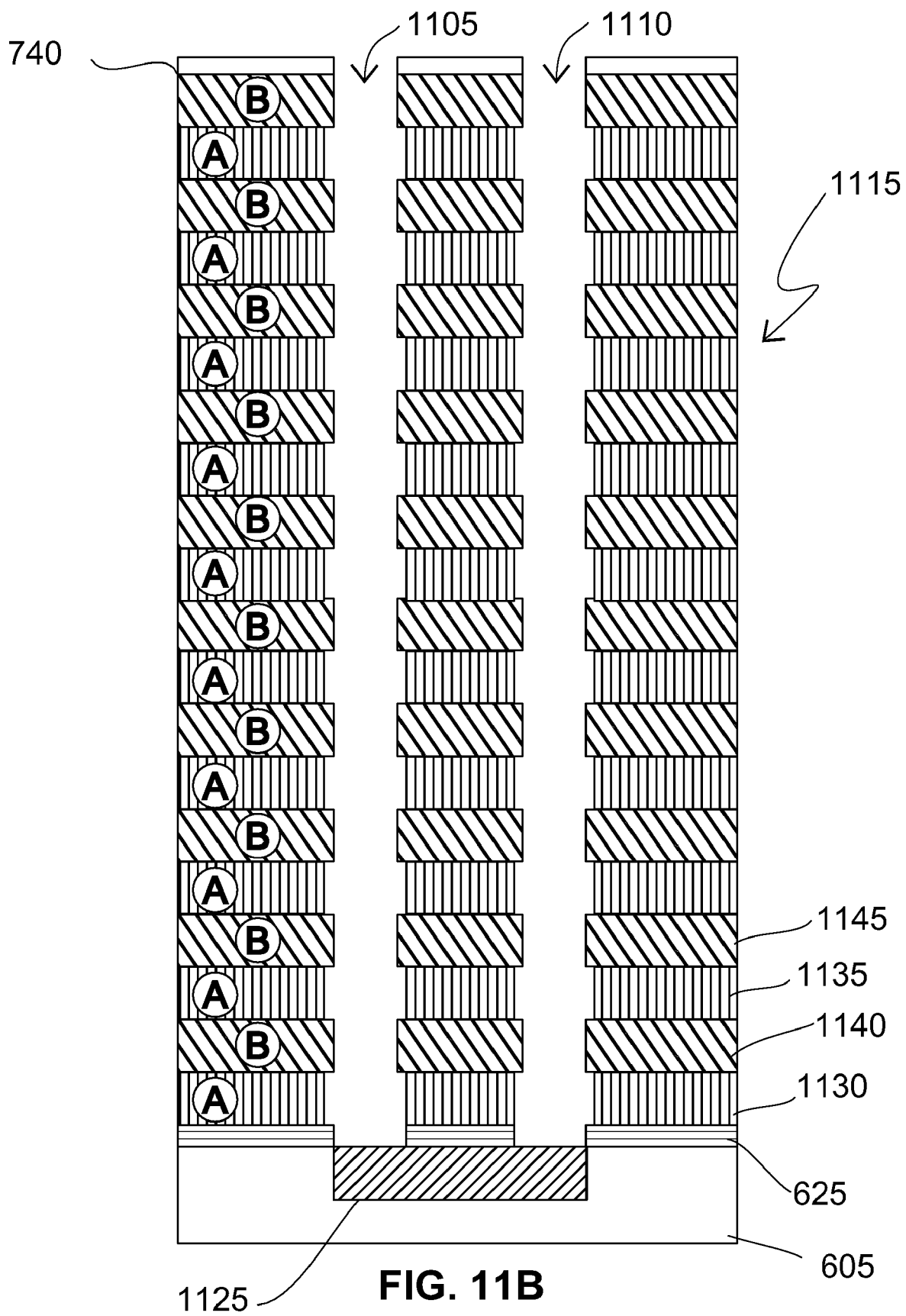

FIG. 11 (FIGS. 11A, 11B) illustrates a cross-section of a form for the data track 11 comprising vias 1105, 1110 (etched in multi-layer stack structure 1115) and trench 1120. To produce the trench 1120, block 620 is filled with a sacrificial dielectric material (FIG. 6). This material is etched away when vias 1105, 1110 are formed. In an alternate embodiment shown in FIG. 11B, block 620 comprises ferromagnetic or ferrimagnetic material 1125 that remains after via 1105, 1110 are created.

As illustrated by FIG. 11A, material A (represented by layers 1130, 1135) etches at a faster rate than material B (represented by layers 1140, 1145). Consequently, the data track 11 formed by vias 1105, 1110 will have regularly spaced notches and protuberances and equally thick layers of material A and material B.

Figure 12A:
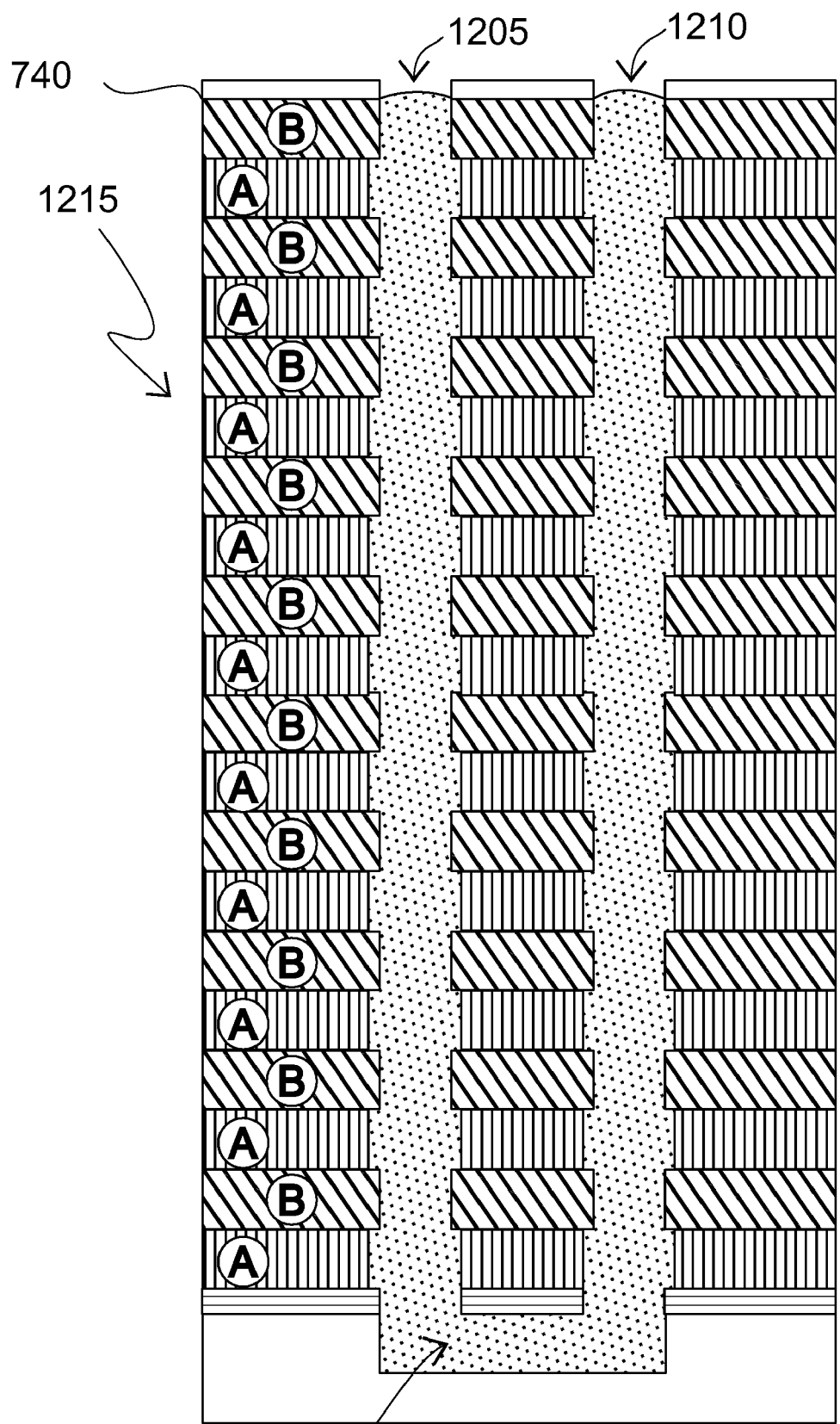
FIG. 12 is comprised of FIGS. 12A and 12B and illustrates a data track created by filling the vias and bottom trench with ferromagnetic or ferrimagnetic material.
Figure 12B:
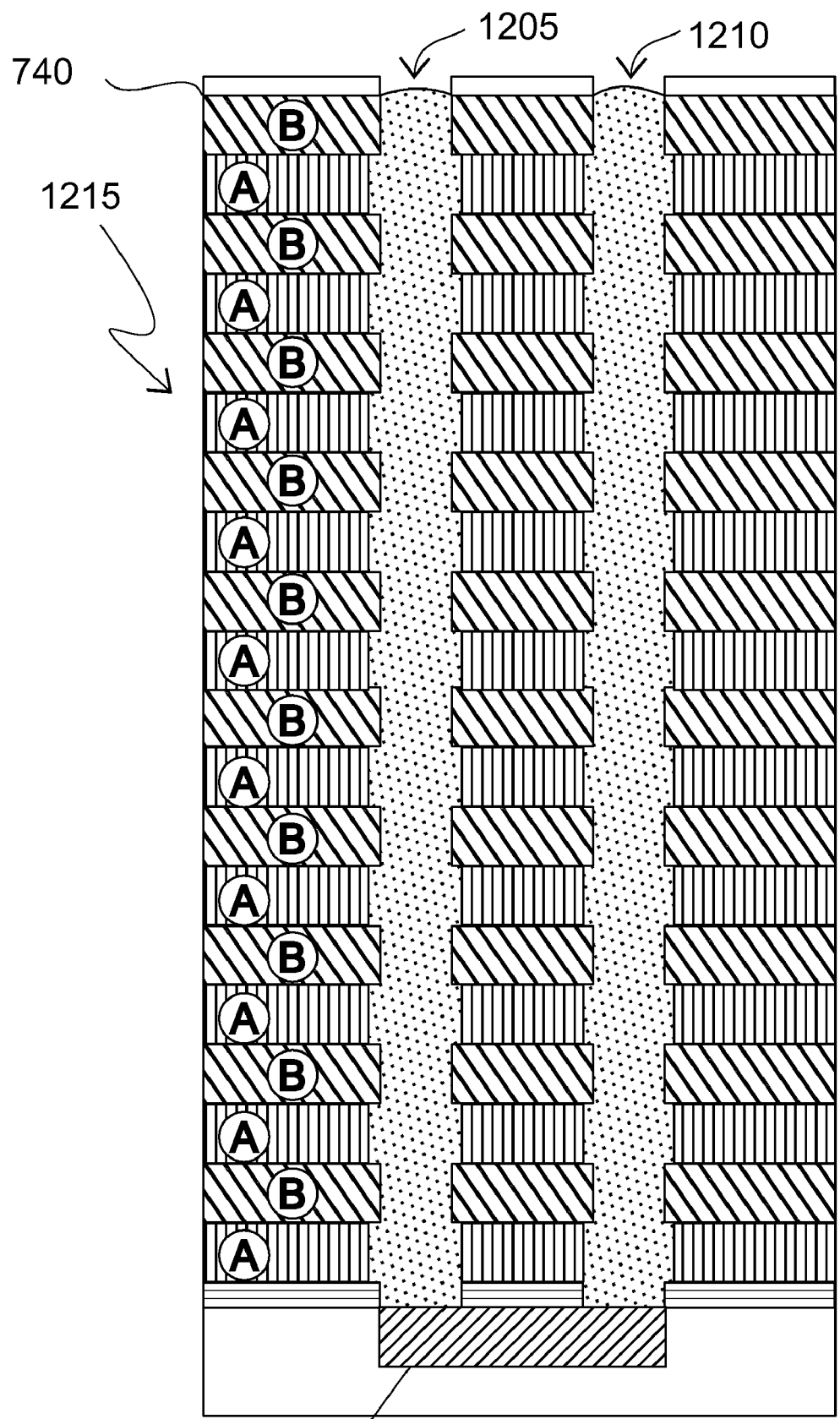

FIG. 12 (FIGS. 12A, 12B) illustrates a track 1215 created by filling vias 1105, 1110, and trench 1120 with ferromagnetic or ferrimagnetic material as indicated by filled vias 1205, 1210 and bottom region 1220. Filled via 1205 corresponds to data region 35, filled via 1210 corresponds to reservoir 40, and bottom region 1220 corresponds to central region 42.

Vias 1105, 1110 and trench 1120 can be filled by various methods, for example, electroless plating or electroplating. Reference is made to U.S. Pat. No. 3,702,263 for the process of electroless plating and to U.S. Pat. No. 4,315,985 for the process of electroplating, which patents are incorporated herein by reference. Alternatively, block 1125 can comprise a magnetic material such as ferromagnetic or ferrimagnetic material before vias 1105, 1110 are filled. The magnetic material of block 1125 may or may not be the same as that used to fill vias 1105, 1110. The metal of block 1125 can be used as a seed layer electrode for the electroless or electroplating process. It is more desirable to use an electroplating process because this is much faster than an electroless plating process. To carry out electroplating a contact must be provided to the seed layer electrode. This can be accomplished via a sacrificial wire or contact (not shown in the figure) or could be a very thin layer of metal, such as Al, which is deposited on the side wall of the vias 1105, 1110. After the plating process is completed the Al metal on the side walls can be oxidized to form aluminum oxide, which is insulating, by heating the track at a temperature in the vicinity of 300 C. For the case of FIG. 11A where the sacrificial layer was removed then a thin seed layer electrode may be deposited by a process, such as chemical vapor deposition, prior to filling the vias.

Figure 13:
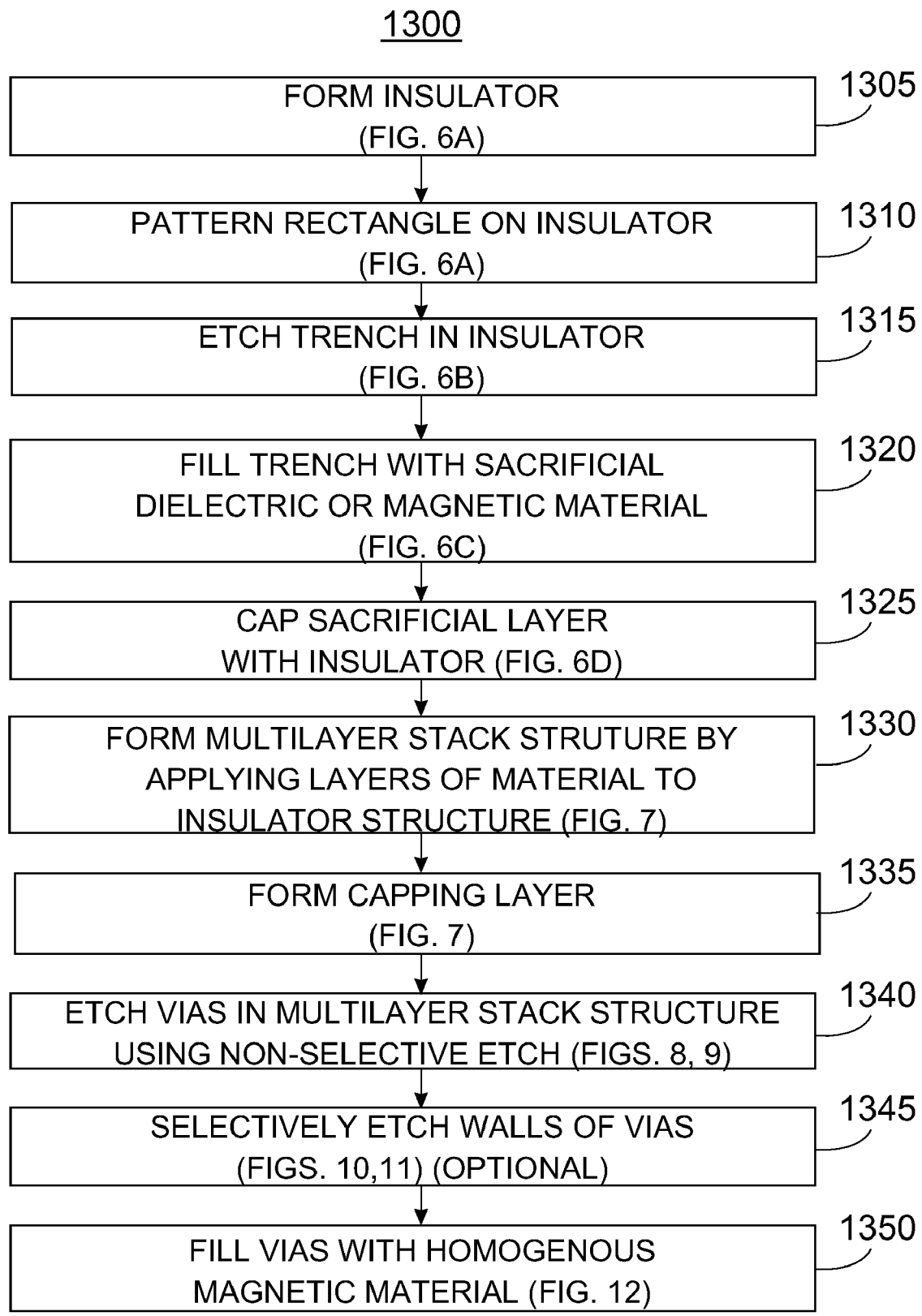
FIG. 13 is a process flow chart illustrating a method of fabricating a multi-layered magnetic shift register of FIG. 1 with homogeneous magnetic material, as illustrated by FIG. 12.

A method 1300 for fabricating a track 1215 is illustrated by the process flow chart of FIG. 13. An insulator 605 is formed at step 1305 (FIG. 6A). At step 1310, a rectangle 610 is patterned on insulator 605 (FIG. 6A). Rectangle 610 is etched at step 1315 to form trench 615 (FIG. 6B). Trench 615 is filled with a sacrificial dielectric, ferromagnetic material, or ferrimagnetic material at step 1320 (FIG. 6C). The trench 62 is then preferably covered with a capping layer 625 in step 1325

Multiple layers of alternating materials A and B are applied to the insulator 605 in step 1330, forming multi-layer stack structure 705 (FIG. 7). The multi-layer stack structure 705 can comprise, for example, approximately 100 layers of alternating materials A and B for a total thickness, for example, of approximately 10 microns. The capping layer 740 is formed on top of the multi-layer stack structure 705 at step 1335.

Vias 805, 810 are non-selectively etched through the multi-layer stack structure 705 to block 620 at step 1340 (FIGS. 8, 9). If block 620 is filled with sacrificial dielectric material, the sacrificial dielectric material is also etched away in step 1340 (FIG. 11).

An optional selective etching process can be used at step 1345 to selectively etch one material faster than the other, forming notches and protuberances in the walls of vias 805, 810 (FIG. 10, 11). Vias 805, 810 are filled with ferromagnetic or ferrimagnetic material at step 1350 (FIG. 12), forming the data track 11 of the multi-layered magnetic shift register 10.

Another embodiment of the fabrication of the data track 11 forms conductive pads in the lower insulator layer and the central region 42 is formed in the top layer of the multi-layer stack structure 705. This fabrication process is illustrated by FIGS. 14, 15, 16, 17, 18, 19, 20, 21, 22, and 23.

FIG. 14 (FIGS. 14A, 14B, 14C, 14D) illustrates the fabrication of conducting pads that will connect to data region 35 and reservoir 40 at the bottom of data track 11. An insulator 1405 such as, for example, silicon nitride or silicon dioxide is formed at a thickness of approximately 300 nm.

Photoresist is applied to insulator 1405 and patterned in the form of rectangles 1410, 1415. Using standard etching techniques, rectangles 1410, 1415 are etched to a depth of approximately 200 nm to form trenches 1420, 1425. Reference is made to U.S. Pat. No. 6,051,504 for the process of silicon nitride etching and U.S. Pat. No. 5,811,357 for the process of silicon dioxide etching, which patents are incorporated herein by reference.

Figure 14A:
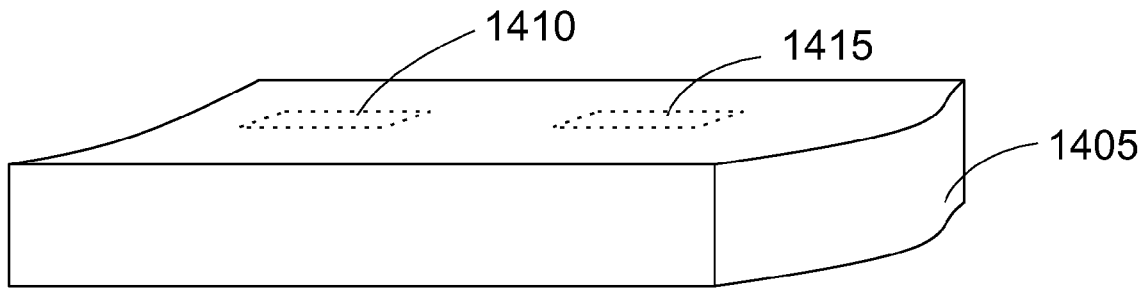
FIG. 14 illustrates the fabrication of conducting pads that will connect to the data region and reservoir of the data track of the multi-layered magnetic shift register of FIG. 1.
Figure 14B:
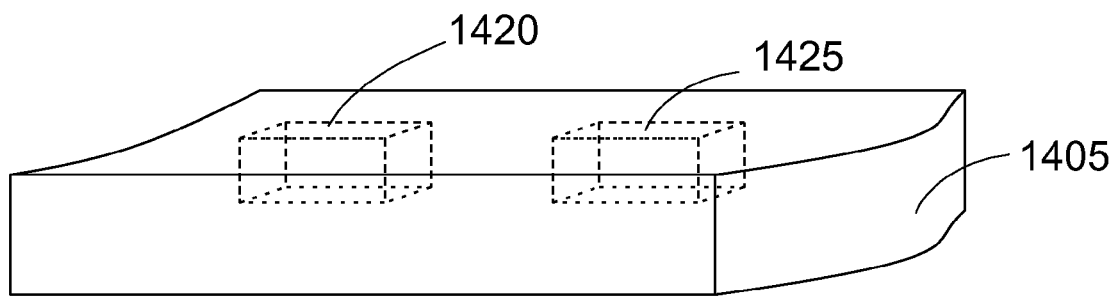
Figure 14C:
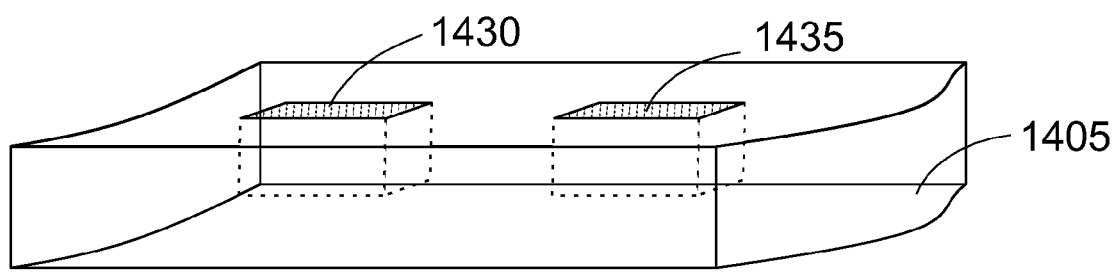
Figure 14D:
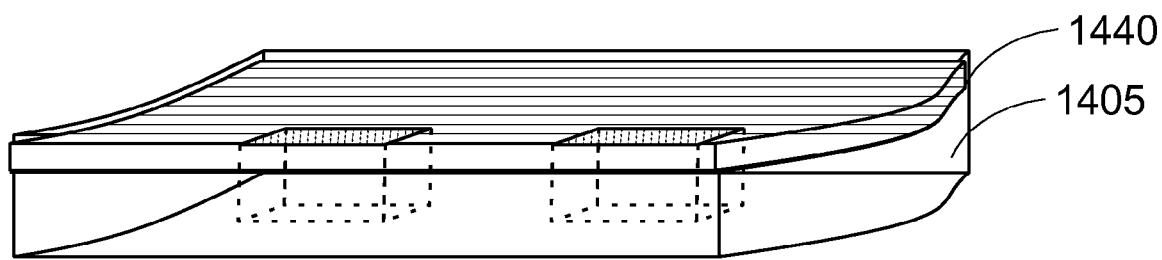

Trenches 1420, 1425 are filled with a material in FIG. 14C to form blocks or bottom pads 1430, 1435. Blocks 1430, 1435 can comprise a conductive material to form conductive pads at the bottom of data track 11. Exemplary conductive materials used in blocks 1430, 1435 are conducting silicon, copper, etc. Alternatively, blocks 1430, 1435 can comprise a sacrificial material that will later be etched away. The sacrificial material can be made, for example, of silicon dioxide. The sacrificial material is formed by low-pressure chemical vapor deposition, followed by chemical mechanical polishing for planarization. A thin layer of dielectric, for example, silicon nitride, is then deposited on top of insulator 1405, serving as a capping layer 1440. The thickness of the capping layer 1440 ranges between approximately 10 and 500 nm. The capping layer 1440 can be made of silicon nitride, silicon oxide, or any other suitable dielectric.

Figure 15:
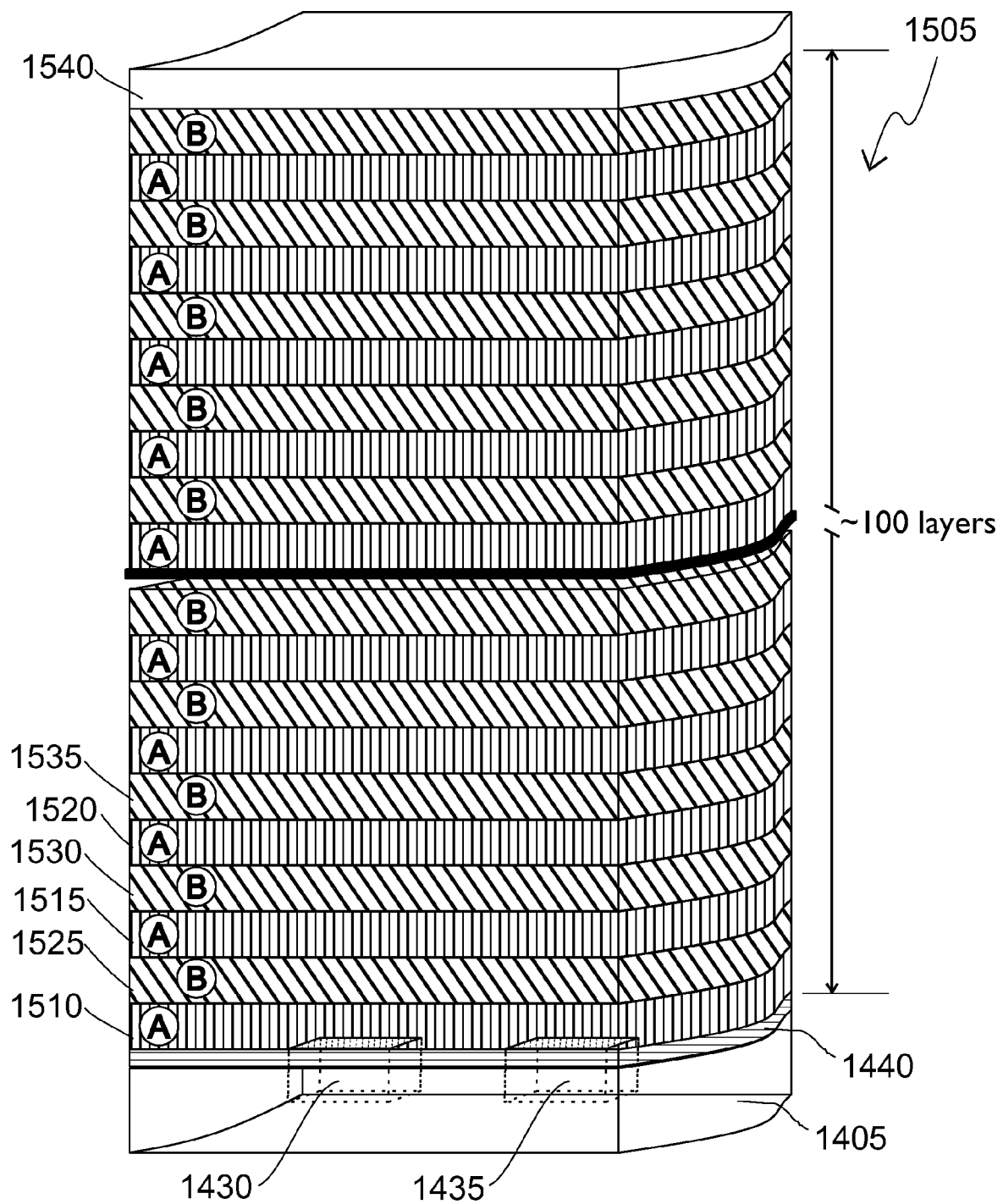
FIG. 15 illustrates the fabrication of a multi-layer stack structure in which two vias can be formed for creating the data region and reservoir of the multi-layered magnetic shift register of FIG. 1.

FIG. 15 illustrates the fabrication of a structure in which two vias can be formed, creating data region 35 and reservoir 40 of the data track 11. A multi-layer stack structure 1505 is formed of alternating materials, material A and material B. Materials A and B are formed from silicon/ dielectric or dielectric/dielectric materials. In a preferred embodiment, material A is comprised of silicon dioxide and material B is formed from silicon. The silicon can be formed as polycrystalline silicon by the process of low pressure chemical vapor deposition or can be formed from amorphous silicon by the process of sputter deposition. Alternatively, material A comprises silicon dioxide while material B comprises silicon nitride.

In the example of FIG. 15, a first set of layers such as layers 1510, 1515, 1520 are formed of material A, for example, silicon dioxide. A second set of layers such as layers 1525, 1530, 1535 are formed of material B, for example, silicon or silicon nitride. A thin layer of dielectric, for example, silicon nitride, is deposited on top of the multi-layer stack structure 1505, serving as a capping layer 1540. The thickness of the capping layer 1540 ranges between approximately 10 and 500 nm. The bottom capping layer 1540 can be made of silicon nitride, silicon oxide, or any other suitable dielectric.

Material A and material B can be selected with different etch rates, allowing the formation of notches or protuberances in the walls of the vias. While shown of equal thickness in FIG. 15, material A and material B can have different thicknesses.

The multi-layer stack structure 1505 can comprise, for example, approximately 100 layers of alternating material A and material B for a total thickness, for example, of approximately 10 microns. The thicknesses of the layers such as layers 1510, 1515, 1520, 1525, 1530, 1535 correspond to individual magnetic domains or as domain wall pinning sites in data region 35 or reservoir 40 of the data track 11.

Material A or material B are etched to form notches or protuberances. Although the layers such as layers 1510, 1515, 1520, 1525, 1530, 1535 are shown of equal thickness, in practice they can be of different thickness. The thickness of one material represented, for example, by material A, can correspond to the separation between domain walls in the data track 11. The other material represented, for example, by material B, will form the notches or protuberances in data region 35 or reservoir 40 of the data track 11. Such a configuration for the data track 11 is illustrated by FIG. 5. The domain walls can either be confined at the notches or protuberances or can be confined within the regions between the notches or protuberances depending on the magnetic properties of the material forming the track.

Figure 16:
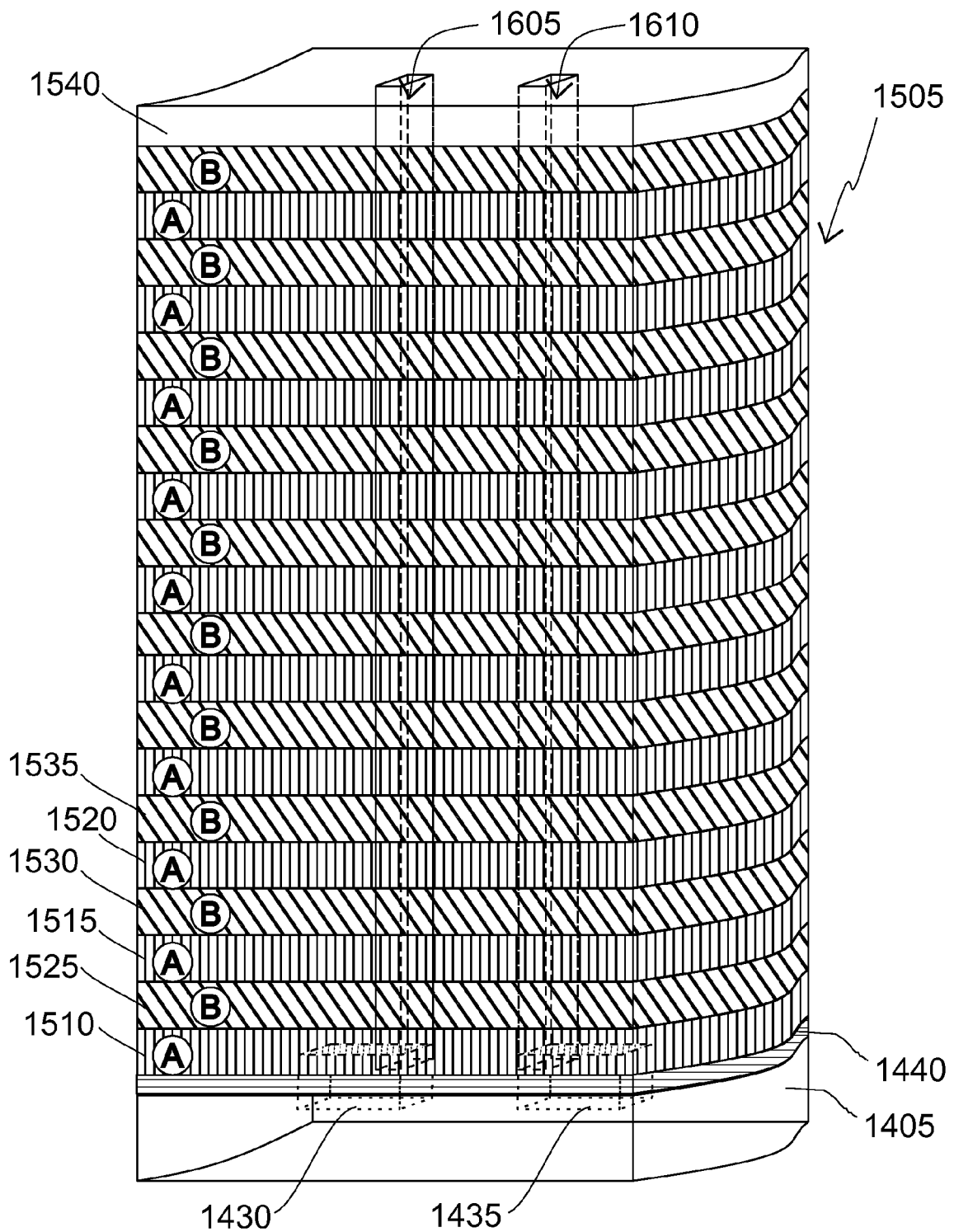
FIG. 16 is a diagram illustrating the formation of vias in the multi-layer stack structure for filling with ferromagnetic or ferrimagnetic material to form the data region and reservoir of the multi-layered magnetic shift register of FIG. 1.

FIG. 16 illustrates the formation of vias 1605, 1610 in the multi-layer stack structure 1505. In an embodiment utilizing silicon as material B (i.e., layers 1525, 1530, 1535), the sidewall of vias 1605, 1610 is oxidized to form a thin insulator layer of silicon dioxide (with a thickness ranging between approximately 3 nm and 30 nm). Vias 1605, 1610 can be filled with homogeneous magnetic material, such as ferromagnetic or ferrimagnetic material, to form data region 35 and reservoir 40 of the data track 11.

Figure 17:
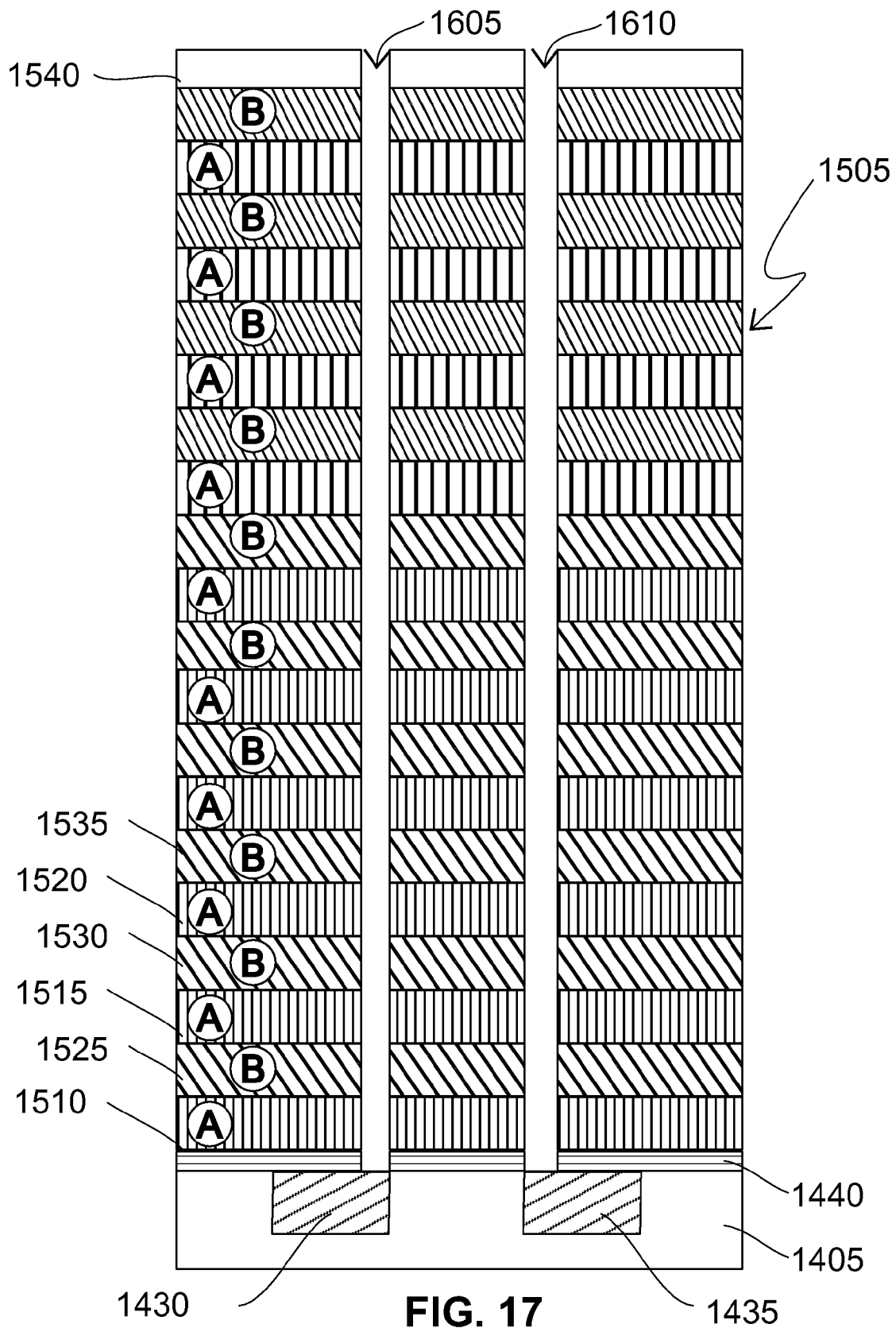
FIG. 17 is a cross-sectional view of the multi-layer stack structure of FIG. 16 illustrating the formation of vias etched from the top of the multi-layer stack structure to the conducting pads of FIG. 14.

As illustrated by the cross-sectional view of FIG. 17, vias 1605, 1610 are etched through the multi-layer stack structure 1505 and the capping layer 1440 to blocks 1430, 1435. In the example of FIGS. 16 and 17, vias 1605 and 1610 are formed with planar smooth walls by the process of non-selectively etching the via. In an embodiment in which material A (i.e. layers 1510, 1515, 1520) is comprised of silicon dioxide and material B (i.e., layers 1525, 1530, 1535) is comprised of silicon, vias 1605, 1610 may be formed by alternating the dry etching process for silicon selective to silicon dioxide and for silicon dioxide selective to silicon. Reference is made to U.S. Pat. Nos. 6,544,838 and 6,284,666 for the process of alternating the dry etching process for silicon selective to silicon dioxide, which patents are incorporated herein by reference. Reference is made to U.S. Pat. Nos. 6,294,102 and 5,811,357 for the process of alternating the dry etching process for silicon dioxide selective to silicon, which patents are incorporated herein by reference.

In an alternative embodiment where material A is formed from silicon oxide and material B is formed from silicon nitride vias 1605 and 1610 can be formed by alternating the dry etching process for silicon nitride selective to silicon oxide (reference is made to U.S. Pat. Nos. 6,461,529 and 6,051,504, which are incorporated herein by reference) and for silicon dioxide selective to silicon nitride (reference is made to U.S. Pat. Nos. 6,294,102, and 5,928,967, which are incorporated herein by reference). A non-selective etching process will etch material A and material B at the same rate. If blocks 1430, 1435 are comprised of a conductor such as conducting silicon, copper, etc. the etching material will not substantially erode the material of blocks 1430, 1435.

Figure 18:
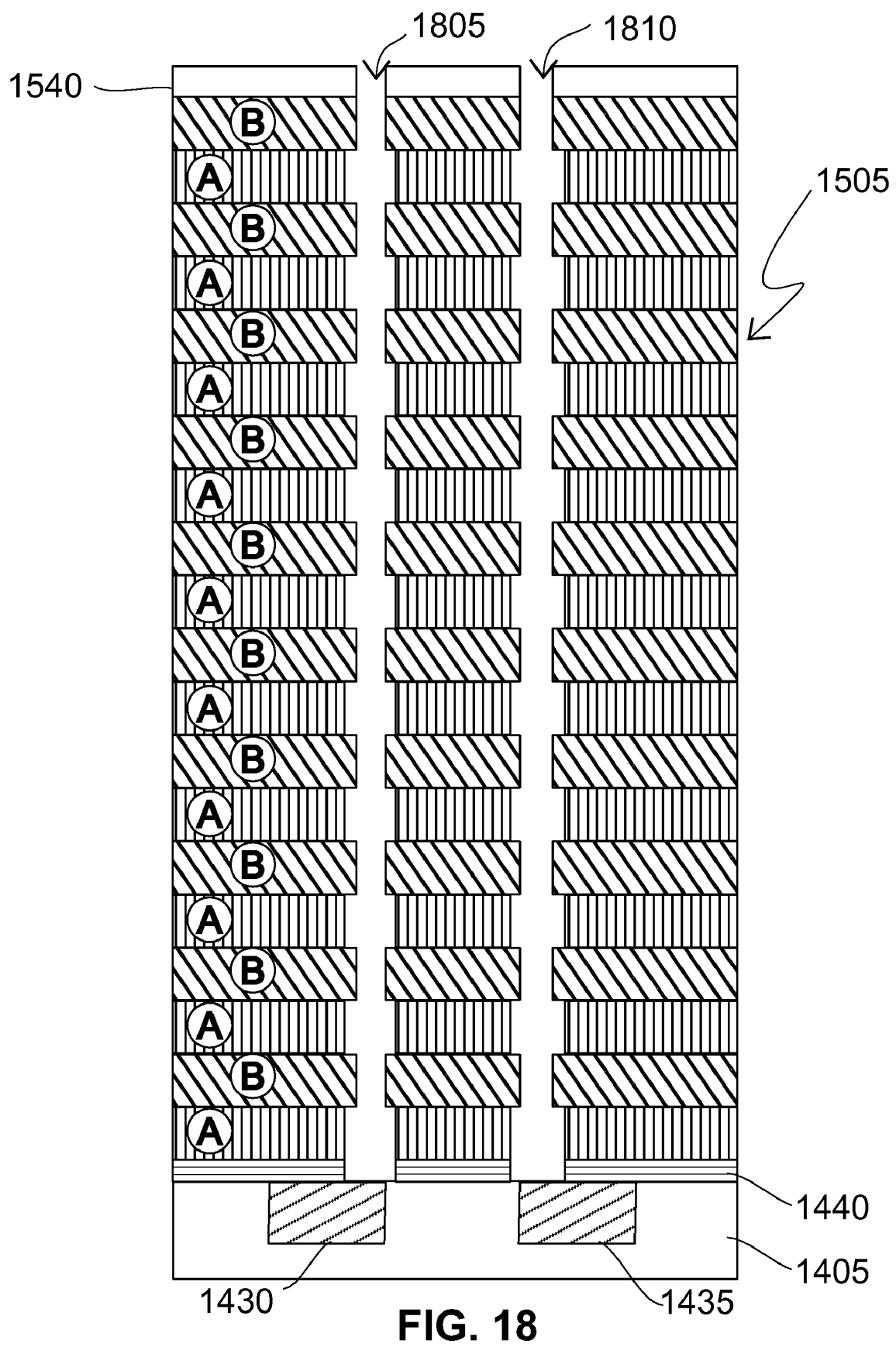
FIG. 18 is a diagram illustrating the effect of using a selective etching process on the cross-section of the via, creating regular variations in the via cross-section.

FIG. 18 illustrates the effect of using a selective etching process on materials with different etch rates. By using a selective etching process, material A and material B of the multi-layer stack structure 1505 can be etched at different rates. For example, hydrofluoric acid HF based chemical (e.g. buffered or diluted HF) can be used for wet-etching silicon dioxide selective to silicon, and phosphoric acid $H_3PO_4$ base chemical can be used for wet-etching silicon nitride selective to silicon dioxide.

Etching material A and material B at different rates forms regular variations in cross-section in vias 1805, 1810. When filled with ferromagnetic or ferromagnetic material, the variations in cross-section of vias 1805, 1810 produce protuberances or notches in data region 35 or reservoir 40 of the data track 11. The protuberances or notches in the track 11 serve to delineate possible boundaries between magnetic regions in the track 11 i.e. magnetic domain walls which are written into the track using the writing element 15 shown, for example, in FIG. 1B. Thus these notches or protuberances are used to pin domain walls in the track in their quiescent state in data region 35 and reservoir 40. The configuration of notches or protuberances in vias 1805, 1810 is selected for optimum performance of the data track 11. Configurations for vias 1805, 1810 and selection of the thicknesses of materials A and B can be similar to those of FIG. 10 (FIGS. 10A, 10B, 10C, 10D, 10E).

Figure 19:
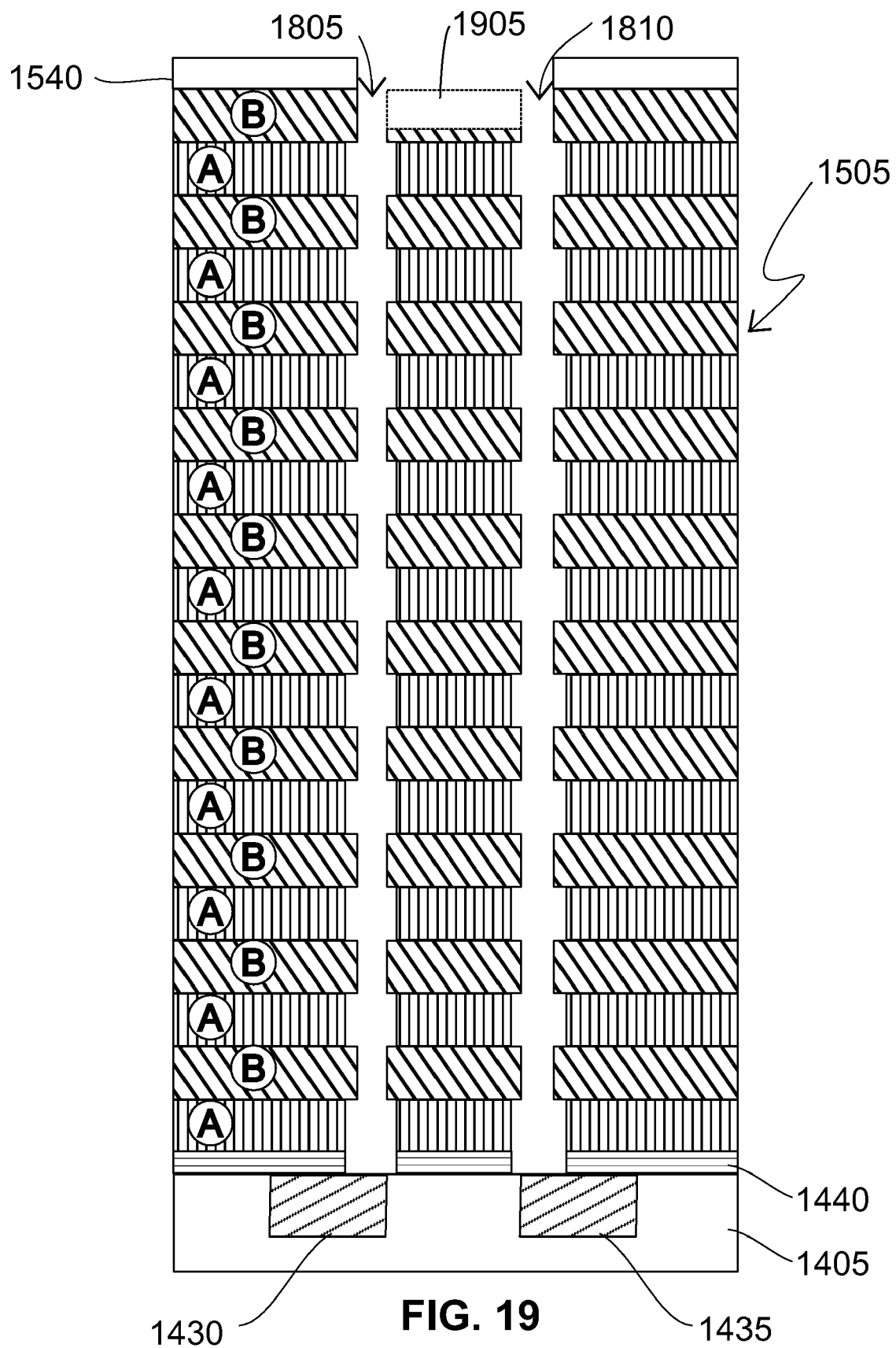
FIG. 19 is a diagram illustrating the removal of material at the top of the multi-layer stack structure between the vias to create a trench for the magnetic region that connects the data region with the reservoir of the data track of the multi-layered magnetic shift register of FIG. 1.

FIG. 19 illustrates the result of removing material from the multi-layer stack structure 1505 to form a region or top trench 1905. The removal of the material to form region 1905 can be implemented, for example, by etching with photoresist, etc. (reference is made to U.S. Pat. Nos. 6,461,529 and 6,051,504, which are incorporated herein by reference). Region 1905 is then filled with ferromagnetic material or ferrimagnetic material to form central region 2010 of the data track 11, as illustrated by the data track 2005 of FIG. 20.

Figure 20:
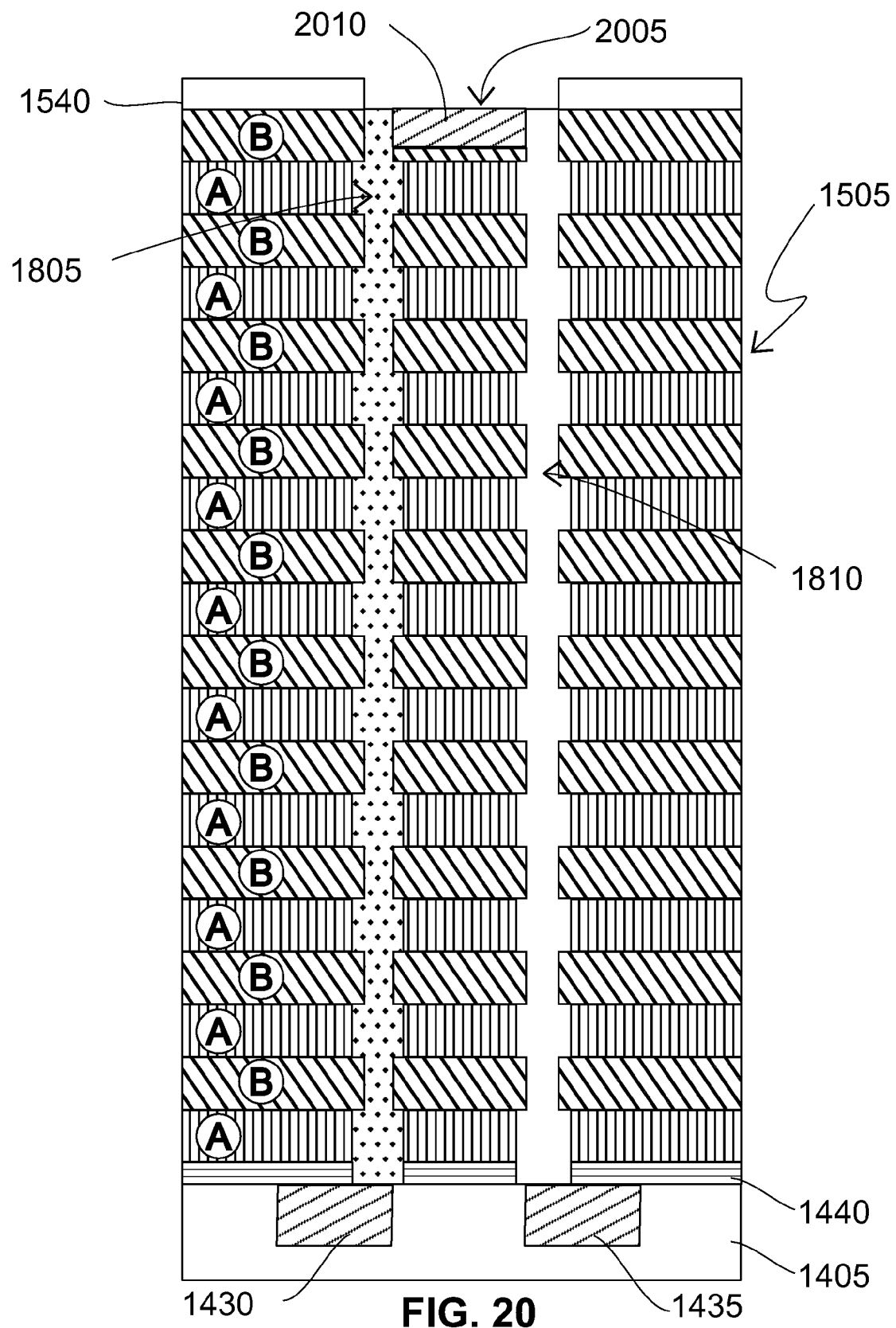
FIG. 20 is a diagram illustrating a data track fabricated by filling the vias of FIG. 17 and the region of FIG. 19 with homogeneous ferromagnetic or ferrimagnetic material.

FIG. 20 illustrates a data track 2005 created by filling vias 1805, 1810, and region 1905 with ferromagnetic or ferrimagnetic material. Vias 1805, 1810 and region 1905 can be filled by various methods, for example, Electroless plating or electroplating. Reference is made to U.S. Pat. No. 3,702,263 for the process of electroless plating and to U.S. Pat. No. 4,315,985 for the process of electroplating, which are incorporated herein by reference.

Figure 21A:
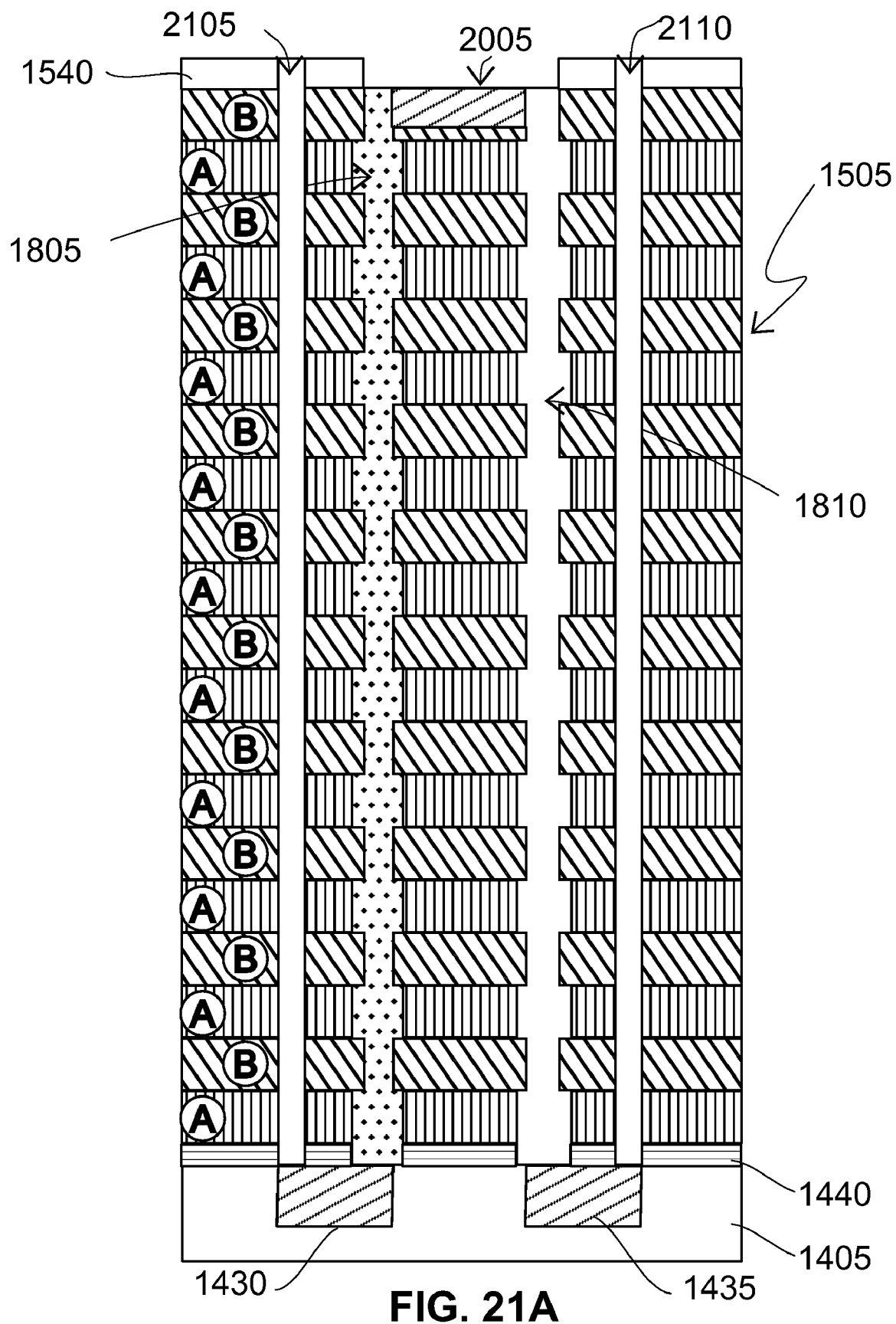
FIG. 21 is comprised of FIGS. 21A and 21B and represents a diagram illustrating a cross-sectional view of vias etched in the multi-layer stack structure to form conductors connecting to the data track of the multi-layered magnetic shift register of FIG. 1.
Figure 21B:
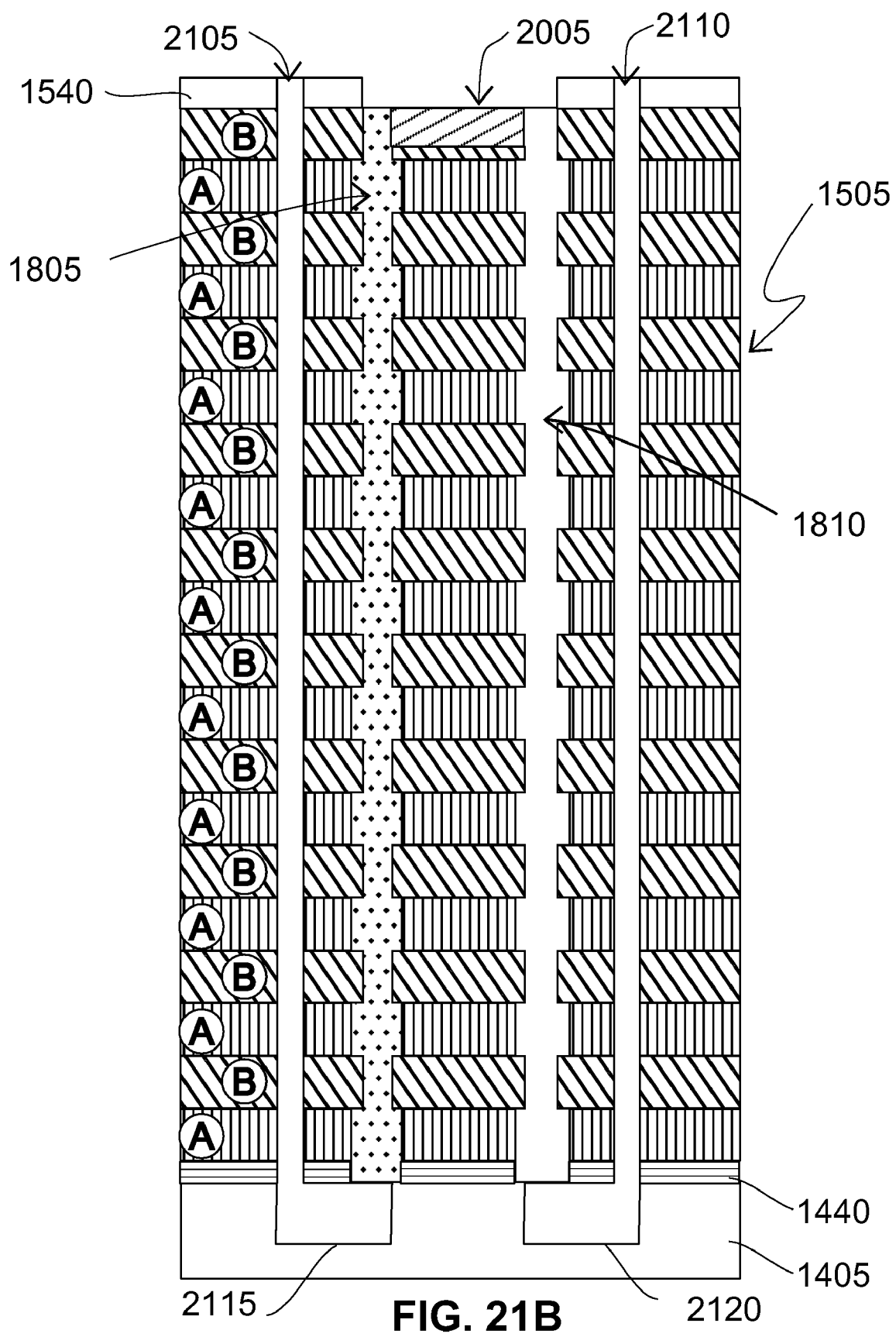

As illustrated by the cross-sectional view of FIG. 21 (FIGS. 21A, 21B), vias 2105, 2110 are etched through the multi-layer stack structure 1505 to blocks 1430, 1435. Vias 2105, 2110 will form conductors that connect external circuitry to the data track 2005 by means of contact with blocks 1430, 1435. In an embodiment where the material A is formed from silicon oxide and the material B from silicon nitride vias 2105, 2110 can be formed by alternating the dry etching process for silicon nitride selective to silicon oxide (reference is made to U.S. Pat. Nos. 6,461,529 and 6,051,504, which are incorporated herein by reference) and for silicon dioxide selective to silicon nitride (reference is made to U.S. Pat. Nos. 6,294,102 and 5,928,967, which are incorporated herein by reference).

In an alternate embodiment, blocks 1430, 1435 are comprised of sacrificial dielectric material that is etched away by the etching process that forms vias 2105, 2110. Consequently, trenches 2115, 2120 are formed, as illustrated by FIG. 21B.

Figure 22A:
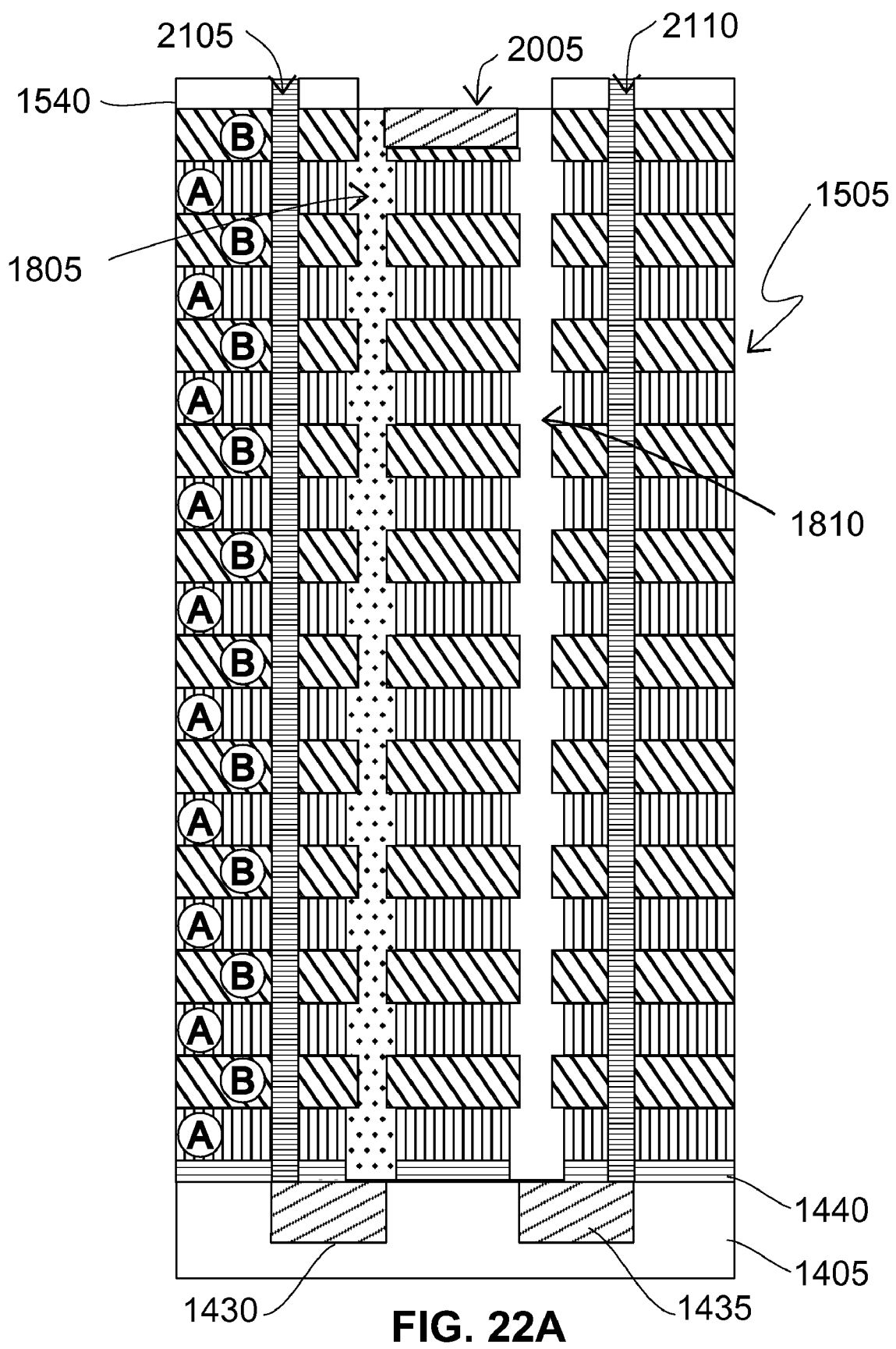
FIG. 22 is comprised of FIGS. 22A and 22B and represents a diagram illustrating the result of filling the vias of FIG. 21 with conductive material.
Figure 22B:
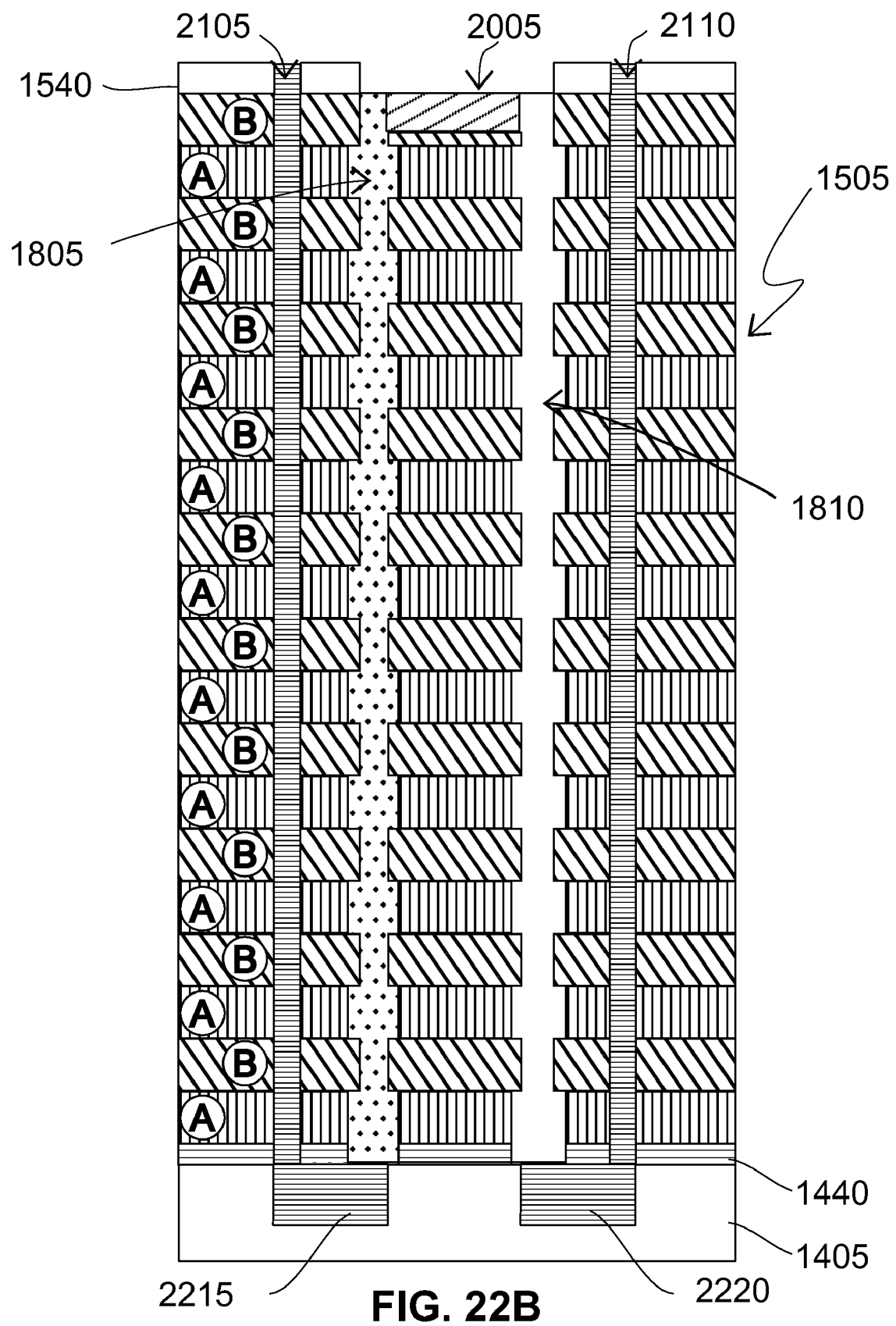

FIG. 22 (FIGS. 22A, 22B) illustrates the result of filling vias 2105, 2110 with conductive material such as polysilicon, tungsten, etc. to blocks 1430, 1435 (FIG. 22A). In an alternate embodiment, trenches 2115, 2120 are filled by the same process as that of vias 2105, 2110 and with the same conductive material that fills vias 2105, 2110, forming conductive pads.

Figure 23:
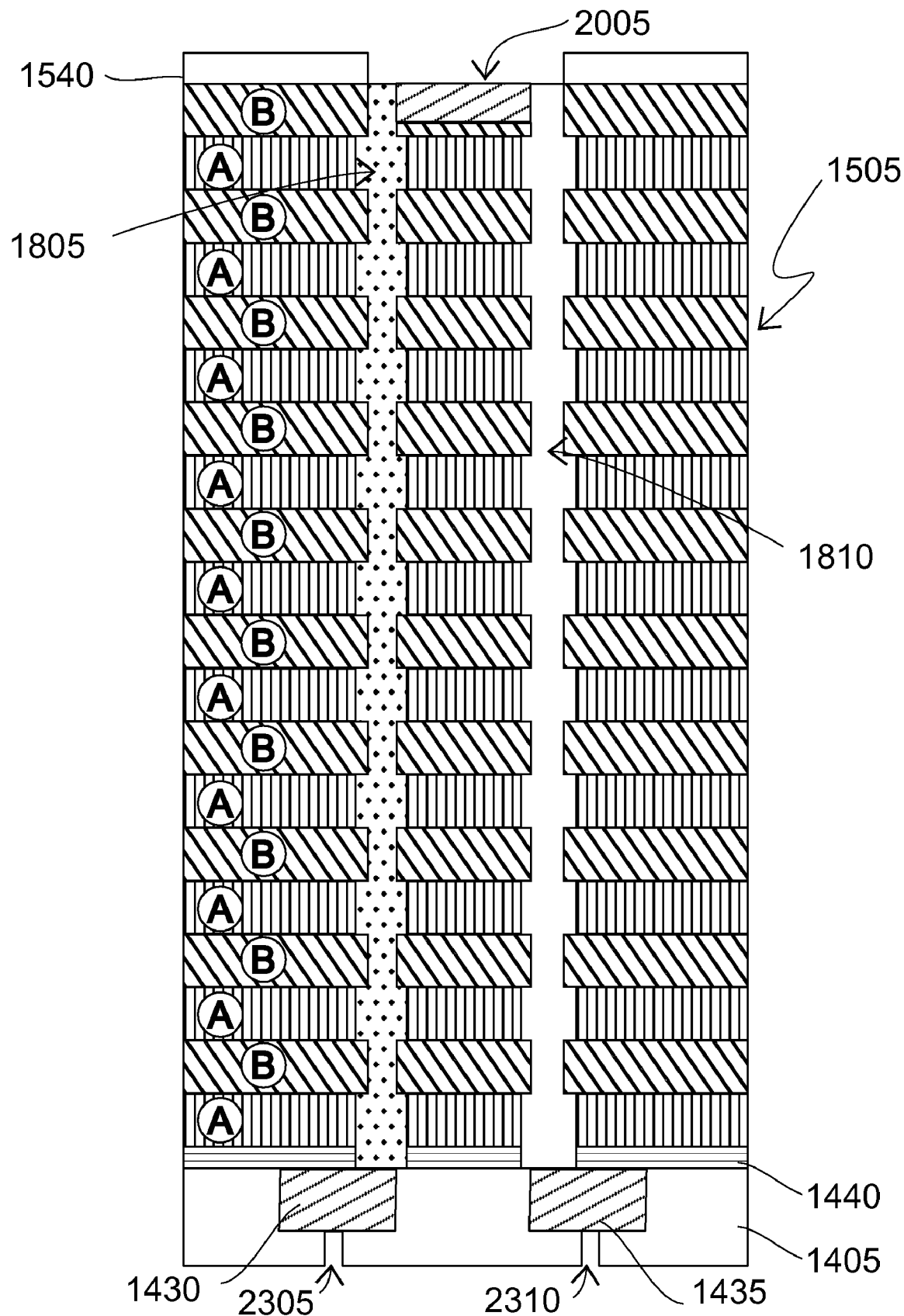
FIG. 23 is a diagram illustrating the formation of vias to the bottom of the conductor of FIG. 14, forming shorter conductive paths to the data track of the multi-layered magnetic shift register of FIG. 1.

The configuration of vias 2105, 2110 is presented as an example of the techniques for forming conductive connections to the data track 2005. In a further embodiment, conductors to blocks 1430, 1435 can be formed by etching vias 2305, 2310 through insulator 1405, as illustrated by FIG. 23. Filling vias 2305, 2310 with conductive material will electrically connect the data track 2005 via metallic vias through to the bottom of the insulator 1405, allowing connections to a device for example for creating current pulses to be delivered to the track 11.

Figure 24A:
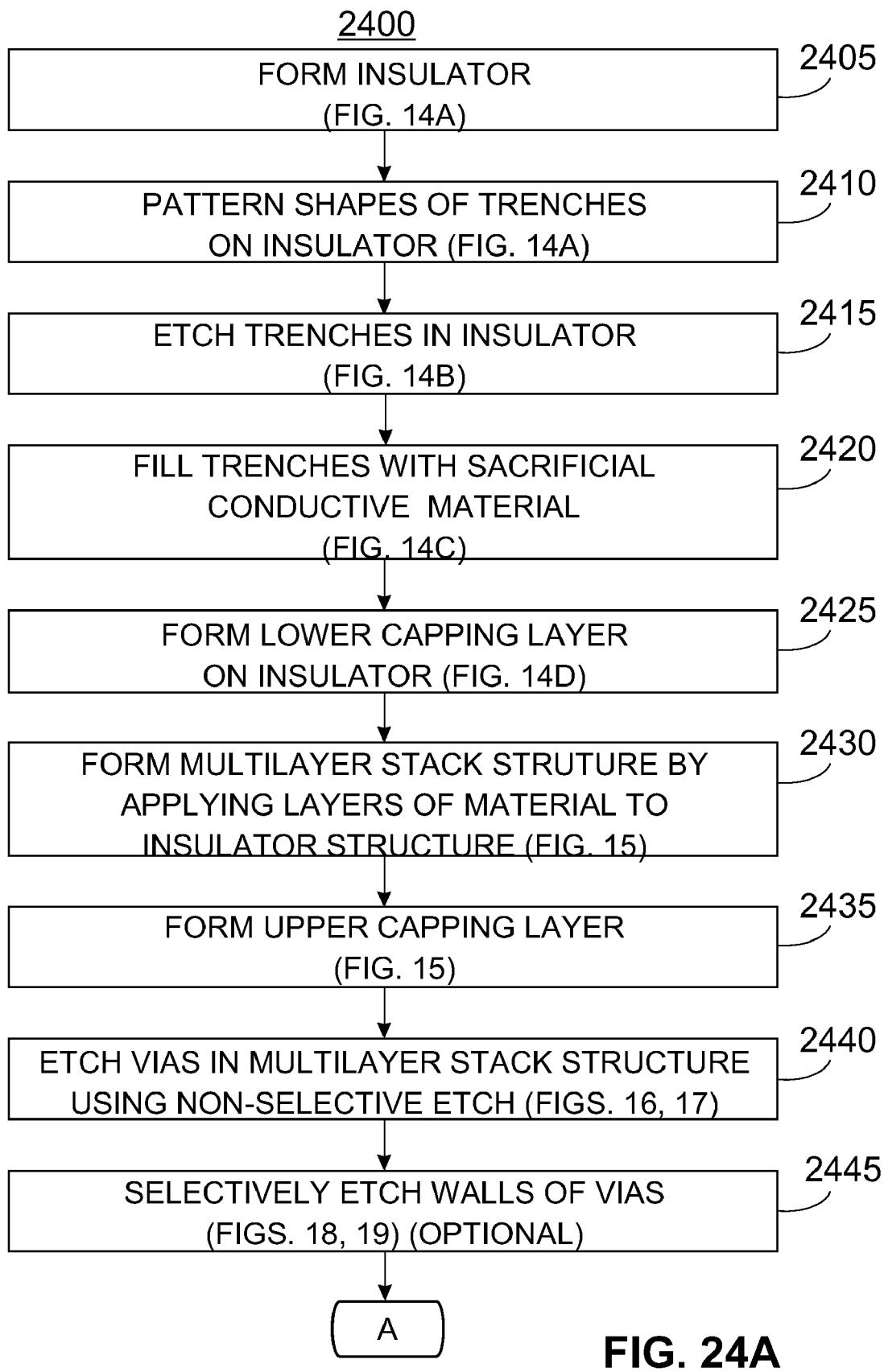
FIG. 24 is comprised of FIGS. 24A and 24B and represents a process flow chart illustrating a method of fabricating the data track of the multi-layered magnetic shift register of FIG. 1 with homogeneous magnetic material, illustrated by FIG. 23.
Figure 24B:
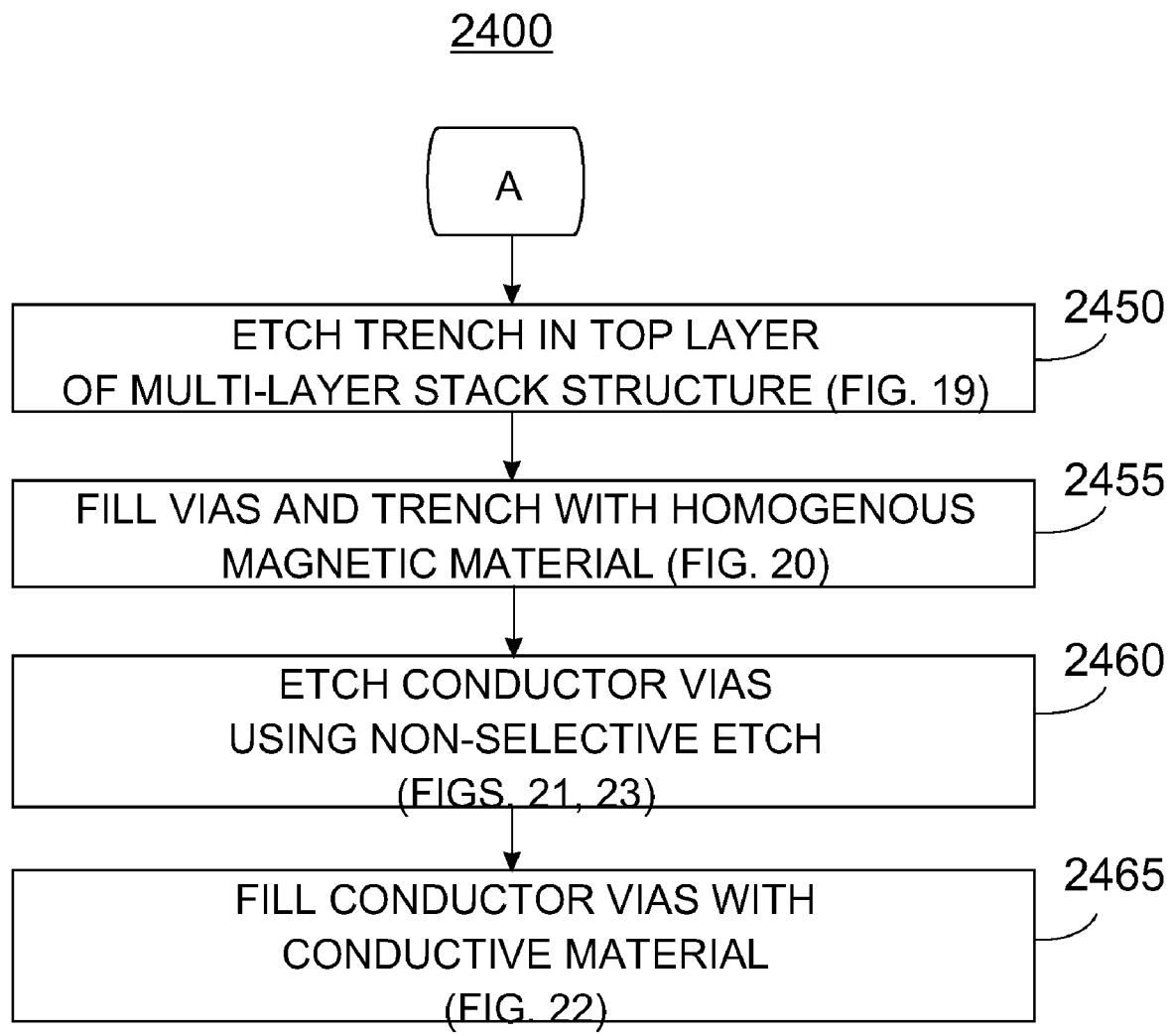

A method 2400 for fabricating a data track 2005 is illustrated by the process flow chart of FIG. 24 (FIGS. 24A, 24B). An insulator 1405 is formed at step 2405 (FIG. 14A). At step 2410, rectangles 1410, 1415 are patterned on insulator 1405 (FIG. 14A). Rectangles 1410, 1415 are etched at step 2415 to form trenches 1420, 1425 (FIG. 14B). Trenches 1420, 1425 are filled with a sacrificial dielectric or a conductive material at step 2420 (FIG. 14C) to form blocks 1430, 1435. A capping layer is then applied to the surface of the insulator 1405 in step 2425.

Multiple layers of alternating materials A and B are applied to the insulator 1405 in step 2430, forming the multi-layer stack structure 1505 (FIG. 15). The multi-layer stack structure 1505 can comprise, for example, approximately 100 layers of alternating materials A and B for a total thickness, for example, of approximately 10 microns. The capping layer 1540 is formed on top of the multi-layer stack structure 1505 at step 2435. Vias 1605, 1610 are non-selectively etched through the multi-layer stack structure 1505 to blocks 1430, 1435 at step 2440 (FIGS. 16, 17).

An optional selective etching process can be used at step 2445 to selectively etch one material faster than the other in walls of vias 1605, 1610, forming notches and protuberances in the walls of vias 1605, 1610 (FIG. 18, 19).

Region 1905 is removed by etching at step 2450, creating a trench 1905, that connects via 1805 with via 1810 (FIG. 19). Vias 1805, 1810, and trench 1905 are filled with ferromagnetic or ferrimagnetic material at step 2455 (FIG. 20), forming data track 2005.

Vias 2105, 2110 are etched from the top of multi-layer stack structure 1505 to blocks 1430, 1435 at step 2460. If blocks 1430, 1435 are filled with sacrificial dielectric material, the sacrificial dielectric material is also etched away in step 2460 (FIG. 21), forming trenches 2115, 2120. Vias 2105, 2110 are filled with conductive material at step 2465, forming a current path through the data track 2005 (FIG. 22). If sacrificial dielectric material has been etched away from blocks 1430, 1435 at step 2460, step 2465 also fills trenches 2115, 2120, forming conductive pads 2215, 2220.

Figure 25A:
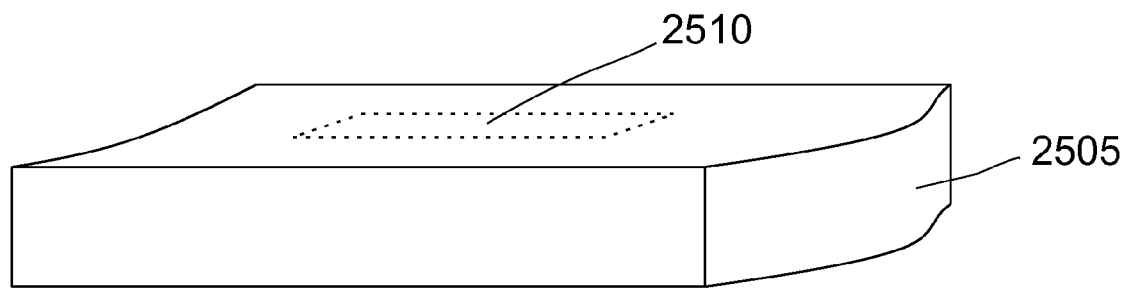
FIG. 25 is comprised of FIGS. 25A, 25B, and 25C and represents a diagram illustrating a formation of the region in the data track of FIG. 1 that connects the data region and the reservoir.
Figure 25B:
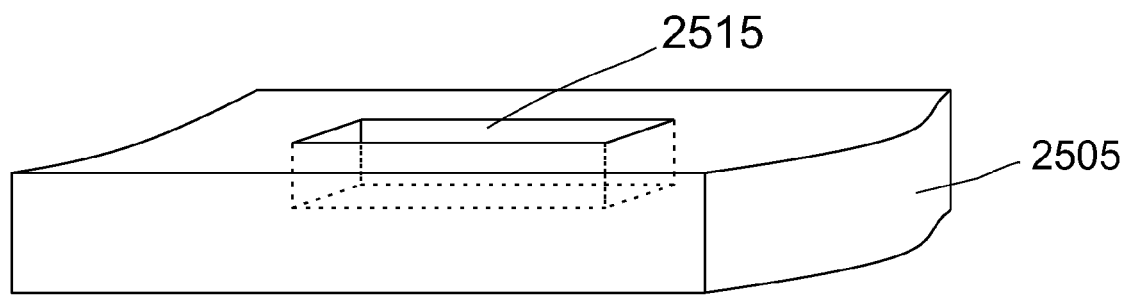
Figure 25C:
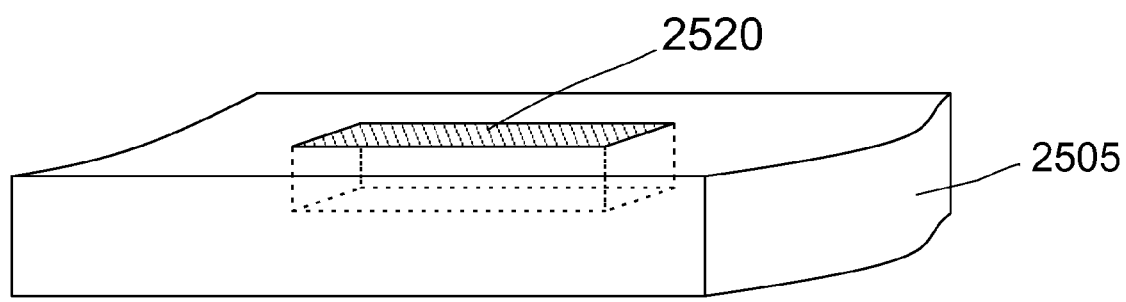

FIG. 25 (FIGS. 25A, 25B, 25C) illustrates an embodiment of the formation of the bottom of data track 11, central region 42. An insulator 2505 such as, for example, silicon nitride or silicon dioxide, is formed at a thickness of approximately 300 nm. Photoresist is applied to insulator 2505 and patterned in the form of a rectangle 2510. Using standard etching techniques, rectangle 2510 is etched to a depth of approximately 200 nm to form trench 2515. Reference is made to U.S. Pat. No. 6,051,504 for the process of silicon nitride etching and U.S. Pat. No. 5,811,357 for the process of silicon dioxide etching, which patents are incorporated herein by reference.

Trench 2515 is filled with a material in FIG. 25C to form block 2520. Block 2520 can comprise ferromagnetic or ferrimagnetic material, corresponding to central region 42 of data track 11. If block 2520 comprises ferromagnetic or ferrimagnetic material, block 2520 is planarized and polished. Exemplary ferromagnetic or ferrimagnetic materials used in block 2520 are permalloy, nickel iron, etc. Alternatively, block 2520 can comprise a sacrificial material that will later be etched away. The sacrificial material can be formed by low-pressure chemical vapor deposition and followed by chemical mechanical polishing for planarization. A thin layer of dielectric, for example, silicon nitride, is then deposited on top of insulator 2505, serving as a capping layer (not shown in FIG. 25). The thickness of the capping layer ranges between approximately 10 and 500 nm. The capping layer can be made of silicon nitride, silicon oxide, or any other suitable dielectric.

Figure 26:
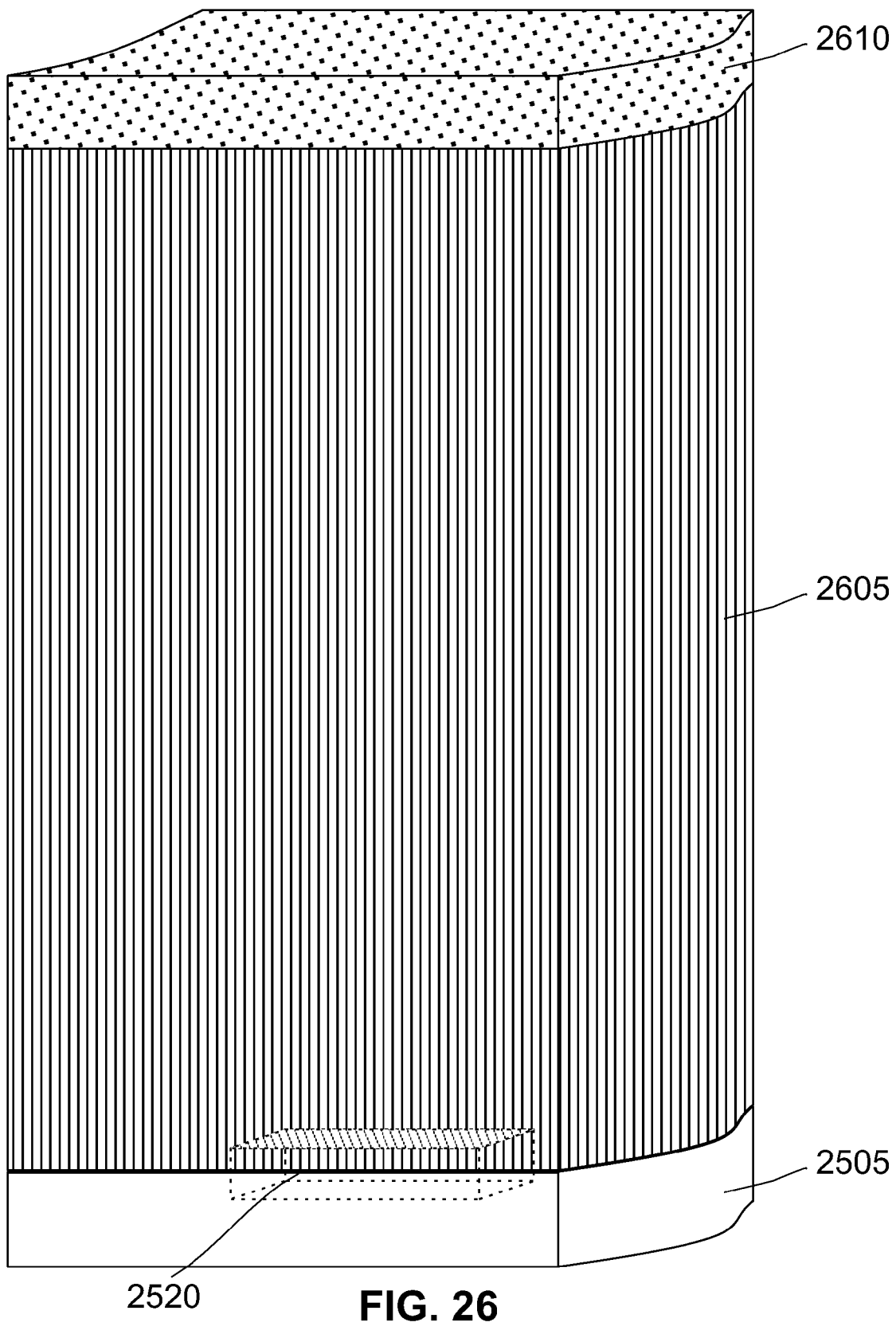
FIG. 26 is a diagram illustrating the fabrication of a uniform layer structure in which two vias can be formed for creating the data region and the reservoir of the data track of FIG. 1.

FIG. 26 illustrates the fabrication of a structure in which two vias can be formed, creating data region 35 and reservoir 40 of the data track 11. A uniform layer structure 2605 (also referenced herein as the uniform layer 2605) is formed with thickness, for example, of approximately 10 microns. Layer 2605 may be comprised of silicon or a dielectric material, for example, silicon dioxide or silicon nitride. A thin layer of dielectric, for example, silicon nitride, may be deposited on top of the uniform layer 2605, serving as a capping layer 2610, if the layer 2605 is formed from silicon to prevent oxidation of the surface of the silicon layer. The thickness of the capping layer 2610 can range, for example, between approximately 10 and 500 nm. The bottom capping layer 2610 can be made of silicon nitride, silicon oxide, or any other suitable dielectric.

Figure 27:
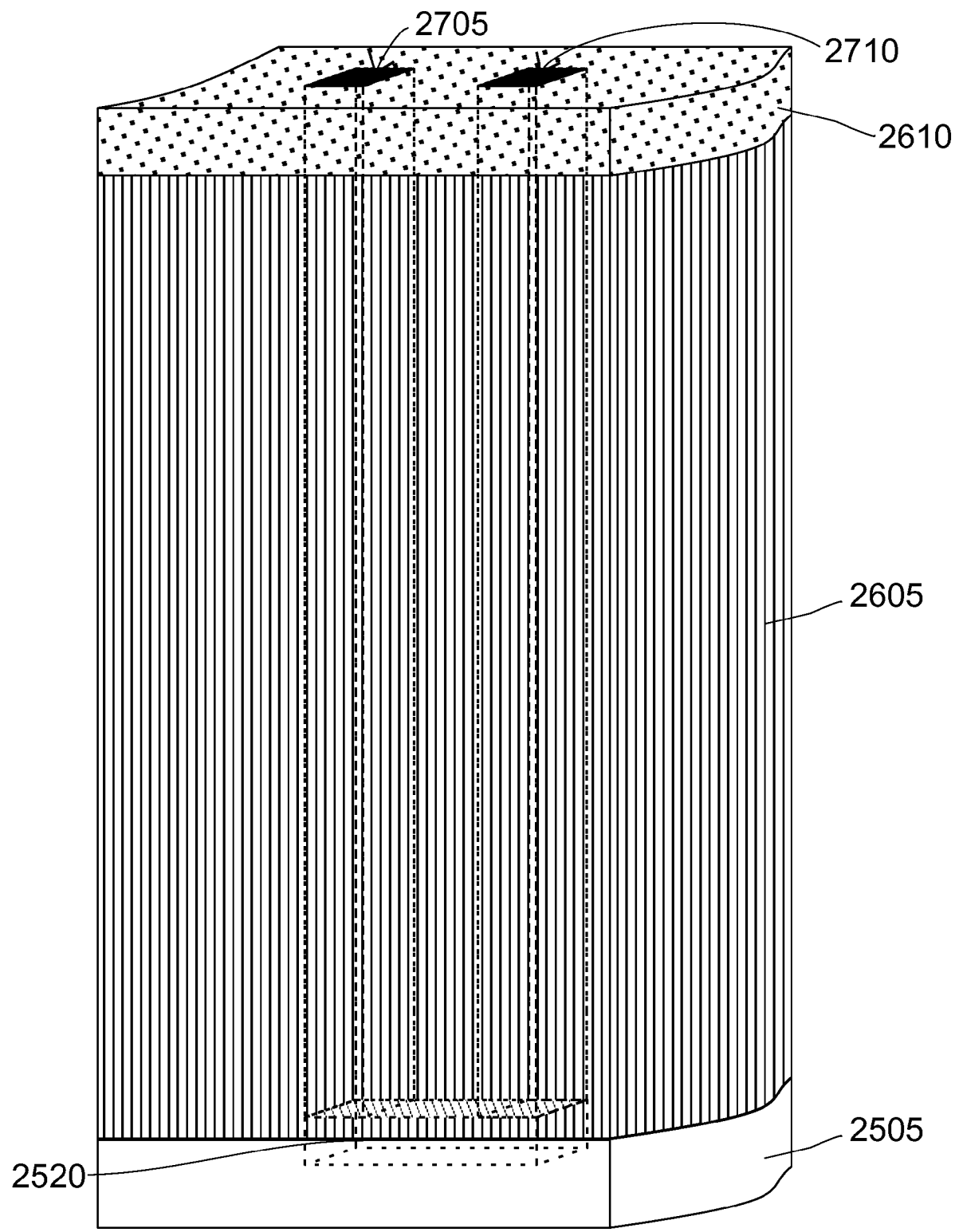
FIG. 27 is a diagram illustrating the formations of vias in a uniform layer structure for the data region and reservoir of the data track of FIG. 1.

FIG. 27 illustrates the formation of vias 2705, 2710 in the uniform layer 2605. Vias 2705, 2710 can be filled with ferromagnetic or ferrimagnetic material to form data region 35 and reservoir 40 of the data track 11. In an embodiment utilizing silicon as the uniform layer 2605, the sidewalls of vias 2705, 2710 are oxidized to form a thin insulator layer of silicon dioxide (with a thickness ranging between approximately 3 nm and 30 nm).

Figure 28:
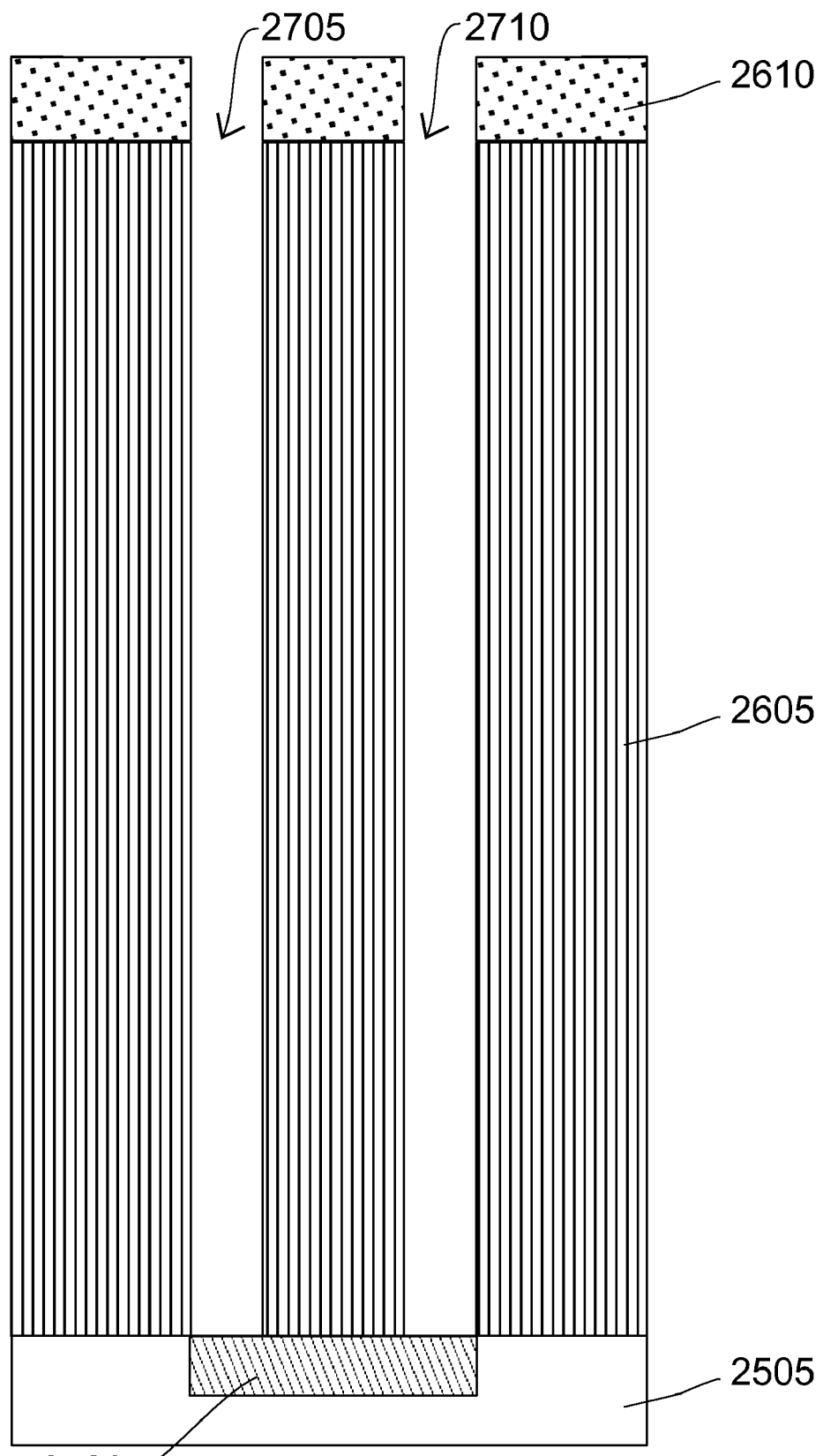
FIG. 28 is a diagram illustrating the cross-section of the uniform layer structure and vias of FIG. 27.

As illustrated by the cross-sectional view of FIG. 28, vias 2705, 2710 are etched through the uniform layer 2605 to block 2520 in insulator 2505. Vias 2705, 2710 are formed with planar smooth walls. In the case of uniform layer 2605 being silicon, the sidewalls of vias 2705, 2710 are oxidized to form a thin insulator layer of silicon dioxide (with a thickness ranging between approximately 3 nm and 30 nm). Formation of the vias 2705, 2710 is followed by etching the capping layer 2610 to open the contact to the bottom section of homogeneous ferromagnetic or ferrimagnetic material, block 2520. Capping layer 2610 is resistant to oxidation similar to insulator 2505. If block 2520 is comprised of a metal such as a ferromagnetic or ferrimagnetic material, the etching material will not substantially etch into the material of block 2520.

Figure 29A:
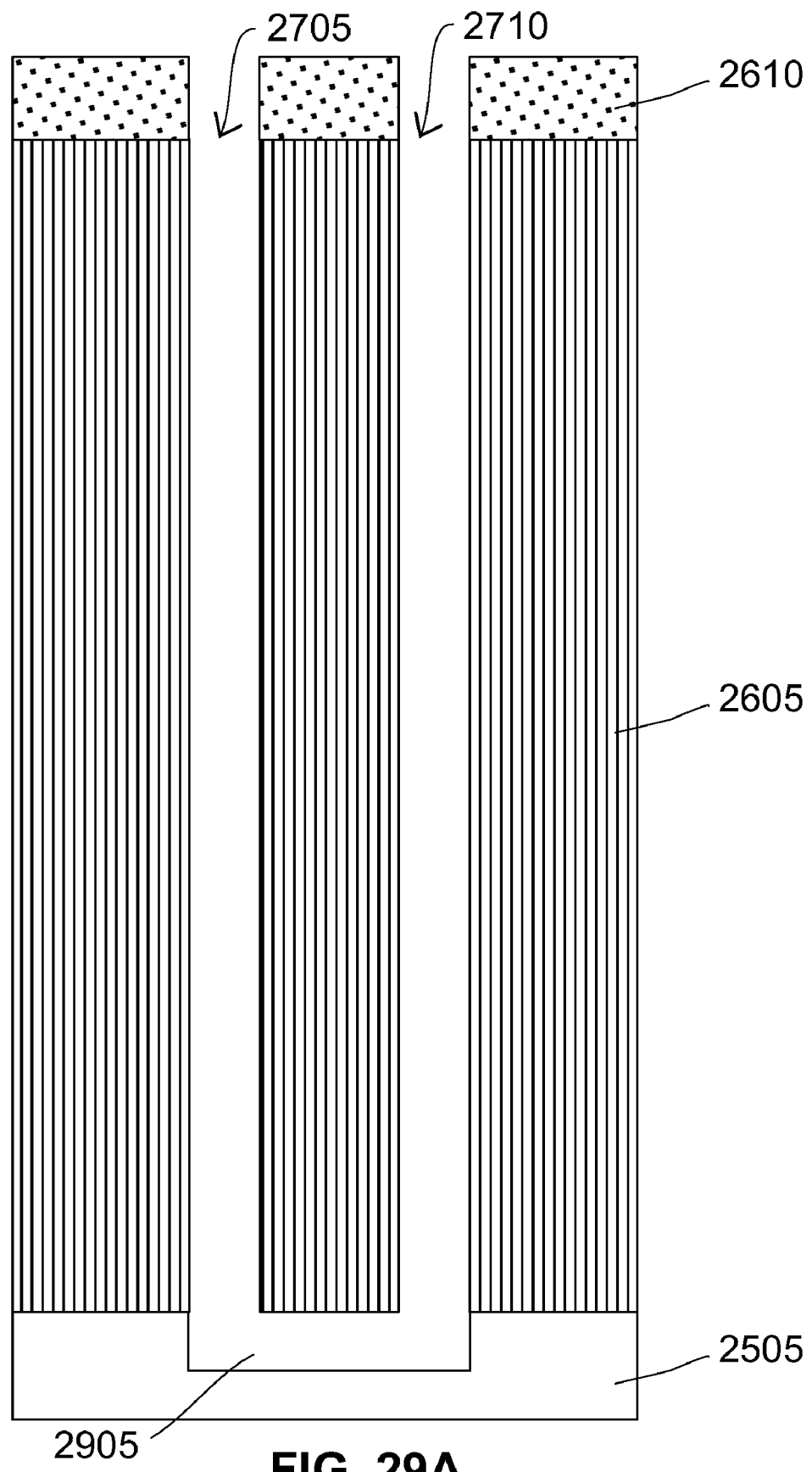
FIG. 29 is comprised of FIGS. 29A and 29B and represents a diagram illustrating a cross-section of the vias of FIG. 27 and a trench connecting the two vias.
Figure 29B:
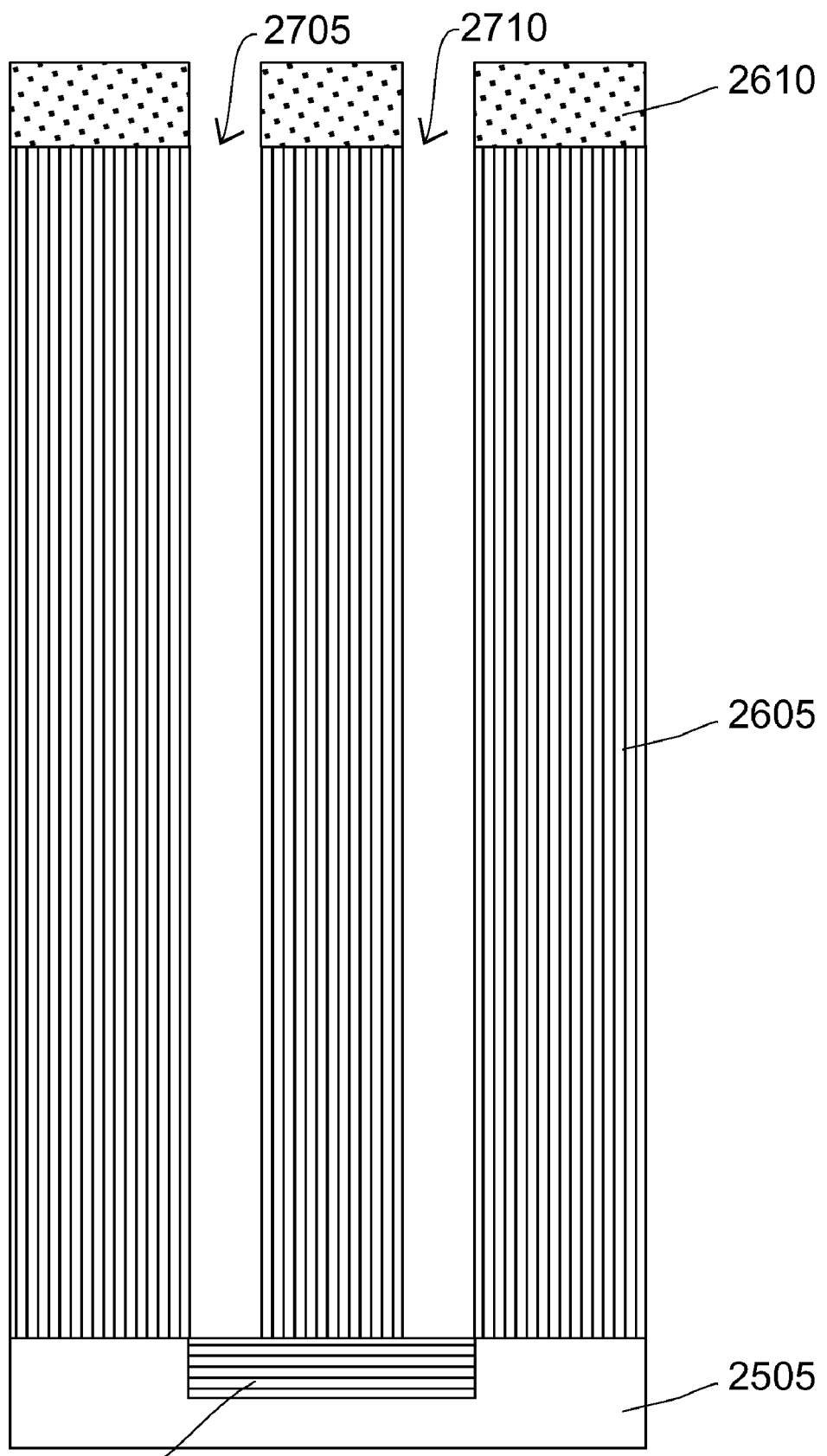

FIG. 29 (FIGS. 29A, 29B) illustrates a cross-section of a form for the data track 11 comprising vias 2705, 2710 (etched in the uniform layer 2605) and trench 2905. To produce the trench 2905, block 2520 is filled with a sacrificial dielectric material (FIG. 25). This material is etched away when vias 2705, 2710 are formed. In an alternate embodiment shown in FIG. 29B, block 2910 is comprised of ferromagnetic or ferrimagnetic material that remains after via 2705, 2710 are created.

Figure 30:
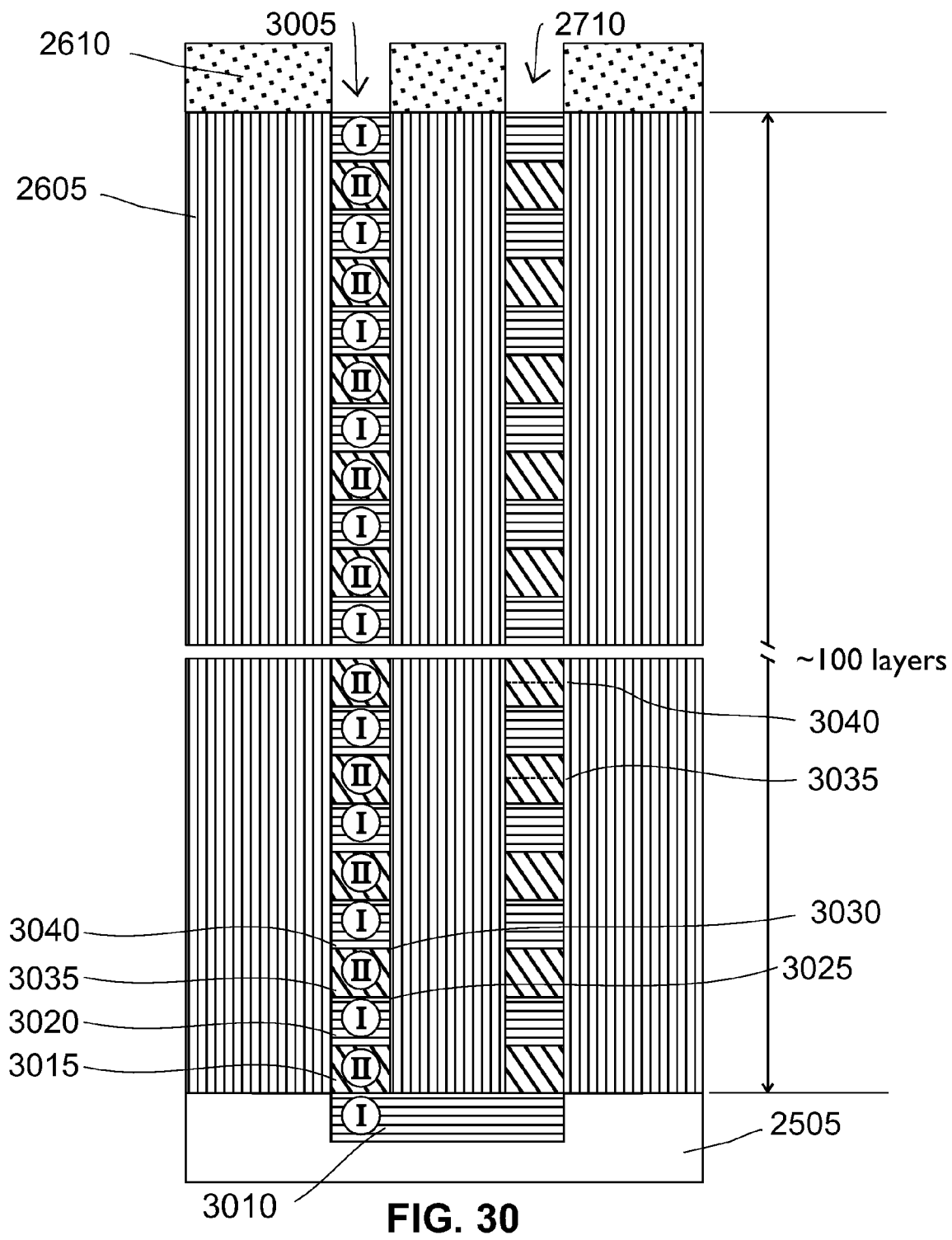
FIG. 30 is a diagram illustrating the result of filling the vias of FIG. 27 with alternating magnetic materials to fabricate the data track of FIG. 1.

FIG. 30 illustrates a track 3005 created by filling vias 2705, 2710, and trench 2905 (FIG. 29) with alternate layers of different types of ferromagnetic or ferrimagnetic material. Vias 2705, 2710 and trench 2905 can be filled by various methods, for example, electroless plating or electroplating. Reference is made to U.S. Pat. No. 3,702,263 for the process of electroless plating and to U.S. Pat. No. 4,315,985 for the process of electroplating, which patents are incorporated herein by reference. Trench 2905 is filled with one magnetic material, material I, creating block 3010. Block 3010 corresponds to central region 42 of the data track 11.

Magnetic material II is then deposited in a layer on block 3010, forming layer 3015. Magnetic material I is then deposited on layer 3015, forming layer 3020. Magnetic material I and magnetic material II are alternately deposited into the vias to form alternating layers for a total, for example, of approximately 100 layers. The thickness of each layer such as layers 3015, 3020 can be, for example, between approximately 50 to 500 nm thick. The alternating ferromagnetic or ferrimagnetic layers 3015, 3020 are comprised of magnetic materials with different magnetic properties including magnetization and/or magnetic exchange and/or magnetic anisotropies. These different magnetic characteristics allow the pinning of magnetic domain walls at the boundaries between these layers or within the layers themselves.

Alternatively, block 2520 can comprise a material such as ferromagnetic or ferrimagnetic material before vias 2705, 2710 are filled. The metal of block 2520 can be used as an electrode for the electroplating process. The magnetic material of block 2520 may or may not be the same as that used to fill vias 2705, 2710.

Domain walls 3025, 3030 can occur at the interfaces between alternating magnetic layers. The alternating ferromagnetic or ferrimagnetic layers 3020, 3035 are comprised of magnetic materials with different magnetization or magnetic exchange or magnetic anisotropies. These different magnetic characteristics allow the pinning of magnetic domain walls at the boundary 3025 between layers 3020, 3035. For example, domain wall 3025 occurs between layer 3020 and layer 3035. Domain wall 3030 occurs between layer 3035 and 3040.

In an alternate embodiment, domain walls 3045, 3050 can occur within each layer of one of the magnetic materials, for example, magnetic material II. The ability to form layers with domain walls inside the magnetic material depends on the properties of the ferromagnetic or ferrimagnetic material. Placement of the domain walls within the data track 11 can be optimized by design through selection of the magnetic materials used for magnetic material I and magnetic material II.

Figure 31A:
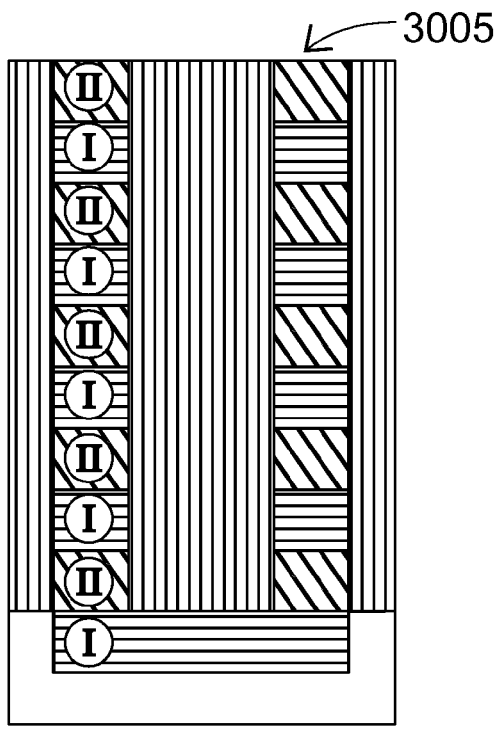
FIG. 31 is comprised of FIGS. 31A, 31B, and 31C and represents a diagram illustrating the fabrication of the data track of FIG. 1 using alternating layers of magnetic material of alternating thicknesses.
Figure 31B:
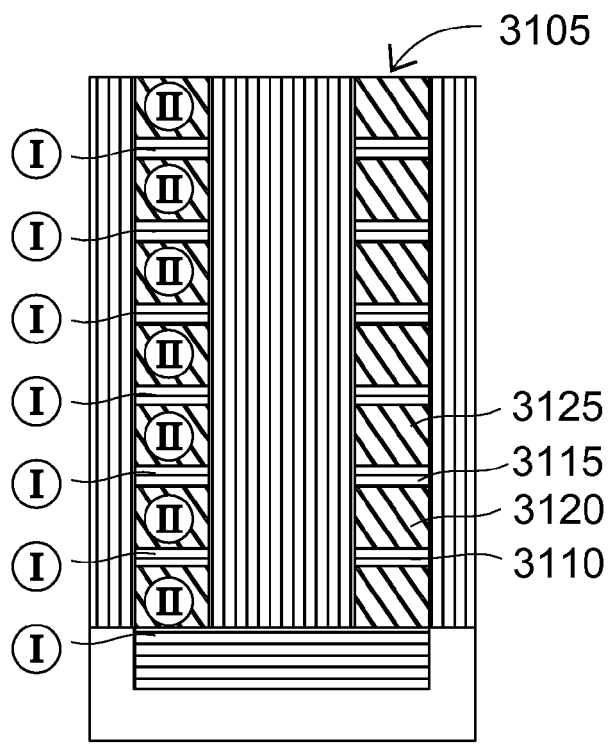
Figure 31C:
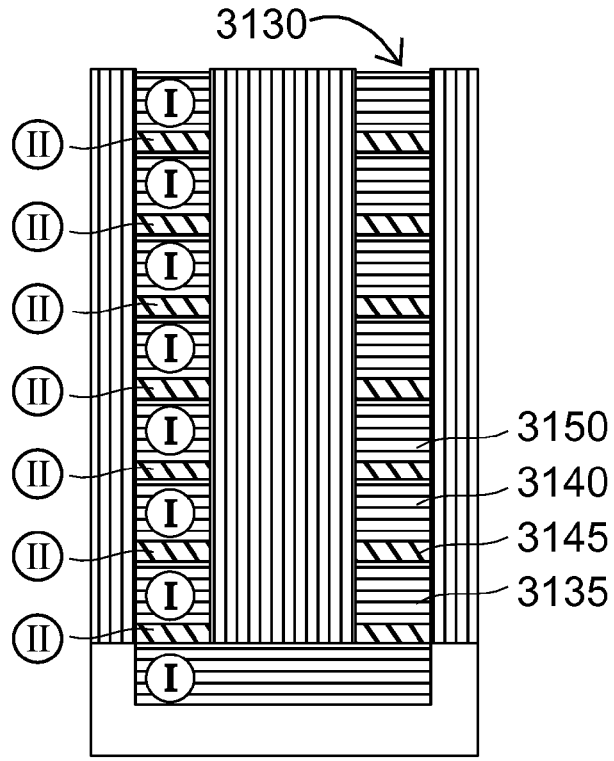

The thicknesses of the layers of magnetic material can vary, as illustrated by FIG. 31 (FIGS. 31A, 31B, 31C). For ease of illustration, capping layer is not shown in FIG. 31 (FIGS. 31A, 31B, 31C). FIG. 31A illustrates a data track 3005 comprised of magnetic layers of equal thickness. FIG. 31B illustrates a data track 3105 comprised of magnetic layers of unequal thickness. In FIG. 31B, layers of magnetic material I (represented by layers 3110, 3115) are thin. Layers of magnetic material II (represented by layers 3120, 3125) are thick. In FIG. 31C, data track 3130 is also comprised of magnetic layers of unequal thickness. In FIG. 31C, layers of magnetic material I (represented by layers 3135, 3140) are thick. Layers of magnetic material II (represented by layers 3145, 3150) are thin.

Figure 32:
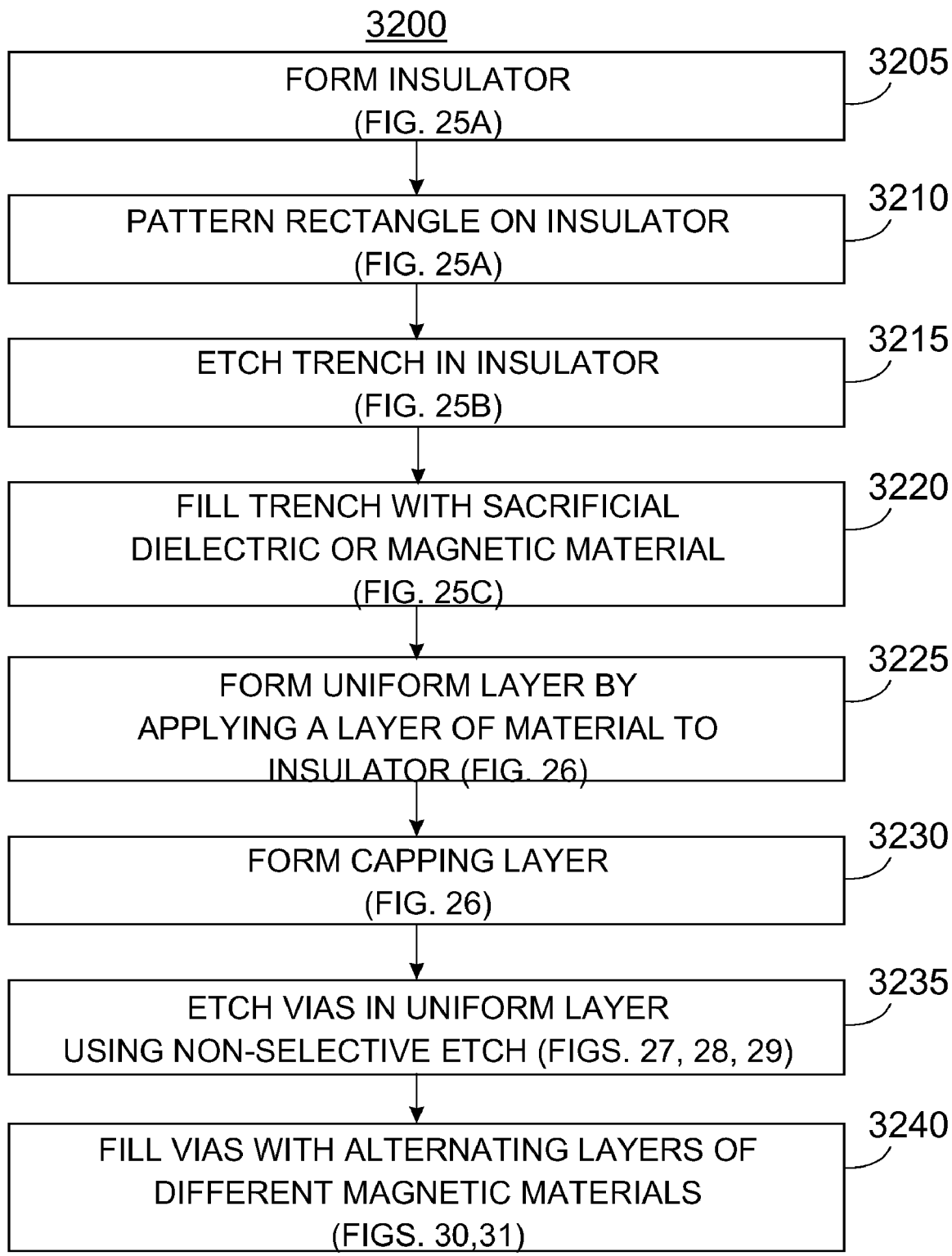
FIG. 32 is a process flow chart illustrating a method of fabricating the data track of the magnetic shift of FIG. 1 using alternating layers of magnetic material.

FIG. 32 illustrates a method 3200 of fabricating a data track 3005 comprised of layers of different ferromagnetic or ferrimagnetic material. An insulator 2505 is formed at step 3205 (FIG. 25A). At step 3210, a rectangle 2510 is patterned on insulator 2505 (FIG. 25A). Rectangle 2510 is etched at step 3215 to form trench 2515 (FIG. 25B). Trench 2515 is filled with a sacrificial dielectric, ferromagnetic material, or ferrimagnetic material at step 3220 (FIG. 25C), creating block 2520. A uniform layer 2605 is applied to the insulator in step 3225 (FIG. 26). The uniform layer 2605 can have a thickness, for example, of approximately 10 microns. The capping layer 2610 is formed on top of the uniform layer 2605 at step 3230 (FIG. 26). A capping layer may also be applied to the top of layer 2505 after the block 2520 has been completed.

Vias 2705, 2710 are etched through the uniform layer 2605 to block 2520 at step 3235 (FIGS. 27, 28, 29) using a non-selective etching process. If block 2520 is filled with sacrificial dielectric material, the sacrificial dielectric material is also etched away in step 3235 (FIG. 29).

Vias 2705, 2710 are filled with alternating magnetic layers of different types of ferromagnetic or ferrimagnetic material at step 3240 (FIG. 30), forming the data track 3005. The thicknesses of layers of magnetic material in track 3005 can be varied (FIG. 31).

The process of creating track 11 using method 3200 is similar to the process of fabricating track 11 using method 1300, with the exception that multiple layers of magnetic material are used. Similarly, a track 11 can be fabricated using method 3200. In this embodiment, a uniform dielectric material replaces multi-layer stack structure 1505 and data track 2005 is filled with alternate layers of magnetic material are rather than a uniform magnetic material.

Figure 33:
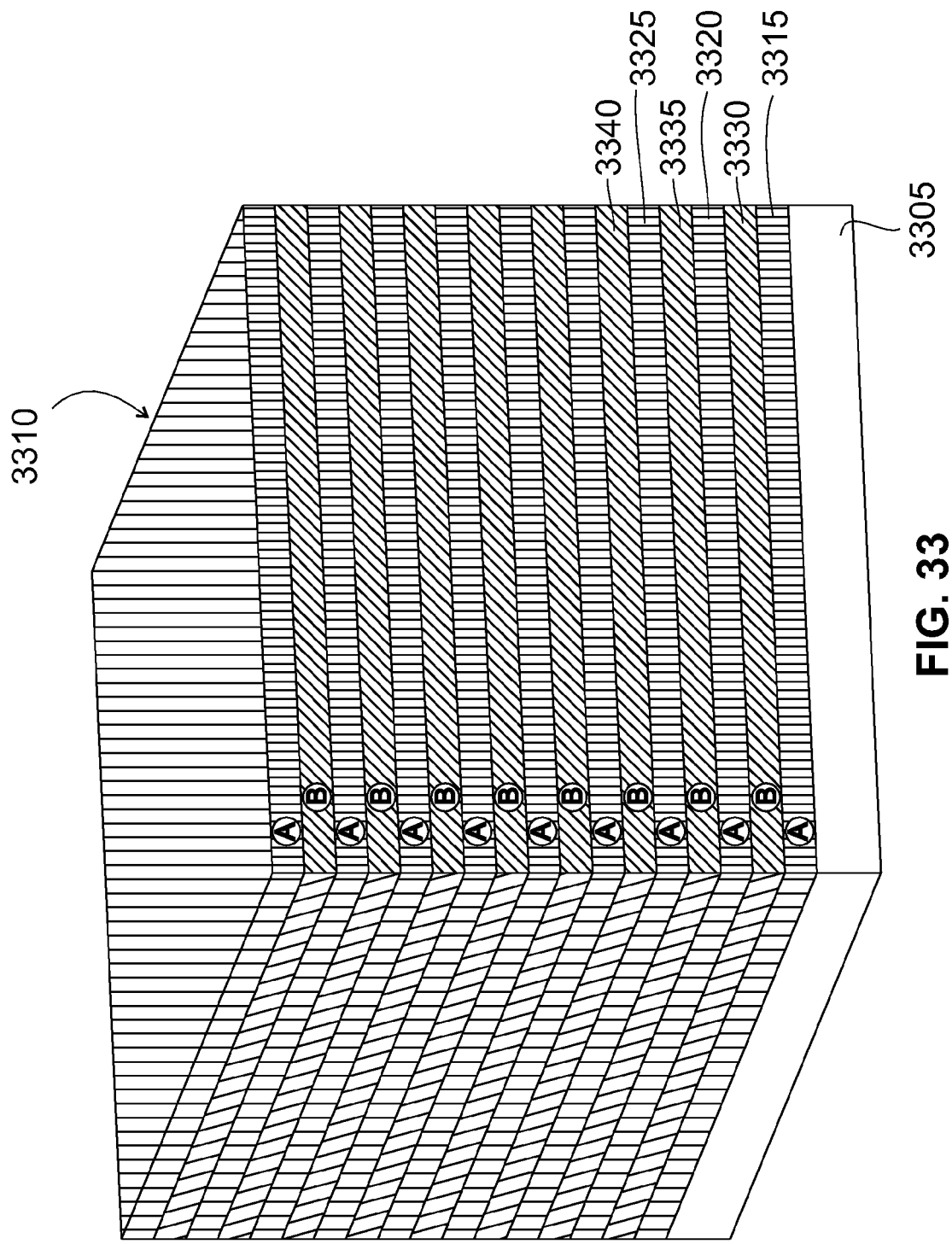
FIG. 33 is a diagram illustrating the formation of a substrate and multi-layer dielectric structure for forming multiple parallel data tracks of the multi-layered magnetic shift register of FIG.1.

As illustrated by FIG. 33, a substrate 3305 is formed. A multi-layer stack structure 3310 is formed of alternating silicon/dielectric or dielectric/dielectric materials (referred to as materials A and B). ). The materials A and B are chosen for their etching properties. In a preferred embodiment, material A is comprised of silicon dioxide ($SiO_2$) and material B is comprised of silicon (Si). Alternatively, material A comprises silicon dioxide while material B comprises silicon nitride ($Si_3N_4$).

In the example of FIG. 33, a first set of layers such as layers 3315, 3320, 3325 are formed of material A, for example, silicon dioxide. A second set of layers such as layers 3330, 3335, 3340 are formed of a material B, for example, silicon or silicon nitride. The first and second set of layers can be formed using various techniques. For example, polycrystalline silicon layers may be formed using low-pressure chemical vapor deposition or amorphous silicon layers may be formed by sputter deposition.

Material A and material B can be selected with different etch rates, allowing the formation of notches or protuberances in the walls of the vias. While shown of equal thickness in FIG. 33, layers formed of material A and material B can have different thickness. The thicknesses of the layers formed from materials A and B can range from as little as 5 nm or less to as much as several microns. Preferably one material will be thinner than the other where the thinner material is used to form the notch or protuberance where the domain walls will preferably reside. The other material forms the spacing between the domain walls and is sufficiently thick that neighboring domain walls do not significantly interact. Preferably one material has a thickness of about 5 to 10 nm and the other has a thickness in the range from 100 to 1000 nm or, more preferably, one material has a thickness of 8-10 nm and the other material has a thickness or 100 to 1000 nm.

Figure 34:
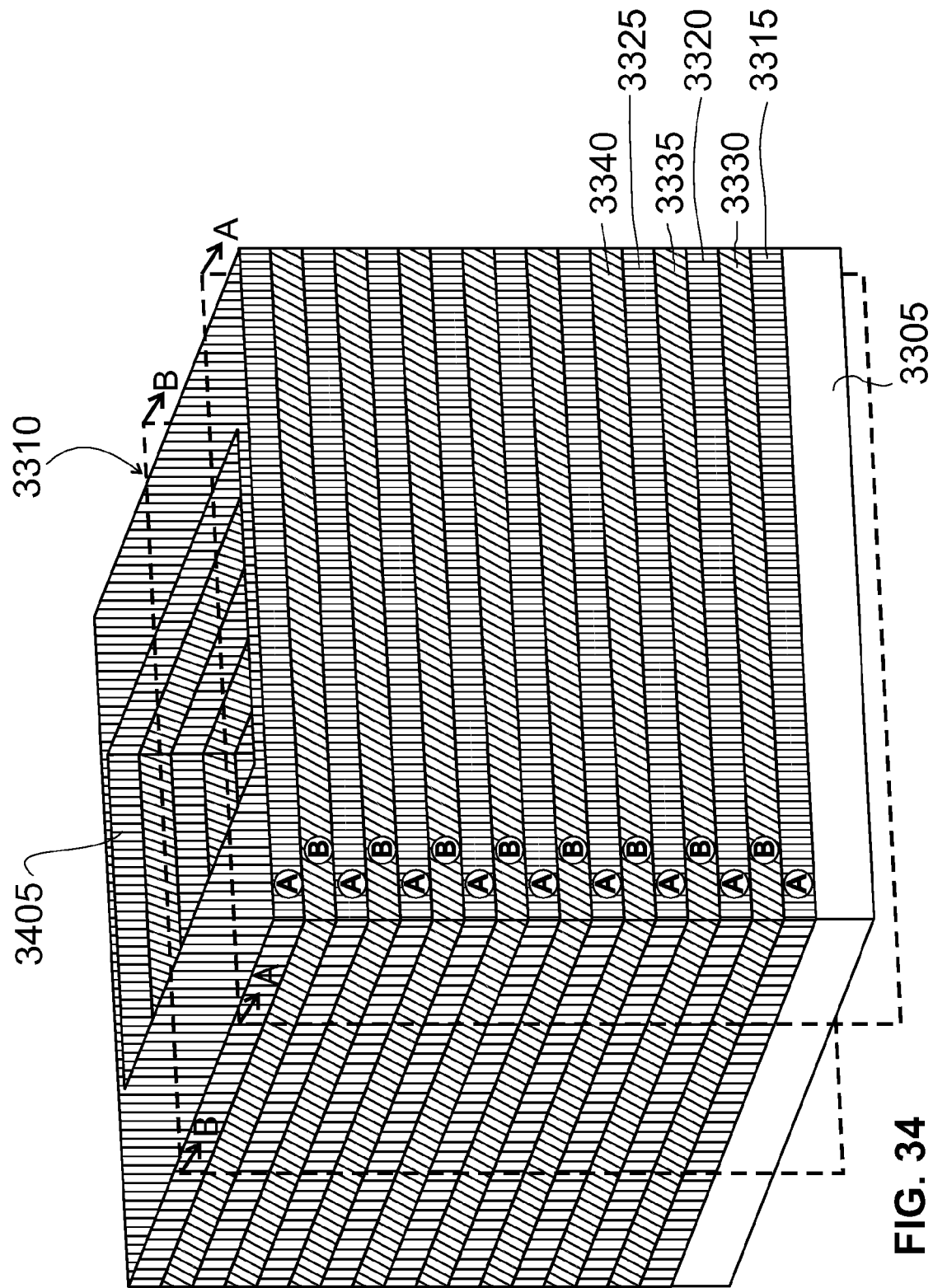
FIG. 34 is a diagram illustrating a trench etched in the dielectric structure of FIG. 33.

As illustrated by FIG. 34, a trench 3405 is non-selectively etched through the multi-layer stack structure 3310 (FIG. 33) to substrate 3305. A planar smooth wall is formed by the process of non-selectively etching the via. In an embodiment in which material B (i.e., layers 3330, 3335, 3340) is comprised of silicon, corrugated walls in the trench 3405 may be formed by alternating the dry etching process between a process which is selective for silicon as compared to silicon dioxide and a process which is selective for silicon dioxide as compared to silicon. The term "selective" is used to indicate that the etchant etches the first material faster than the second material. In other words, in the dry etching process for silicon selective to silicon dioxide, silicon is etched at a faster rate than silicon dioxide in order to gain better etching control. Reference is made to U.S. Pat. Nos. 6,544,838 and 6,284,666 for more details on the dry etching process for silicon selective to silicon dioxide, which patents are incorporated herein by reference. Reference is made to U.S. Pat. Nos. 6,294,102 and 5,811,357 for more details on the dry etching process for silicon dioxide selective to silicon, which patents are incorporated herein by reference. In another example trench 3405 may also be formed by alternating the dry etching process for silicon nitride selective to silicon oxide (U.S. Pat. Nos. 6,461,529, 6,051,054) and for silicon dioxide selective to silicon nitride (U.S. Pat. Nos. 6,294,102, 5,928,967).

Figure 35:
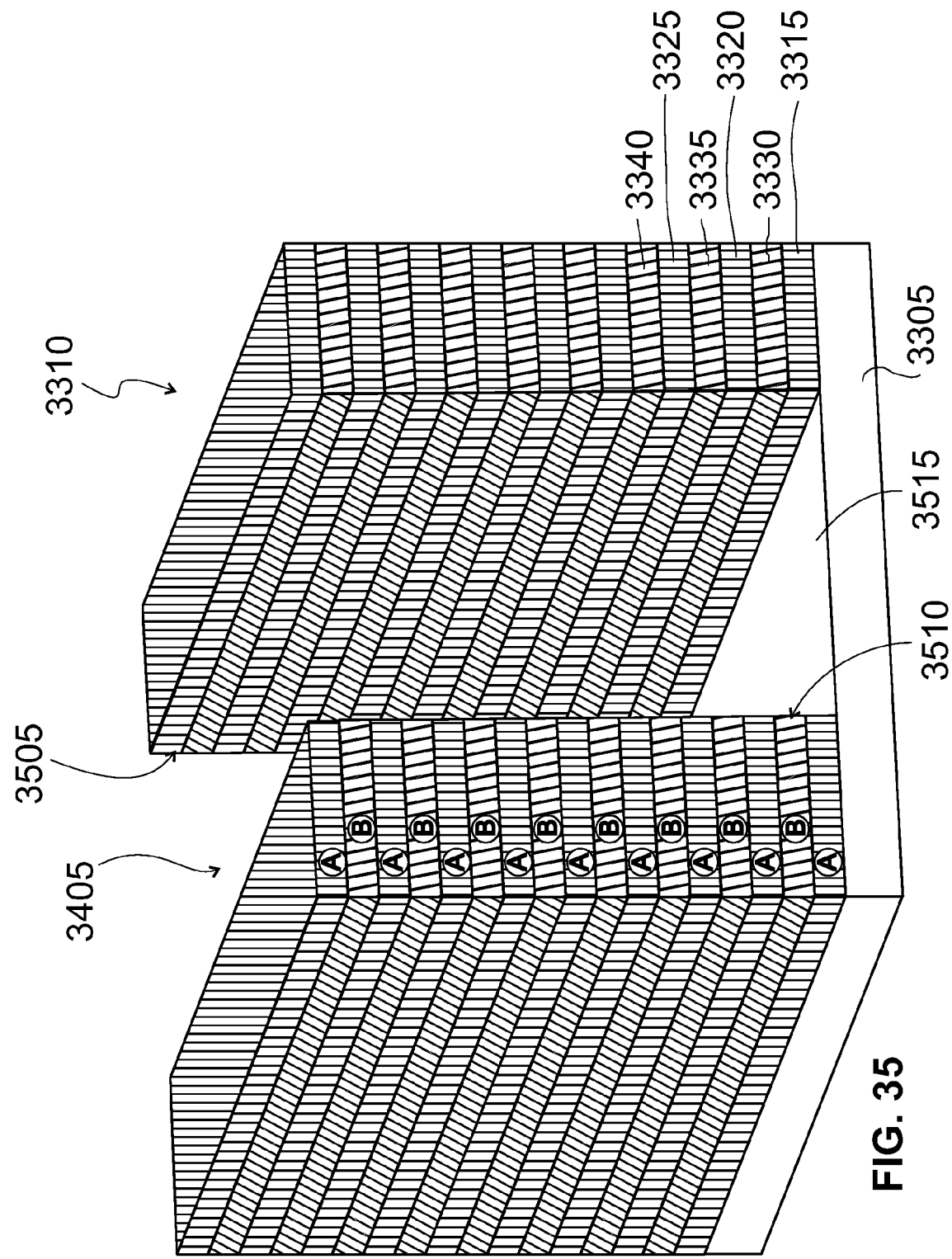
FIG. 35 is a diagram illustrating the cross-section of the trench etched in FIG. 34.

FIG. 35 illustrates a section AA-BB of the trench 3405 and stack structure 3310 of FIG. 34, exposing an interior of the trench 3405 and showing trench walls 3505, 3510 and trench floor 3515. Regular variations in the surface of the trench walls 3505, 3510 may be formed by using a selective etching process, as described previously, illustrated by FIG. 36.

The multi-layer stack structure 3310 can comprise, for example, approximately 100 layers of alternating layers of material A and material B for a total thickness, for example, of approximately 5 to 10 microns or more. The thicknesses of the material A and material B that form, for example, layers 3605, 3610, and 3615, and 3620, 3625, and 3630, respectively may correspond to domain wall separations in data region 47 or reservoir 40 of the data track 11.

Material A or material B is selectively etched to form notches or protuberances in wall 3505 and wall 3510. Wall 3505 and wall 3510 appear corrugated after the selective etching process. The thickness of one material represented, for example, by material A, can correspond to the separation between domain walls in the data track 11. The other material represented, for example, by material B, will form the notches or protuberances in data region 47 or reservoir 40 of the of the data track 11. Such a configuration for data track 11 is illustrated by FIG. 5. Although the layers A and layers B represented by layers 3605, 3610, and 3615, and 3620, 3625, and 3630 are shown of equal thicknesses, in practice they can be of very different thicknesses. The width of each notch or protuberance can range between approximately 5 nm and 100 nm.

Figure 36:
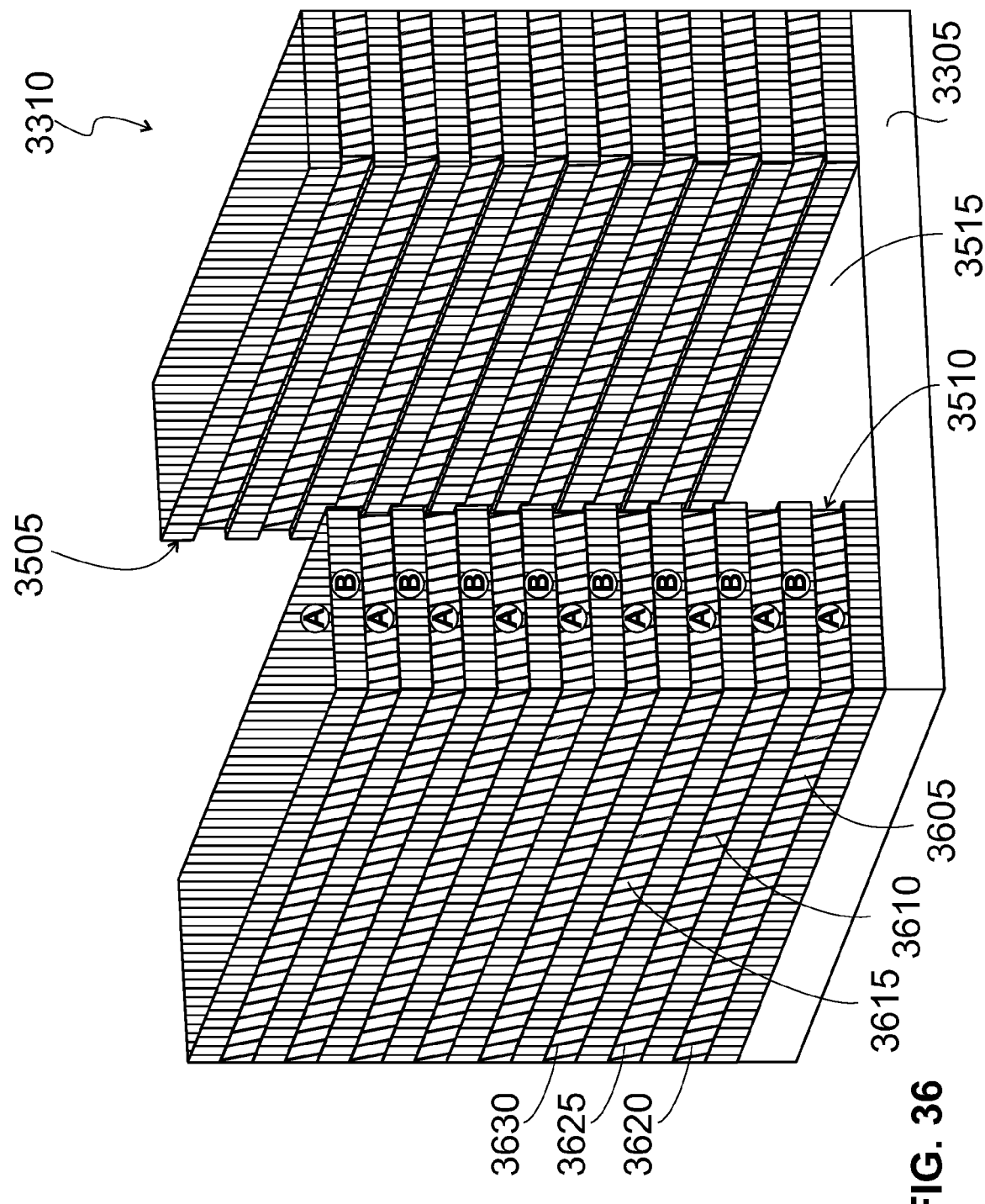
FIG. 36 is a diagram illustrating the result of selective etching of the trench of FIG. 34 to form trench walls with regular variations in cross-section.

FIG. 36 illustrates the effect of using a selective wet etching process after trench 3405 is formed. By using a selective wet etching process, material A and material B can be etched at different rates. As an example, a hydrofluoric acid (HF) based chemical (for example, buffered or diluted HF) can be used for wet-etching silicon dioxide selective to both silicon oxide and silicon nitride, and a phosphoric acid $H_3PO_4$ based chemical can be used for wet-etching silicon nitride selective to silicon dioxide.

Although the dielectric layers such as layers 3605, 3610, 3615, 3620, 3625, 3630 are shown of equal thicknesses in FIG. 36, in practice they may be of different thicknesses. The thickness of one dielectric represented, for example, by dielectric A, may correspond to the separation between domain walls in the data track 11. The other dielectric represented, for example, by dielectric B, will form the notches or protuberances in data region 47 or reservoir 40 of the data track 11. Such a configuration for the data track 11 is illustrated by FIG. 5.

Figure 37:
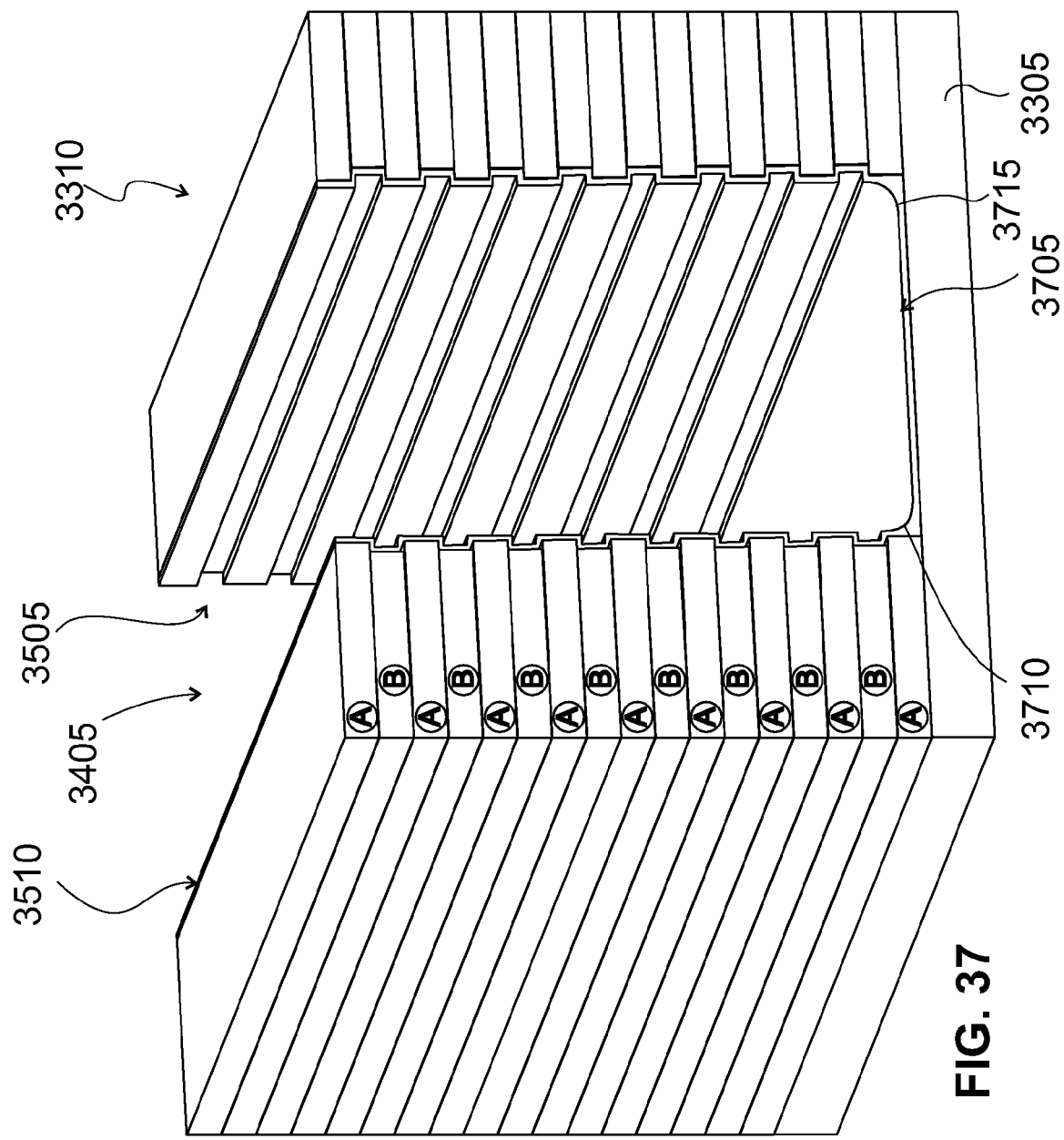
FIG. 37 is a diagram illustrating the result of covering the surface of the walls and bottom of the trench of FIG. 34 with a seed layer.

Exposed surfaces of trench 3405 comprising walls 3505, 3510 and bottom 3515 are covered with a seed layer 3705 in FIG. 37. The seed layer 3705 forms a conducting layer for electroplating the walls 3505, 3510 and the bottom of the trench 3515 with magnetic material for the data track 11. The seed layer 3705 further forms a diffusion barrier for the dielectric materials of the multi-layer stack structure 3310, preventing reaction between the dielectric materials and the magnetic material of the data track 11. The seed layer 3705 is applied to the walls 3505, 3510 and bottom 3515 of trench 3405 using, for example, chemical vapor deposition of titanium nitride (TiN), tantalum nitride (TaN), or tungsten nitride (WN).

Chemical vapor deposition allows the seed layer 3705 to conformally cover walls 3505, 3510, and bottom 3515 of trench 3405 to form a contiguous layer. Conformally covering the corrugations in walls 3505, 3510 of trench 3405 allows notches and protuberances to form in the magnetic material of data track 11 that is electroplated onto the seed layer. Chemical vapor deposition further provides a rounded corner 3710 where wall 3505 joins bottom 3515 and rounded corner 3715 where wall 3510 joins bottom 3515. Rounded corner 3710 and rounded corner 3715 provided a rounded edge to the data track 11, aiding movement of domain walls through the data track 11. The thickness of the seed layer 3705 can range between approximately 10 Å to 200 Å.

Figure 38:
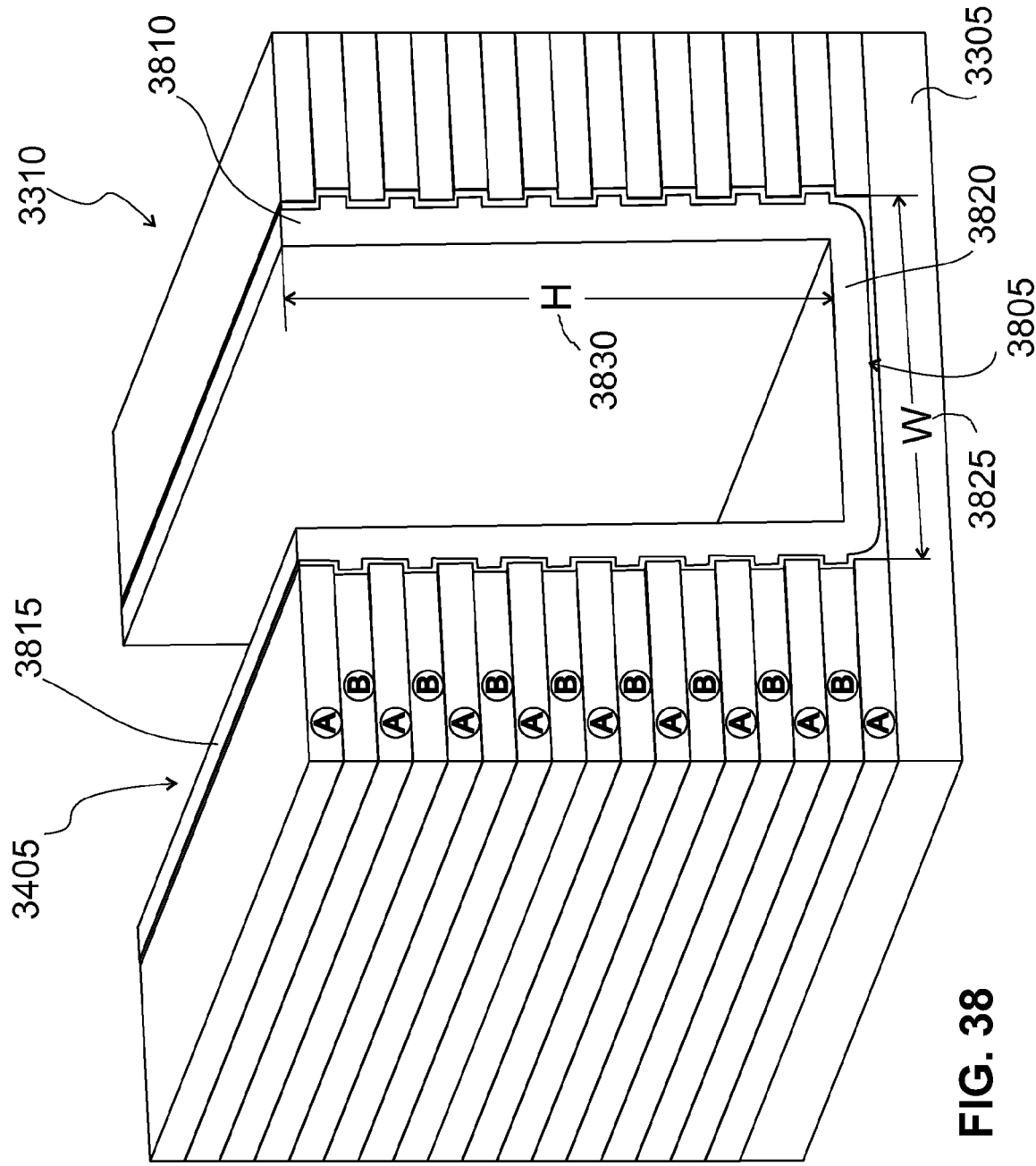
FIG. 38 is a diagram illustrating the result of depositing a uniform layer of ferromagnetic or ferrimagnetic material on the seed layer of FIG. 37.

Magnetic material for the data track 11 is deposited on the seed layer 3705 by, for example, electroplating, creating magnetic layer 3805 (FIG. 38). Magnetic layer 3805 comprises sides 3810, 3815 and bottom 3820. Magnetic layer 3805 is approximately 50 to 500 nm thick, and is preferably 100 to 200 nm thick, and may be comprised of ferromagnetic material or ferrimagnetic material. In an embodiment, the surface of magnetic layer 3805 is planarized on the outside edge.

Figure 39A:
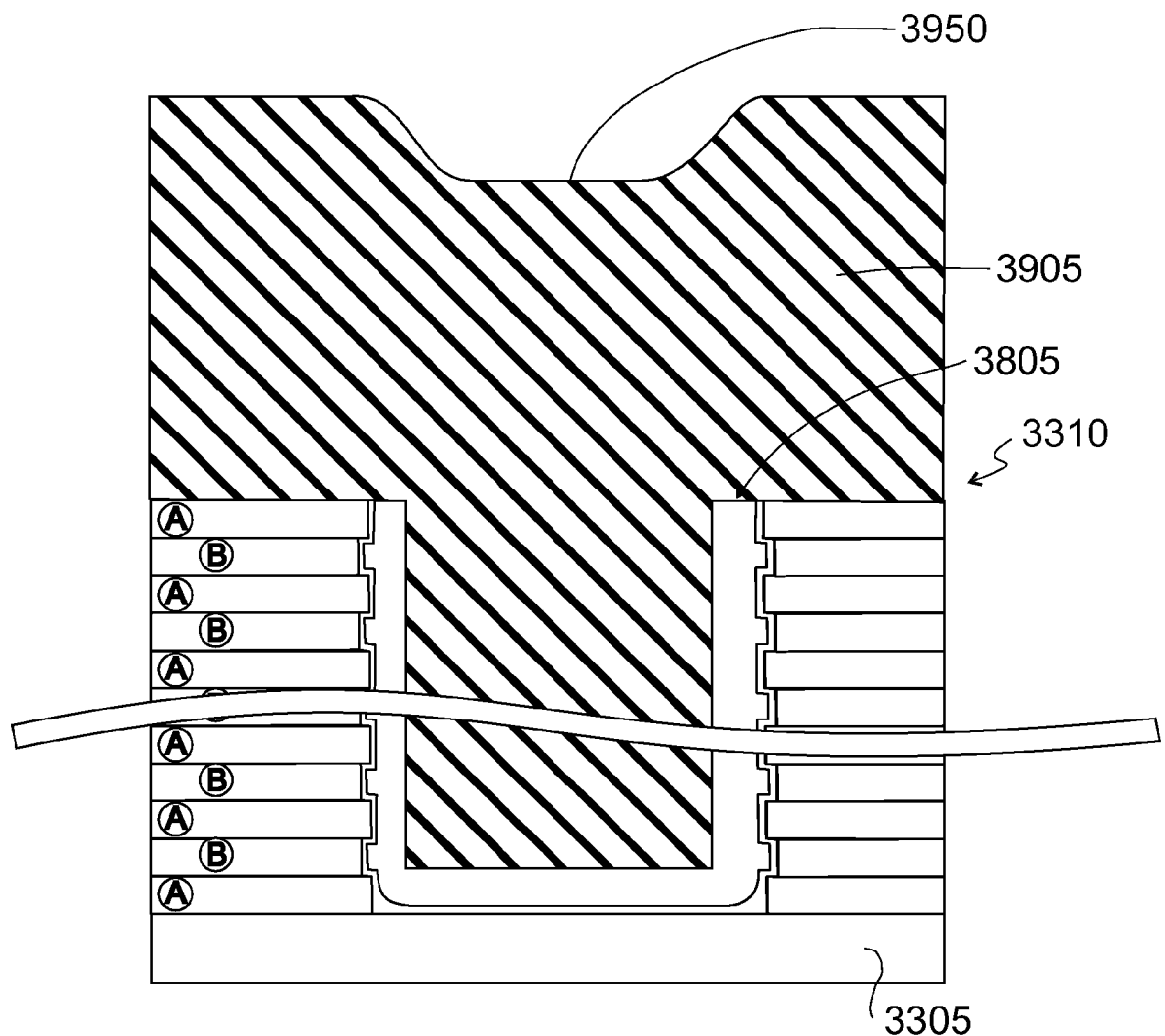
FIG. 39A is a diagram illustrating the result of filling the trench of FIG. 37 with a dielectric material with a method that requires subsequent planarization.

Individual, parallel versions of the data track 11 are created by removing portions of the magnetic layer 3805 and the seed layer so that the individual data tracks formed are electrically isolated from one another. The seed layer may be composed of more than one layer e.g. it may be composed of an adhesion layer, which may or may not be conducting, and a layer suitable for electroplating magnetic material. If the seed layer contains a non-conducting layer then this layer does not necessarily need to be removed. FIG. 39, FIG. 40, FIG. 41, and FIG. 42 illustrate one embodiment of creating parallel versions of data track 11 using lithography. This embodiment requires that a ratio of a width, W 3825, of bottom 3820 to a height, H 3830, of the sides 3810, 3815 exceeds a predetermined value for using lithography to pattern the data tracks 11 from the top. As shown in FIG. 39A, trench 3405 of FIG. 38 is filled with a material 3905 (also referenced as dielectric fill 3905) such as, for example, a photo-sensitive polyimide. Trench 3405 can be filled with spin-on polyimide at a depth of approximately 10 microns. Sides 3810, 3815 of the magnetic material 3805 are covered with spin-on polyimide to a thickness of approximately 0.6 microns or more because the spin-on polyimide is fluid and will cover the sides 3810, 3815. Preferably the thickness of the spin-on polyimide is sufficient to fill the trench. For example, if the thickness of the spin-on polyimide applied to each of the surfaces 3810 and 3815 exceeds half the width of the trench W (3825) then the trench will be filled.

The spin-on polyimide may self-planarize so that the surface of the trench 3310 will be smooth but, as shown in FIG. 39A the surface 3950 of the dielectric fill 3905 may have some surface topology in which case the surface may be planarized in a CMP (chemical mechanical polish) step after the spin-on polyimide is hardened by baking. Planarizing by CMP is a well known industrial standard process in semiconducting microelectronics today.

The trench may also be filled with a spin-on glass which has similar properties to a spin-on polyimide with regard to filling the trench. The trench may also be filled with a dielectric material by chemical vapor deposition (CVD). Depending on the ratio of the height H to the width of the trench W the surface of the CVD deposited dielectric may have very little surface topology so that the CMP step illustrated in FIG. 39B may not be necessary.

Figure 40:
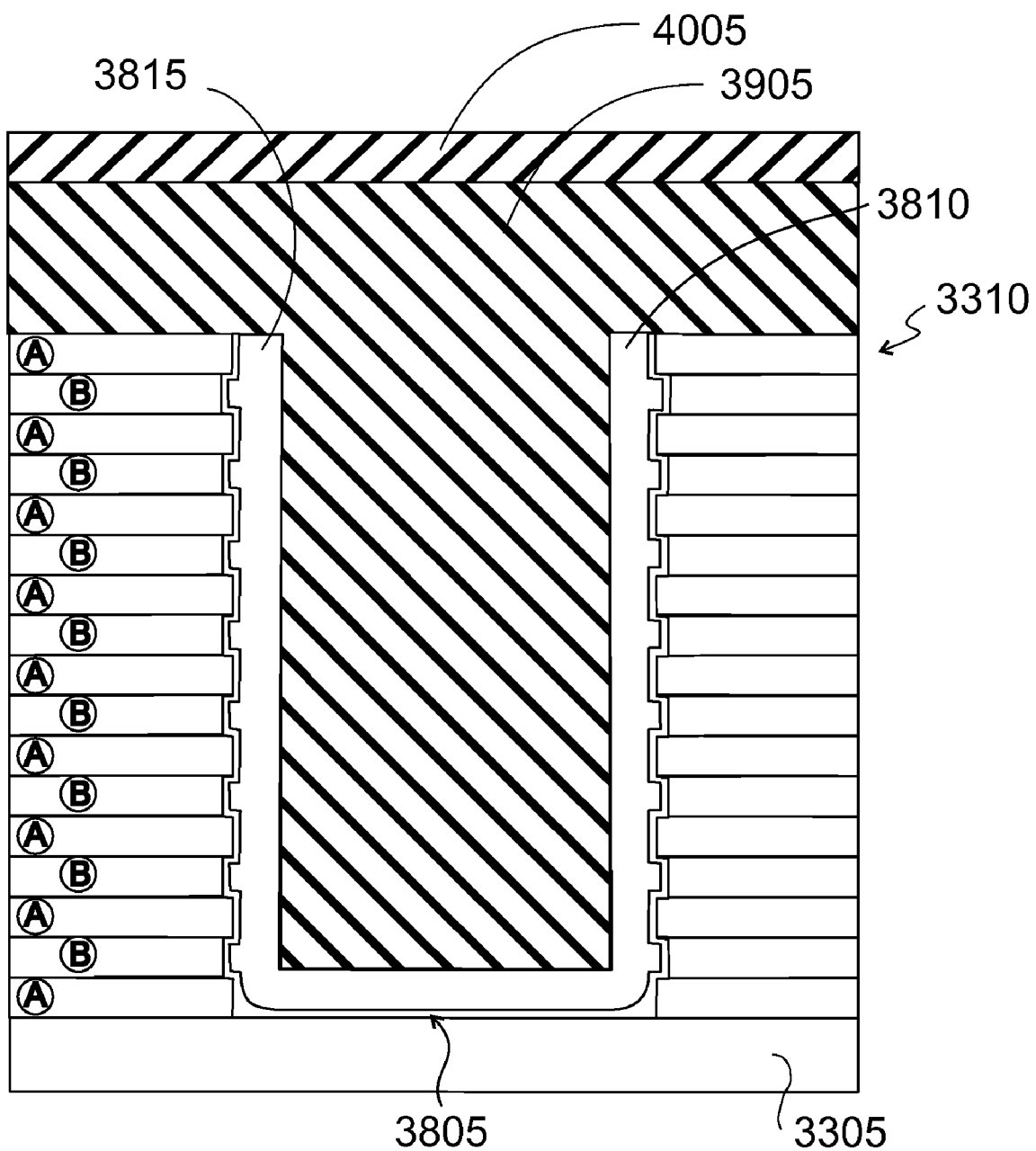
FIG. 40 is a diagram illustrating the result of applying a photoresist layer to the top surface of the dielectric and multi-layer stack structure of FIG. 39A after planarization and FIG. 39B without planarization if needed.

As illustrated in FIG. 40, the surface of the dielectric material 3905 and the multi-layer stack structure 3310, after a CMP step to smooth this layer, if required, is selectively covered with a layer 4005 of photoresist material such as, for example, photosensitive polyimide. The photoresist layer may not be needed if a suitable spin-on polyimide is chosen which is photo sensitive. Similarly, a photosensitive spin-on glass may be used such that the photoresist layer 4005 is not required. If the dielectric layer 3905 is formed by a CVD process then the photoresist layer 4005 will be needed. The layer 4005 may also comprise an adhesion layer and an anti-reflection layer as well as being comprised of one or more photosensitive layers.

Figure 41:
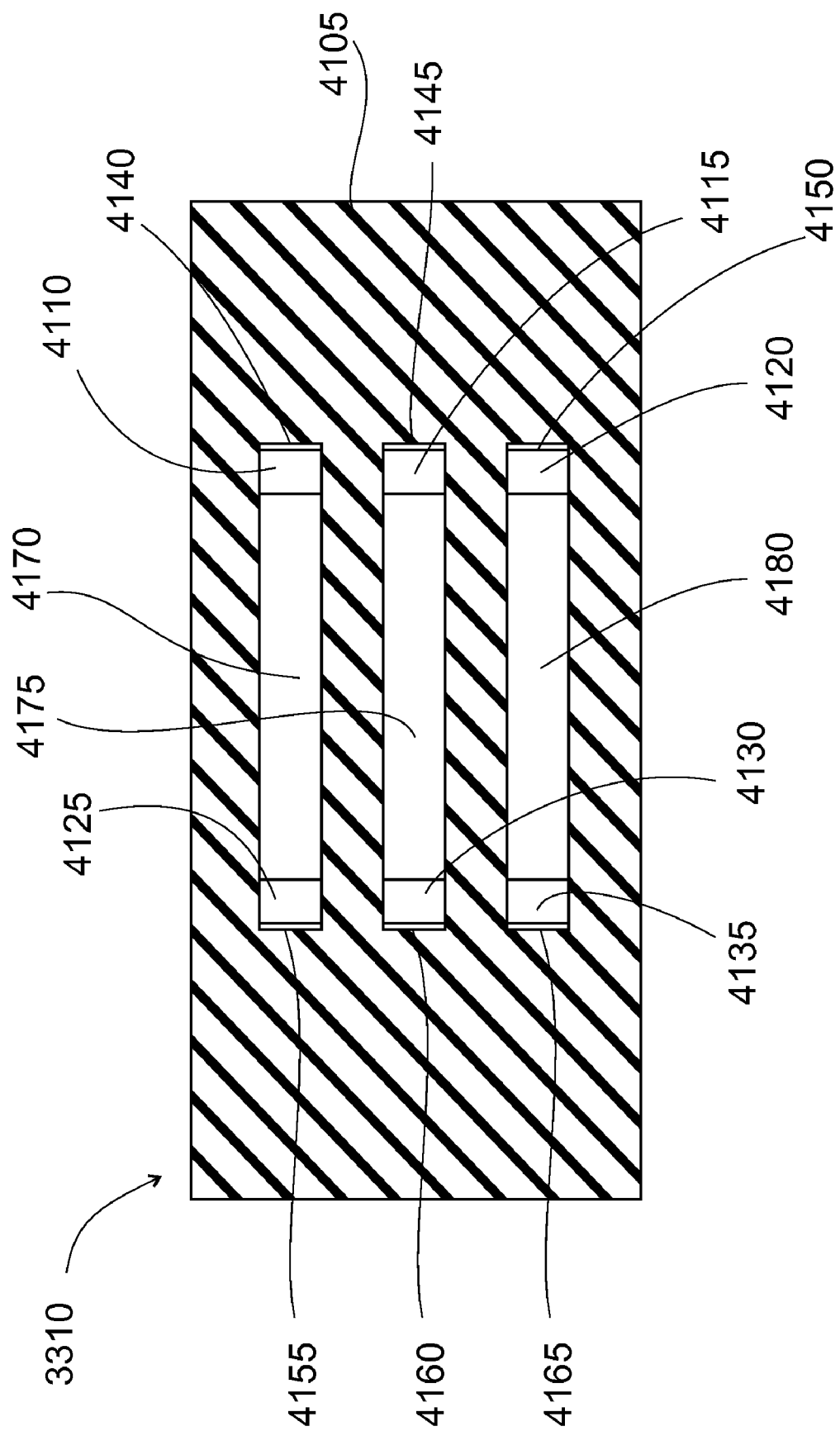
FIG. 41 is a diagram illustrating the forming of a pattern in the upper layer of FIG. 40.

Layer 4005 is placed over regions of magnetic layer 3805 and the material 3905 that are retained to form the data track 11, as shown in FIG. 41 by a pattern 4105. FIG. 41 illustrates a top view of multilayer stack structure 3310 with layer 4005 in pattern 4105 after the layer 4005 has been exposed (by light of a suitable wavelength or by electrons) and developed to remove the unexposed photoresist (if a negative resist is used). Pattern 4105 exposes portions of magnetic material 4110, 4115, 4120, 4125, 4130, 4135. Pattern 4105 further exposes portions of seed material 4140, 4145, 4150, 4155, 4160, 4165. Pattern 4105 exposes portions of dielectric material 4170, 4175, 4180.

Figure 42:
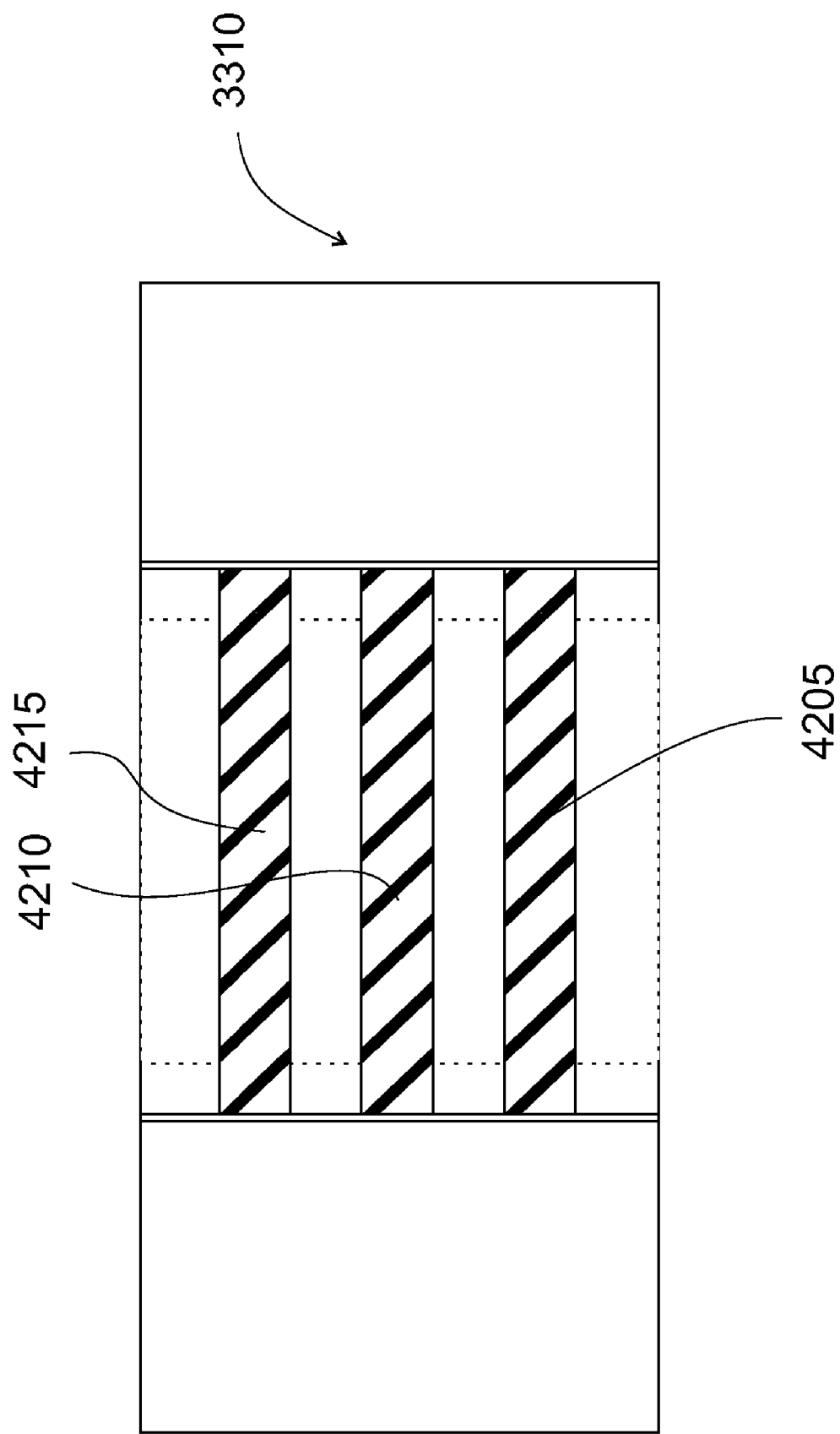
FIG. 42 is a diagram illustrating holes formed by removing portions of dielectric exposed by the pattern of FIG. 41.

As illustrated in FIG. 42, material 3905 not covered by layer 4105 is exposed. Material 3905 is selectively removed to form holes 4205, 4210, 4215 by developing material 3905 or using oxygen to selectively remove material 3905.

FIG. 39, FIG. 40, FIG. 41, and FIG. 42 further illustrate another embodiment of creating parallel versions of data track 11 using selective etching. In another embodiment, trench 3405 (FIG. 38) is filled as shown in FIG. 39 with an insulating material (dielectric material 3905) such as, for example, spin-on oxide using chemical vapor deposition (also referenced as CVD oxide) or spin-on glass. If material 3905 comprises spin-on glass, the exposed surface of material 3905 is smooth, requiring no planarizing. If material 3905 comprises CVD oxide, the exposed surface of material 3905 is planarized to prepare the surface of material 3905 for application of layer 4005. As illustrated in FIG. 40, the surface of the dielectric material 3905 and the multi-layer stack structure 3310 is selectively covered with a layer 4005 of a material which is resistant to the etch used to remove the material 3905. Layer 4005 is placed over regions of magnetic layer 3805 and the material 3905 that are retained to form the data track 11, as shown in FIG. 41 by a pattern 4105. As illustrated in FIG. 42, material 3905 is selectively removed to form holes 4205, 4210, 4215 by using wet etching and dry milling or ion milling, as described previously. An advantage of using spin-on glass or spin-on polyimide compared to a CVD dielectric for the trench fill 3905 is that these less dense layers will likely etch at a faster rate compared to the photo-resist layer 4005.

Figure 43:
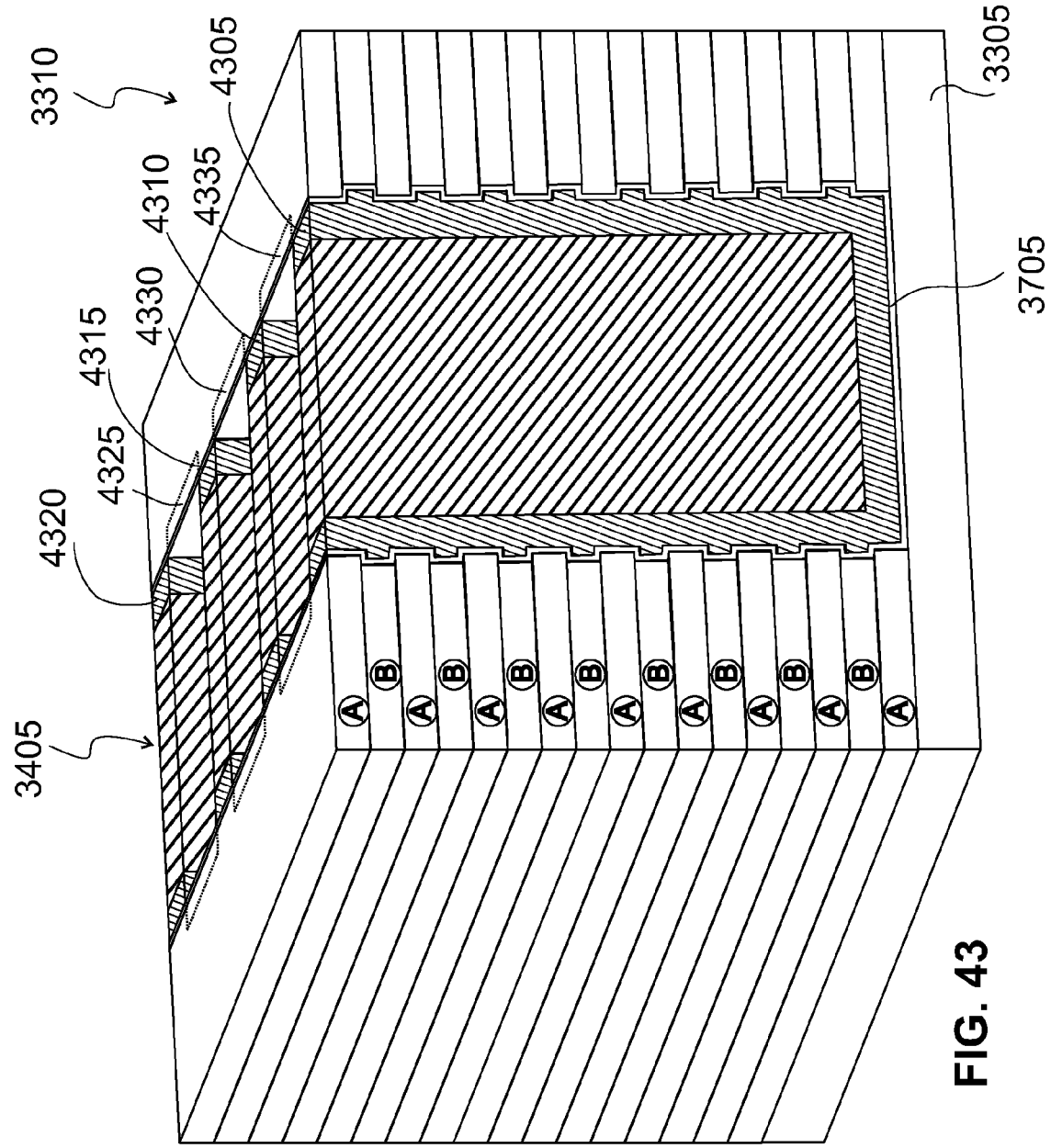
FIG. 43 is a diagram illustrating the result of removing sections of the magnetic material of FIG. 38 to form parallel data tracks of FIG. 1.
Figure 44:
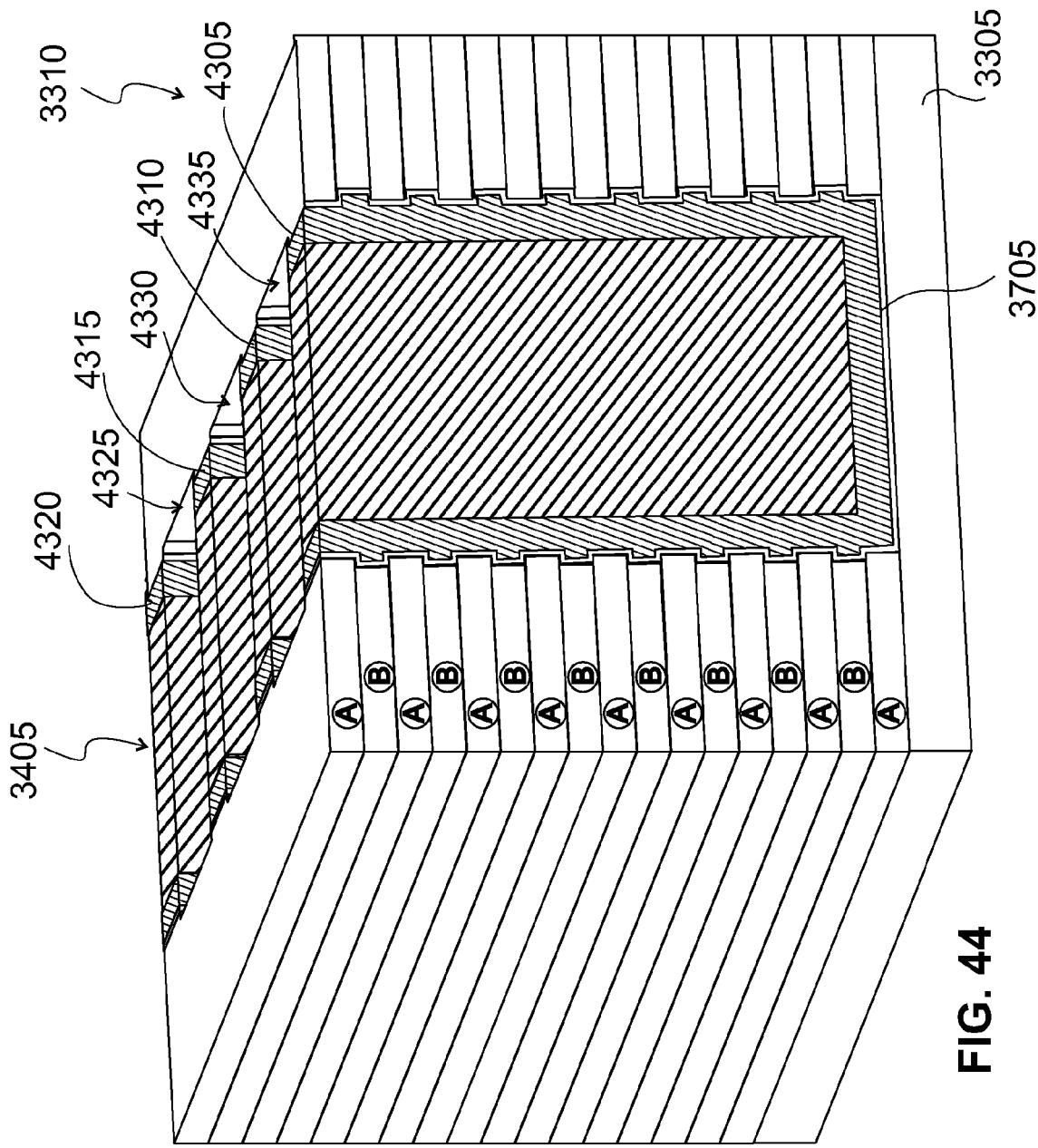
FIG. 44 is a diagram illustrating the result of removing the seed layer from between the parallel data tracks of FIG. 43.

Holes 4205, 4210, 4215 are spaced approximately 0.1 to 2 micron apart n one direction. Holes 4205, 4210, 4215 expose sides 3810, 3815 and bottom 3820 of magnetic material 3805. Magnetic material exposed in holes 4205, 4210, 4215 is etched using, for example, wet etching to selectively remove exposed portions of magnetic material 3805 and seed layer 3705 as illustrated in FIG. 43. The wet etchant etches magnetic material 3805 but not oxide. Tracks 4305, 4310, 4315, 4320 remain after material 3905 in holes 4205, 4210, 4215 of FIG. 42 is removed. Tracks 4305, 4310, 4315, 4320 are used in situ, without being cut apart. Exposed seed layer 3705 in regions 4325, 4330, 4335 is etched away during the etching process, as seen in FIG. 44. Magnetic material 3805 and seed layer 3705 exposed in holes 4205, 4210, 4215 can also be removed using reactive ion etching (RIE) and ion milling.

Figure 45:
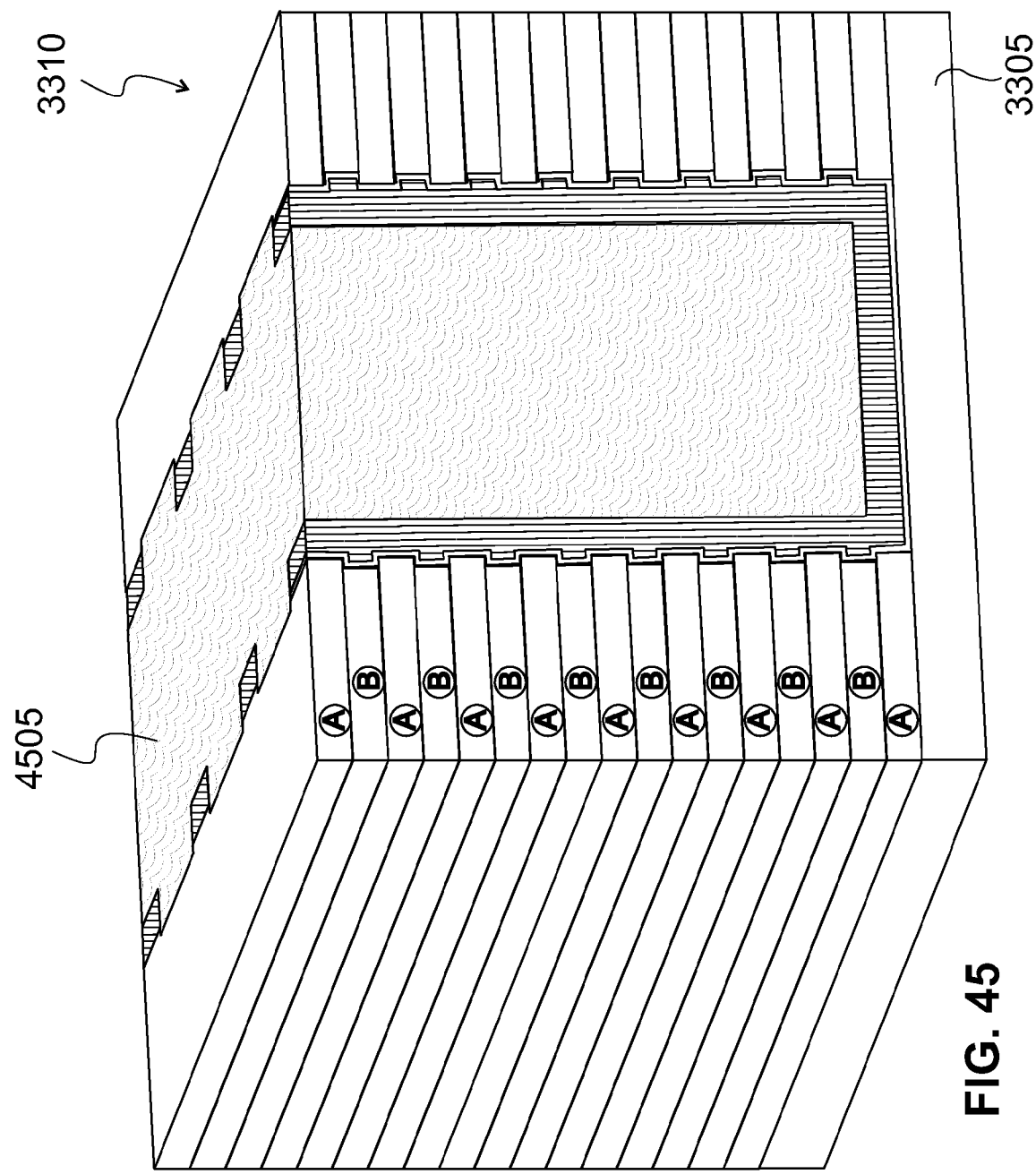
FIG. 45 is a diagram illustrating the result of filling the holes of FIG. 43 with an insulating material.

After removing magnetic material 3805 and seed layer 3705 in holes 4205, 4210, 4215, holes 4205, 4210, 4215 are filled with a material such as, for example, spin-on glass, forming a dielectric fill 4505 as shown in FIG. 45. In an embodiment, the magnetic layer 3805 is sliced by etching to form a series of parallel data tracks.

Figure 46:
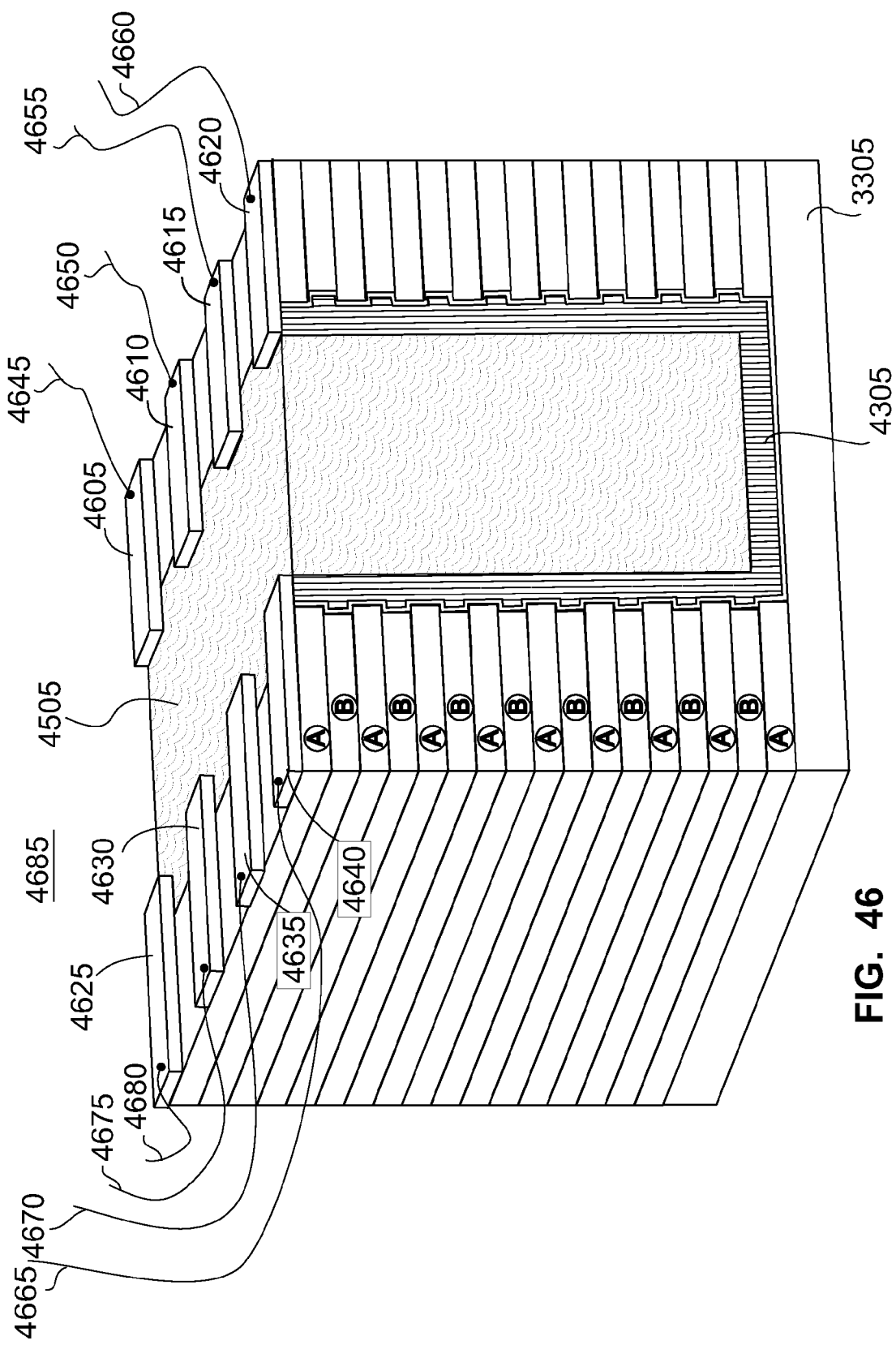
FIG. 46 is a diagram illustrating the result of attaching connecting leads to the data region and reservoir of the parallel data tracks of FIG. 44.

Using standard lithography and photoresist etching, connecting leads 4605, 4610, 4615, 4620, 4625, 4630, 4635, 4640 may be attached to tracks 4305, 4310, 4315, 4320 as illustrated by FIG. 46, creating a block 4685 of parallel tracks 11. Electrical connectors 4645, 4650, 4655, 4660, 4665, 4670, 4675, 4680, comprising, for example, wires or other conductors may be attached to leads 4605, 4610, 4615, 4620, 4625, 4630, 4635, 4640. Electrical connectors 4645, 4650, 4655, 4660, 4665, 4670, 4675, 4680 connect data tracks 11 in series or in parallel.

Figure 47:
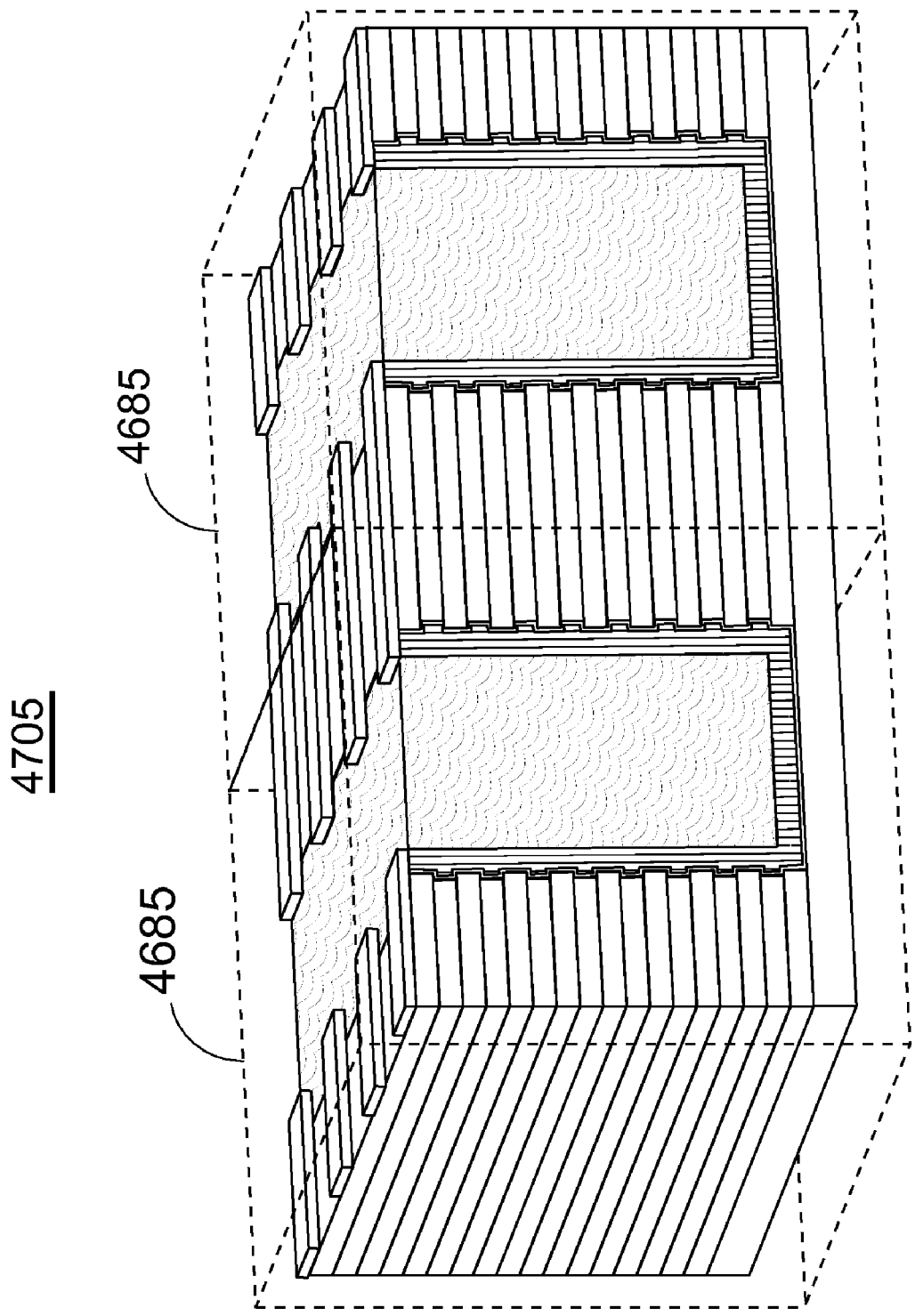
FIG. 47 is a diagram illustrating the fabrication in series of multiple blocks of parallel magnetic data tracks of FIG. 46.

In another embodiment illustrated by FIG. 47, multiple blocks 4685 of parallel tracks 11 may be connected in series, creating a system 4705 of data tracks 11 connected in series and in parallel.

Figure 48A:
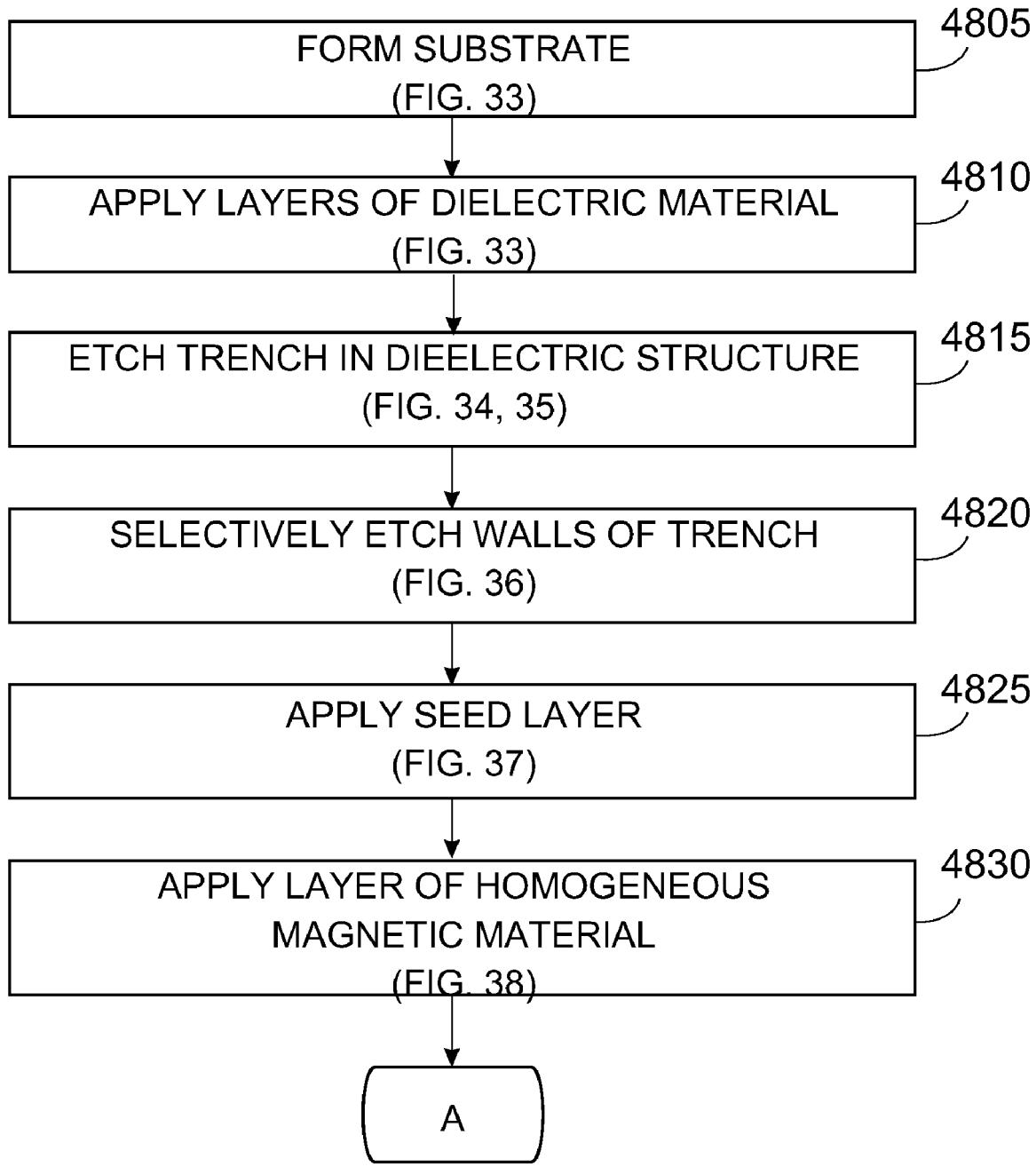
FIG. 48 comprises FIGS. 48A and 48B and represents a process flow chart illustrating a method for fabricating blocks of parallel data tracks of FIG. 46.
Figure 48B:
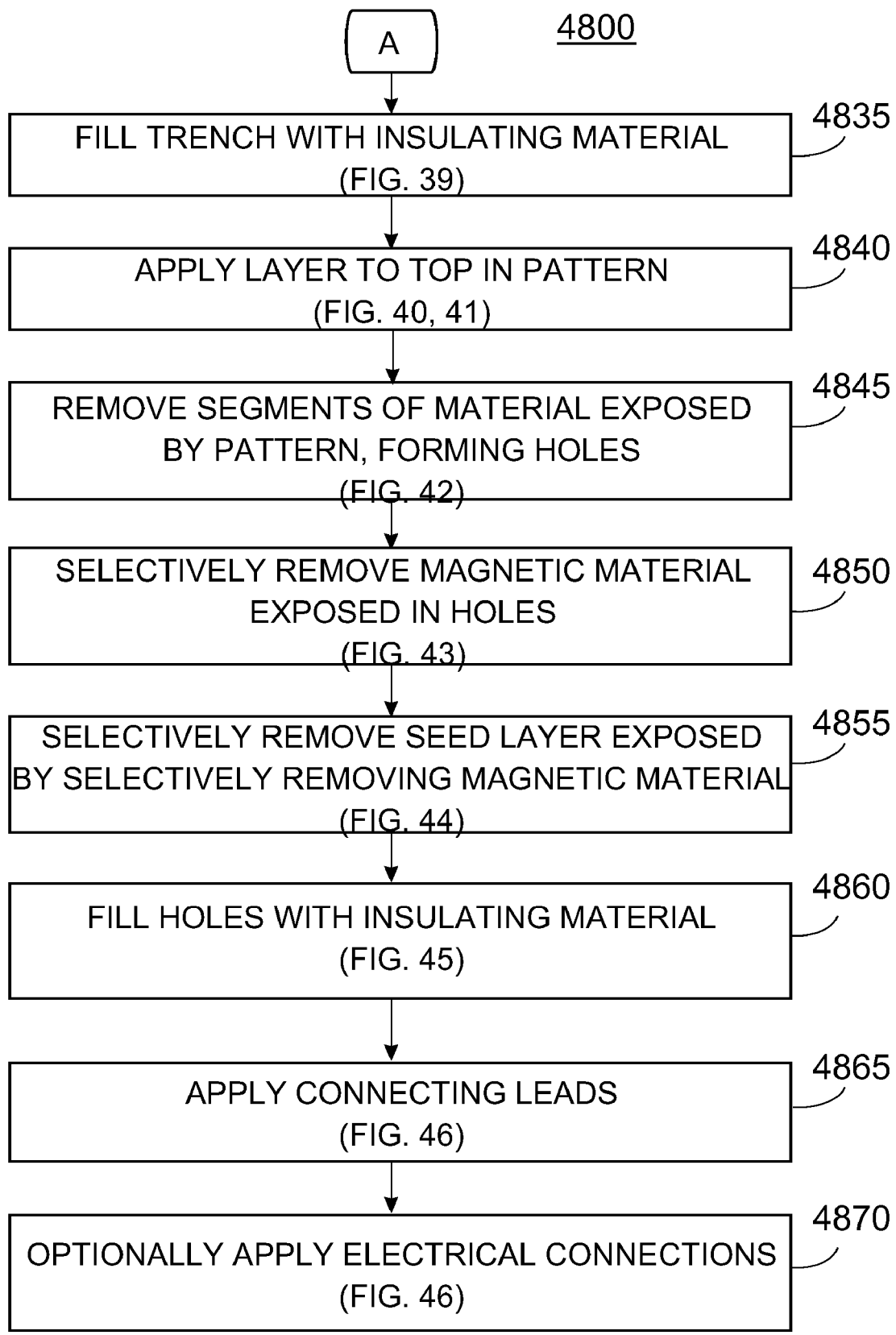

A method 4800 for fabricating a block 4685 of parallel tracks 11 is illustrated by the process flow chart of FIG. 48 (FIGS. 48A, 48B). A substrate 3305 is formed at step 4805 (FIG. 33). A multi-layer stack structure 3310 is formed at step 4810 by applying alternating layers of different dielectric materials (FIG. 33). At step 4815, lithography is used to etch trench 3405 (FIGS. 34, 35). A selective etching process is used at step 4820 to corrugate the walls of trench 3405, forming notches and protuberances (FIG. 36).

Figure 39B:
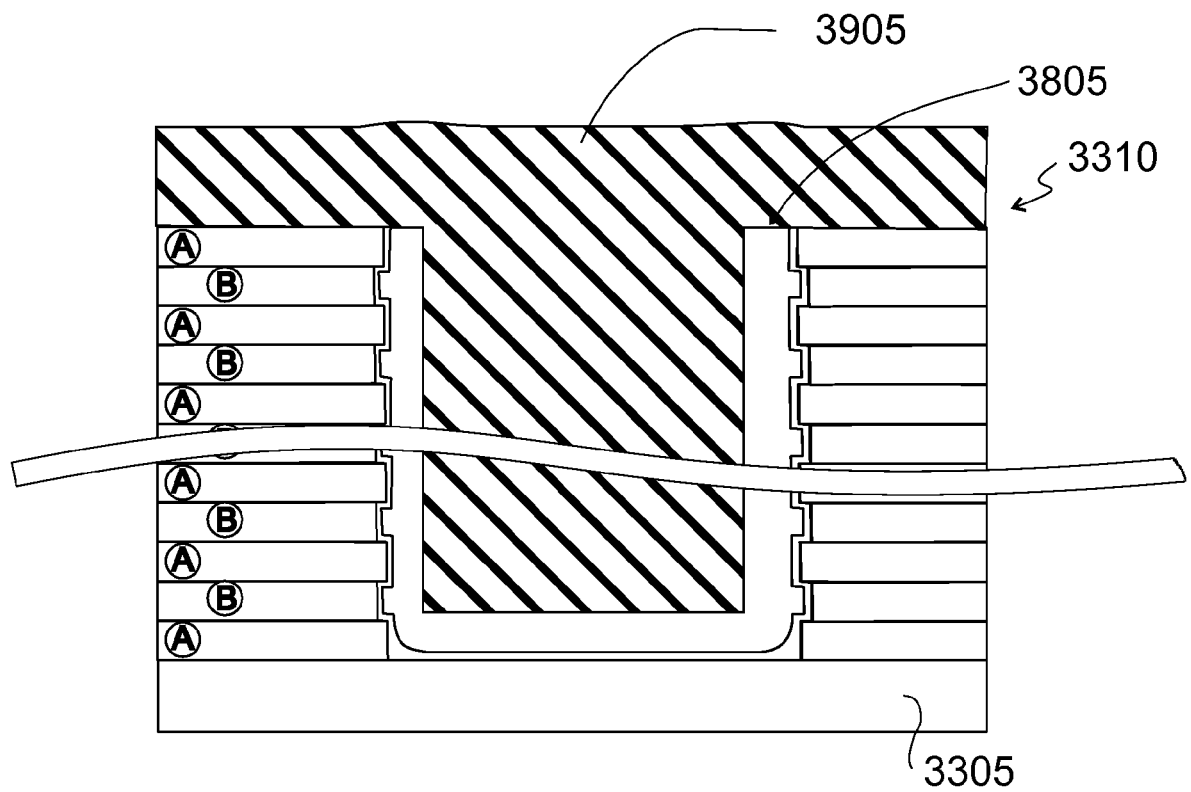
FIG. 39B is is a diagram illustrating the result of filling the trench of FIG. 37 with a dielectric material with a method that does not require subsequent planarization.

A seed layer 3705 is applied to the walls 3505, 3510 and bottom 3515 of the trench 3405 at step 4825 (FIG. 37). The seed layer 3705 is covered at step 3630 with a magnetic layer 3805 comprised of magnetic material such as ferromagnetic material or ferrimagnetic material at step 4830 (FIG. 38). The trench 3405 is filled with an insulating material (dielectric material 3905) at step 4835 (FIG. 39A) and the dielectric material is planarized in a planarization step, if needed (FIG. 39B). Layer 4005 is applied in the pattern 4105 to the top of the dielectric material 3905 and the multi-layer stack structure 3310 at step 4840 (FIGS. 40, 41). Portions of insulating material (dielectric material 3905) exposed by pattern 4105 are removed, forming holes 4205, 4210, 4215 at step 4845 (FIG. 42).

Magnetic material 3805 exposed in holes 4205, 4210, 4215 is selectively removed at step 4850 (FIG. 43). Seed layer 3805 exposed in holes 4205, 4210, 4125 is selectively removed at step 4855 (FIG. 44). Holes 4205, 4210, 4215 are filled with insulating material at step 4860 (FIG. 45). Connecting leads 4605, 4610, 4615, 4620, 4625, 4630, 4635, 4640 are attached to data tracks 4305, 4310, 4315, 4320 at step 4865 (FIG. 46). Electrical connectors 4645, 4650, 4655, 4660, 4665, 4670, 4675, 4680 are optionally attached to connecting leads 4605, 4610, 4615, 4620, 4625, 4630, 4635, 4640 at step 4870 (FIG. 46).

It is to be understood that the specific embodiments of the invention that have been described are merely illustrative of certain applications of the principle of the present invention. Numerous modifications may be made to the method of fabricating data tracks for use in a multi-layered magnetic shift register system described herein without departing from the spirit and scope of the present invention. The dimensions described herein are provided for illustration purpose only; it should be abundantly clear that there is no intention to limit the scope of the present invention to these dimensions.

What is claimed is:

1. A method of forming a magnetic shift register for storing data, the method comprising:
    applying a plurality of layers of a first dielectric material and a plurality of layers of a second dielectric material over a substrate to form a dielectric structure;
    non-selectively etching a trench having walls in the dielectric structure;
    selectively etching a plurality of corrugations in the walls of the trench;
    applying a layer of magnetic material to the walls of the trench;
    filling the trench with an insulating material;
    forming a plurality of holes in the insulating material to selectively expose portions of the magnetic material;
    selectively removing exposed portions of the magnetic material;
    filling the holes with insulating material; and
    applying a plurality of electrical contacts to the magnetic material, wherein the magnetic material forms data tracks.

2. The method of claim 1, comprising forming the first dielectric material from a first oxide.

3. The method of claim 2, comprising forming the second dielectric material from a second oxide.

4. The method of claim 2, comprising forming the second dielectric material from a nitride.

5. The method of claim 1, comprising forming the first dielectric material from silicon oxide.

6. The method of claim 5, comprising forming the second dielectric material from polycrystalline silicon.

7. The method of claim 6, comprising forming the second dielectric material from silicon nitride.

8. The method of claim 6, wherein forming the second dielectric material from polycrystalline silicon comprises using low-pressure chemical vapor deposition.

9. The method of claim 1, wherein forming the first dielectric and forming the second dielectric comprises using sputter deposition.

10. The method of claim 1, wherein selectively etching the corrugations in the walls of the trench comprises etching the first dielectric material at a different rate than the second dielectric material.

11. The method of claim 10, wherein etching the first dielectric material comprises using an etching process that is selective to silicon.

12. The method of claim 10, wherein etching the second dielectric material comprises using an etching process that is selective to silicon dioxide.

13. The method of claim 1, wherein non-selectively etching the trench comprises using a dry etch process.

14. The method of claim 1, wherein selectively etching the corrugations in the walls of the trench comprises using a dry etch process.

15. The method of claim 1, further comprising covering exposed surfaces of the trench with a seed layer.

16. The method of claim 15, further comprising electroplating the trench using the seed layer as a conducting layer.

17. The method of claim 15, wherein covering the exposed surfaces of the trench with the seed layer comprises using a chemical vapor deposition process.

18. The method of claim 15, wherein applying the layer of magnetic material to the walls of the trench comprises applying the layer of magnetic material on the seed layer.

19. The method of claim 1, wherein applying the layer of magnetic material to the walls of the trench comprises applying a layer of homogeneous magnetic material.

20. The method of claim 1, wherein the magnetic material is selected from the group consisting of ferromagnetic material and ferrimagnetic material.

21. The method of claim 1, wherein applying the layers comprises alternately forming the first dielectric material and the second dielectric material;
    wherein the first dielectric material includes a ferromagnetic material; and
    wherein the second dielectric material includes a ferrimagnetic material.

22. A method of forming a magnetic shift register for storing data, the method comprising:
    forming a dielectric structure;
    forming an open-ended trench in the dielectric structure to define two inner walls of the trench;
    forming indentations in the inner walls of the trench;
    applying a layer of magnetic material to the inner walls of the trench;
    selectively filling the trench with alternating layers of insulating material and magnetic material; and
    wherein the layers of magnetic material form a plurality of separately formed tracks that include data regions for storing data.

23. The method of claim 22, wherein the tracks are substantially parallel.

24. The method of claim 22, further comprising forming corrugations in the inner walls of the trench using a selective etching process.

* * * * *